(12) United States Patent
van de Ven et al.

(10) Patent No.: US 9,192,013 B1
(45) Date of Patent: Nov. 17, 2015

(54) LIGHTING DEVICES WITH VARIABLE GAMUT

(71) Applicant: Cree, Inc., Durham, NC (US)

(72) Inventors: Antony Paul van de Ven, Hong Kong (CN); Benjamin A. Jacobson, Chicago, IL (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 14/298,229

(22) Filed: Jun. 6, 2014

(51) Int. Cl.
*H05B 33/08* (2006.01)

(52) U.S. Cl.
CPC .......... *H05B 33/086* (2013.01); *H05B 33/0842* (2013.01); *H05B 33/0857* (2013.01)

(58) Field of Classification Search
CPC .......... H05B 33/0857; H05B 33/0842; H05B 33/0884; H05B 33/086
See application file for complete search history.

(56) References Cited

U.S. PATENT DOCUMENTS

| | | |
|---|---|---|
| 6,234,648 B1 | 5/2001 | Borner et al. |
| 6,357,889 B1 | 3/2002 | Duggal et al. |
| 6,441,558 B1 | 8/2002 | Muthu et al. |
| 6,498,440 B2 | 12/2002 | Stam et al. |
| 6,577,073 B2 | 6/2003 | Shimizu et al. |
| 6,600,175 B1 | 7/2003 | Baretz et al. |
| 7,005,679 B2 | 2/2006 | Tarsa et al. |
| 7,026,756 B2 | 4/2006 | Shimizu et al. |
| 7,095,056 B2 | 8/2006 | Vitta et al. |
| 7,213,940 B1 | 5/2007 | Van De Ven et al. |
| 7,233,831 B2 | 6/2007 | Blackwell |
| 7,250,715 B2 | 7/2007 | Mueller et al. |
| 7,255,457 B2 | 8/2007 | Ducharme et al. |
| 7,352,138 B2 | 4/2008 | Lys et al. |
| 7,354,172 B2 | 4/2008 | Chemel et al. |
| 7,358,679 B2 | 4/2008 | Lys et al. |
| 7,520,634 B2 | 4/2009 | Ducharme et al. |
| 7,564,180 B2 | 7/2009 | Brandes |
| 7,665,865 B1 | 2/2010 | Hulse et al. |
| 7,687,753 B2 | 3/2010 | Ashdown |
| 7,744,242 B2 | 6/2010 | Kramer |
| 7,768,192 B2 | 8/2010 | Van De Ven et al. |
| 7,781,953 B2 | 8/2010 | Su |

(Continued)

FOREIGN PATENT DOCUMENTS

| | | |
|---|---|---|
| DE | 10233050 A1 | 2/2004 |
| GB | 2496851 A | 5/2013 |

(Continued)

OTHER PUBLICATIONS

U.S. Appl. No. 14/259,993, filed Apr. 23, 2014.

(Continued)

*Primary Examiner* — Anne Hines
(74) *Attorney, Agent, or Firm* — Withrow & Terranova, P.L.L.C.; Vincent K. Gustafson

(57) ABSTRACT

Lighting devices include multiple emitters (e.g., LEDs, optionally in combination with one or more lumiphors) arranged to be operated in multiple operating states arranged to produce different gamut area index (GAI) or relative gamut ($Q_g$) values, preferably in conjunction with a small or imperceptible change in luminous flux and/or color point. A first emitter or emitter group and a second emitter or emitter group may be separately arranged to produce white light with different gamut areas. Adjustment of operation of emitters may be responsive to a user input element or sensor.

30 Claims, 33 Drawing Sheets

(56) References Cited

U.S. PATENT DOCUMENTS

| | | |
|---|---|---|
| 7,791,061 B2 | 9/2010 | Edmond et al. |
| 7,828,460 B2 | 11/2010 | Van De Ven et al. |
| 7,845,823 B2 | 12/2010 | Mueller et al. |
| 7,918,581 B2 | 4/2011 | Van De Ven et al. |
| 8,038,317 B2 | 10/2011 | Van De Ven et al. |
| 8,201,966 B2 | 6/2012 | Hall et al. |
| 8,258,722 B2 | 9/2012 | Swoboda et al. |
| 8,436,556 B2 | 5/2013 | Eisele et al. |
| 8,508,127 B2 | 8/2013 | Negley et al. |
| 8,593,074 B2 | 11/2013 | Hatley et al. |
| 8,698,388 B2 | 4/2014 | Cash |
| 2004/0218387 A1 | 11/2004 | Gerlach |
| 2005/0275937 A1 | 12/2005 | Wu et al. |
| 2006/0104058 A1* | 5/2006 | Chemel et al. ............... 362/231 |
| 2006/0149607 A1 | 7/2006 | Sayers et al. |
| 2006/0221272 A1 | 10/2006 | Negley et al. |
| 2006/0237636 A1 | 10/2006 | Lyons et al. |
| 2007/0063321 A1 | 3/2007 | Han et al. |
| 2007/0152797 A1 | 7/2007 | Chemel et al. |
| 2007/0223219 A1 | 9/2007 | Medendorp, Jr. et al. |
| 2007/0241657 A1 | 10/2007 | Radkov et al. |
| 2008/0130285 A1 | 6/2008 | Negley et al. |
| 2008/0179611 A1 | 7/2008 | Chitnis et al. |
| 2008/0258130 A1 | 10/2008 | Bergmann et al. |
| 2009/0080185 A1 | 3/2009 | McMillan |
| 2009/0184616 A1 | 7/2009 | Van De Ven et al. |
| 2009/0207583 A1 | 8/2009 | Takano |
| 2009/0227847 A1 | 9/2009 | Tepper et al. |
| 2009/0296384 A1 | 12/2009 | Van De Ven et al. |
| 2010/0110659 A1 | 5/2010 | Nakajima |
| 2010/0127283 A1 | 5/2010 | van de Ven et al. |
| 2010/0254129 A1 | 10/2010 | Le Toquin et al. |
| 2010/0277907 A1 | 11/2010 | Phipps et al. |
| 2011/0037388 A1 | 2/2011 | Lou et al. |
| 2012/0112661 A1* | 5/2012 | van de Ven et al. ........... 315/294 |
| 2012/0306355 A1 | 12/2012 | Seibel, II |
| 2012/0306375 A1 | 12/2012 | van de Ven |
| 2013/0020929 A1 | 1/2013 | van de Ven et al. |
| 2013/0114241 A1 | 5/2013 | van de Ven et al. |
| 2013/0114242 A1 | 5/2013 | Pickard et al. |
| 2013/0170199 A1 | 7/2013 | Athalye et al. |
| 2013/0271991 A1 | 10/2013 | Hussell et al. |
| 2014/0228914 A1 | 8/2014 | van de Ven et al. |
| 2014/0301062 A1* | 10/2014 | David et al. ............... 362/84 |

FOREIGN PATENT DOCUMENTS

| | | |
|---|---|---|
| JP | 2003316714 A | 11/2003 |
| JP | 2009152213 A | 7/2009 |
| WO | 0034709 A1 | 6/2000 |
| WO | 2009041171 A1 | 4/2009 |
| WO | 2013070860 A1 | 5/2013 |

OTHER PUBLICATIONS

U.S. Appl. No. 14/260,048, filed Apr. 23, 2014.
U.S. Appl. No. 14/338,895, filed Jul. 23, 2014.
U.S. Appl. No. 14/045,474, filed Oct. 3, 2013.
Author Unknown, "CALiPER Retail Lamps Study 3," Solid-State Lighting Program, Feb. 2014, Pacific Northwest National Laboratory, U.S. Department of Energy, 48 pages.
Houser, K.W. et al., "Review of measures for light-source color rendition and considerations for a two-measure system for characterizing color rendition," Optics Express, vol. 21, No. 8, Apr. 22, 2013, 19 pages.
Negley, G. et al., "Essentials of designing efficient luminaires with LEDs," LEDs Magazine, Issue 18, Jan./Feb. 2008, Pennwell Corporation, pp. 17-22.
Rea, Mark S., "Value Metrics for Better Lighting," vol. PM228, 2013, SPIE Press, pp. 36-43, 52-63.
Van De Ven, A. et al., "Warm White illumination with high CRI and high efficacy by combining 455nm excited yellowish phosphor LEDs and red AlInGaP LEDs," First International Conference on White LEDs and Solid State Lighting, Nov. 28, 2007, LED Lighting Fixtures, Inc., 8 pages.
International Search Report and Written Opinion for International Patent Application Na PCT/US2015/033476, mailed Aug. 10, 2015, 13 pages.

* cited by examiner

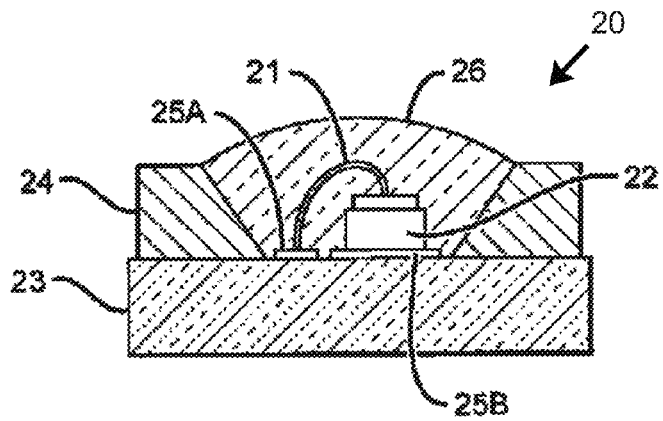
FIG._1 (RELATED ART)
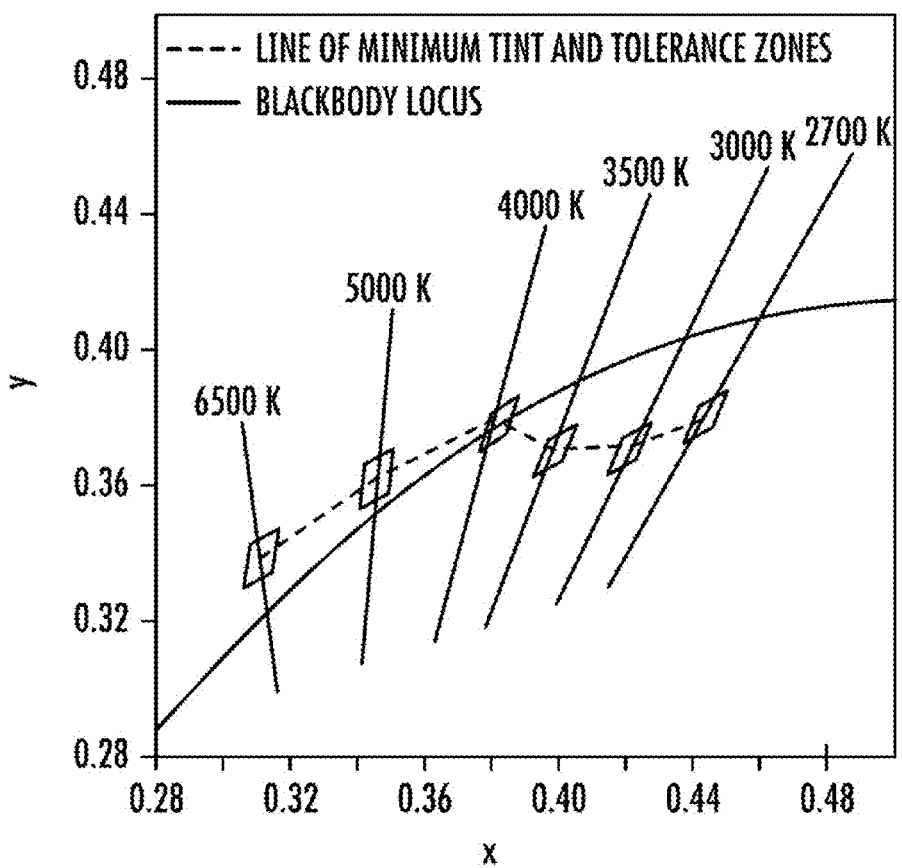
FIG._2 (RELATED ART)

| # | Light source | CCT | CRI | GAI | x | y | System lm/W | S/P |
|---|---|---|---|---|---|---|---|---|
| 1.1 | HPS, 400 W | 2050 | 15 | 14 | 0.5208 | 0.4134 | 96 | 0.66 |
| 1.2 | Pulse-start MH, 320 W | 4159 | 58 | 51 | 0.3799 | 0.3984 | 72 | 1.61 |
| 1.3 | Mercury vapor, 400 W clear | 5891 | 15 | 25 | 0.3191 | 0.4317 | 42 | 1.33 |
| 1.4 | LPS, 180 W | 1785 | −42 | 0 | 0.5681 | 0.4285 | 144 | 0.25 |
| 1.5 | Xenon, 1000 W | 5853 | 97 | 91 | 0.3245 | 0.3439 | 26 | 2.37 |
| 1.6 | White LED, 6500 K | 6528 | 72 | 84 | 0.3116 | 0.3340 | 80 | 2.06 |
| 2.1 | A lamp, 60 W (frosted) | 2764 | 100 | 49 | 0.4555 | 0.4109 | 14 | 1.36 |
| 2.2 | A lamp, 60 W (neodymium doped) | 2789 | 78 | 65 | 0.4460 | 0.3962 | 11 | 1.52 |
| 2.3 | Halogen, 3277 K | 3279 | 100 | 65 | 0.4184 | 0.3969 | 20 | 1.60 |
| 2.4 | CFL, 15 W | 2653 | 83 | 48 | 0.4652 | 0.4141 | 61 | 1.11 |
| 2.5 | Fluorescent, F34T12 cool white | 4022 | 62 | 58 | 0.3833 | 0.3905 | 63 | 1.48 |
| 2.6 | Fluorescent, FO32T8RE835 | 3308 | 86 | 69 | 0.4157 | 0.3939 | 86 | 1.44 |
| 2.7 | Fluorescent, F40T12 daylight | 4861 | 90 | 84 | 0.3502 | 0.3645 | 50 | 1.97 |
| 2.8 | Ceramic MH, 100 W | 4075 | 93 | 80 | 0.3773 | 0.3749 | 66 | 1.79 |
| 2.9 | White LED, 2700 K | 2706 | 84 | 49 | 0.4575 | 0.4072 | 65 | 1.21 |
| 2.10 | White LED, 6500 K | 6528 | 72 | 84 | 0.3116 | 0.3340 | 80 | 2.06 |
| 3.1 | Blue LED, 470-nm peak | N/A | N/A | 4 | 0.1247 | 0.0929 | 10 | 12.79 |
| 3.2 | Fluorescent, F20T12 aquarium lamp | 13408 | 83 | 103 | 0.2676 | 0.2719 | 51 | 2.76 |
| 3.3 | Fluorescent food-display lamp | 3195 | 61 | 128 | 0.3869 | 0.3153 | 36 | 1.97 |

FIG._3A (RELATED ART)

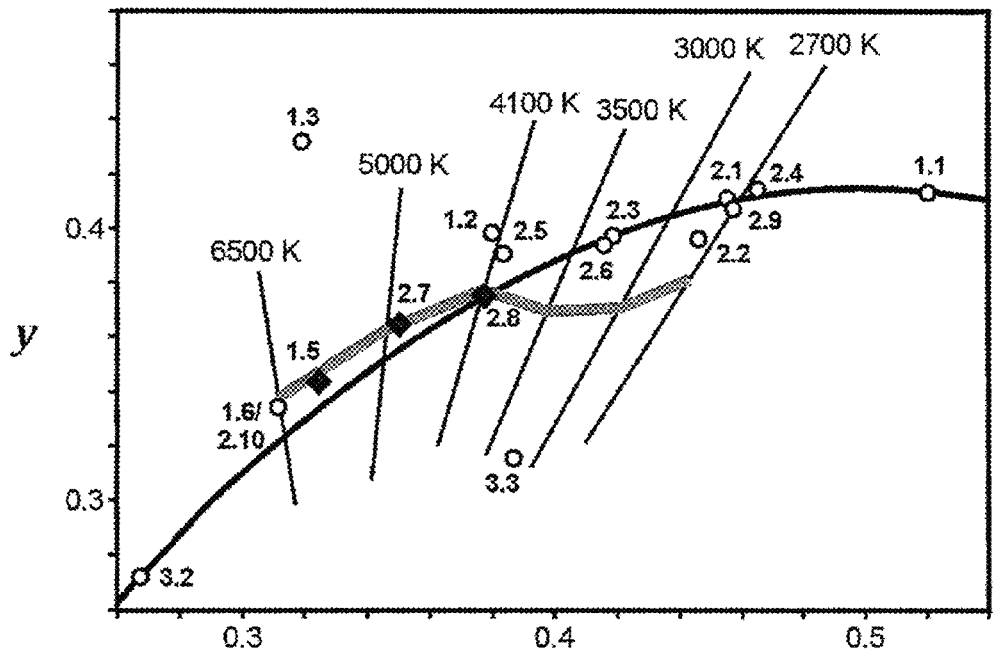

FIG._3B (RELATED ART)

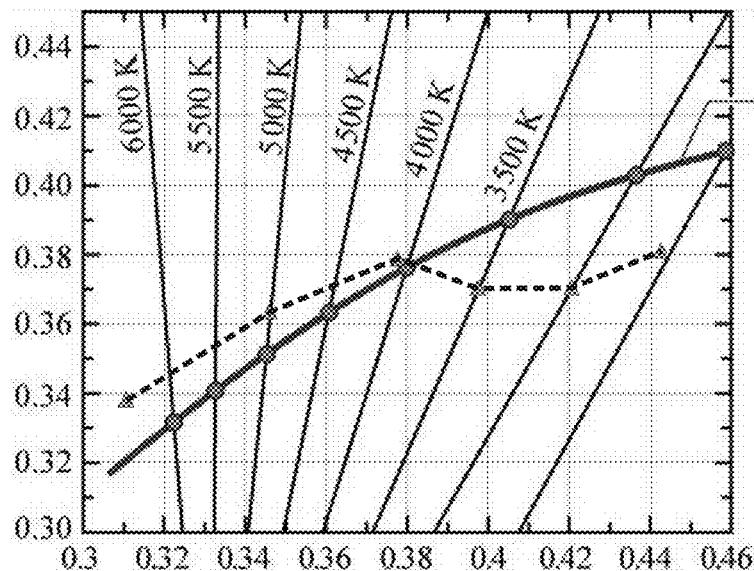
FIG._4
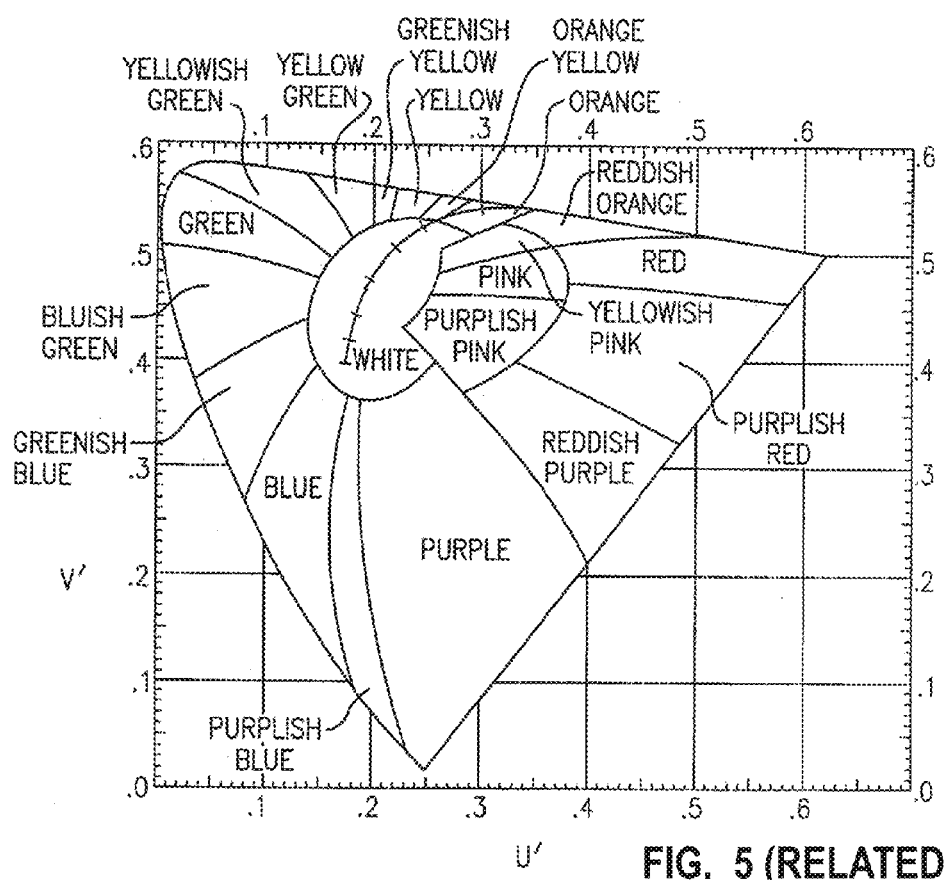
FIG._5 (RELATED ART)

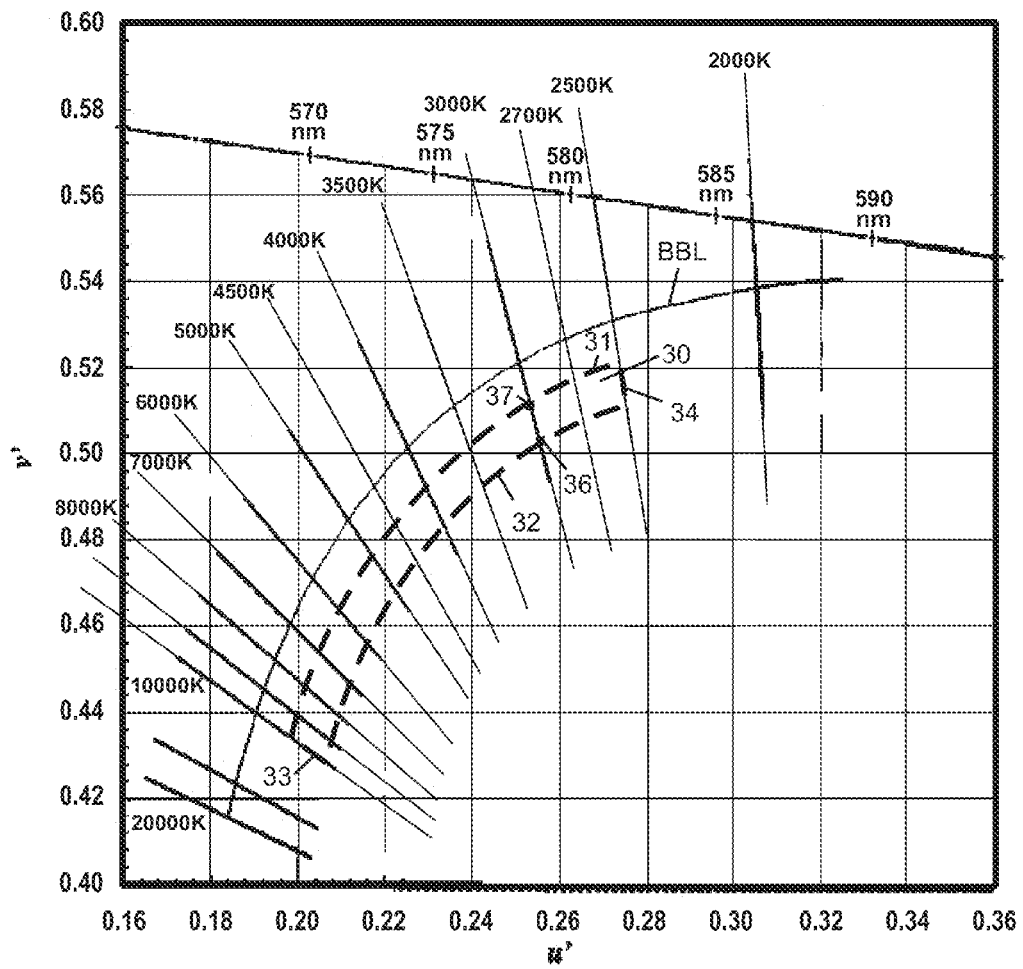
FIG._6

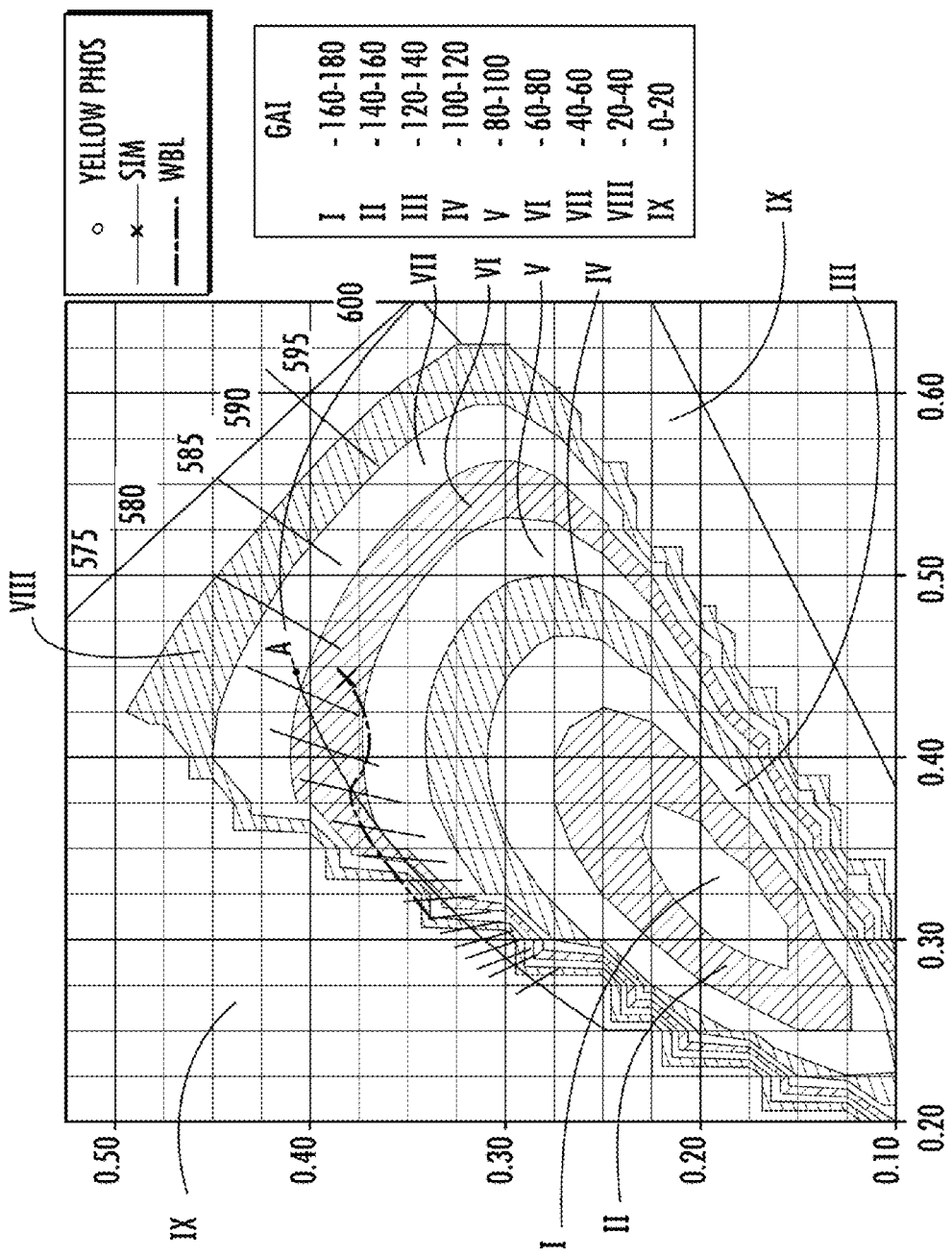
FIG._7A

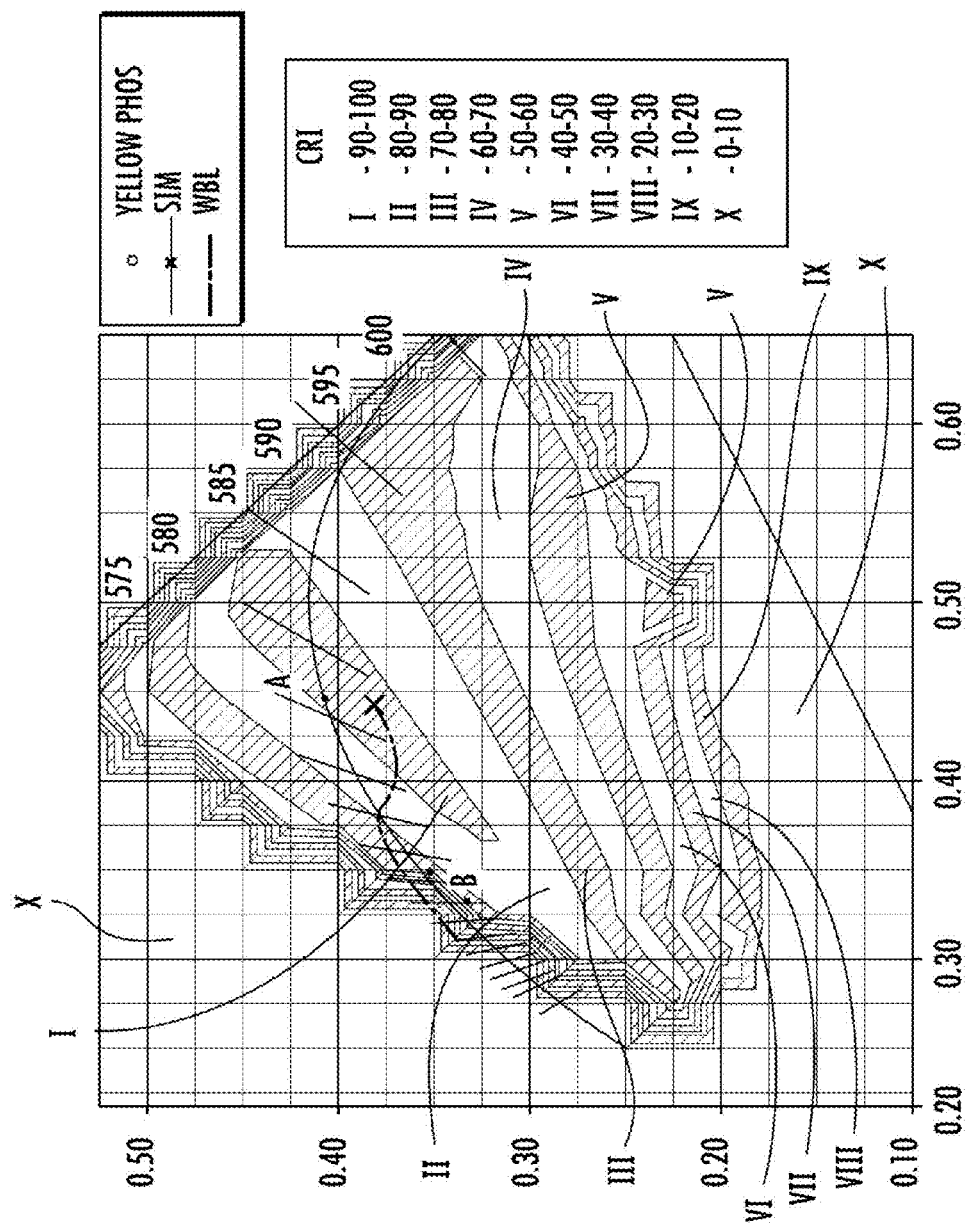
FIG._7B

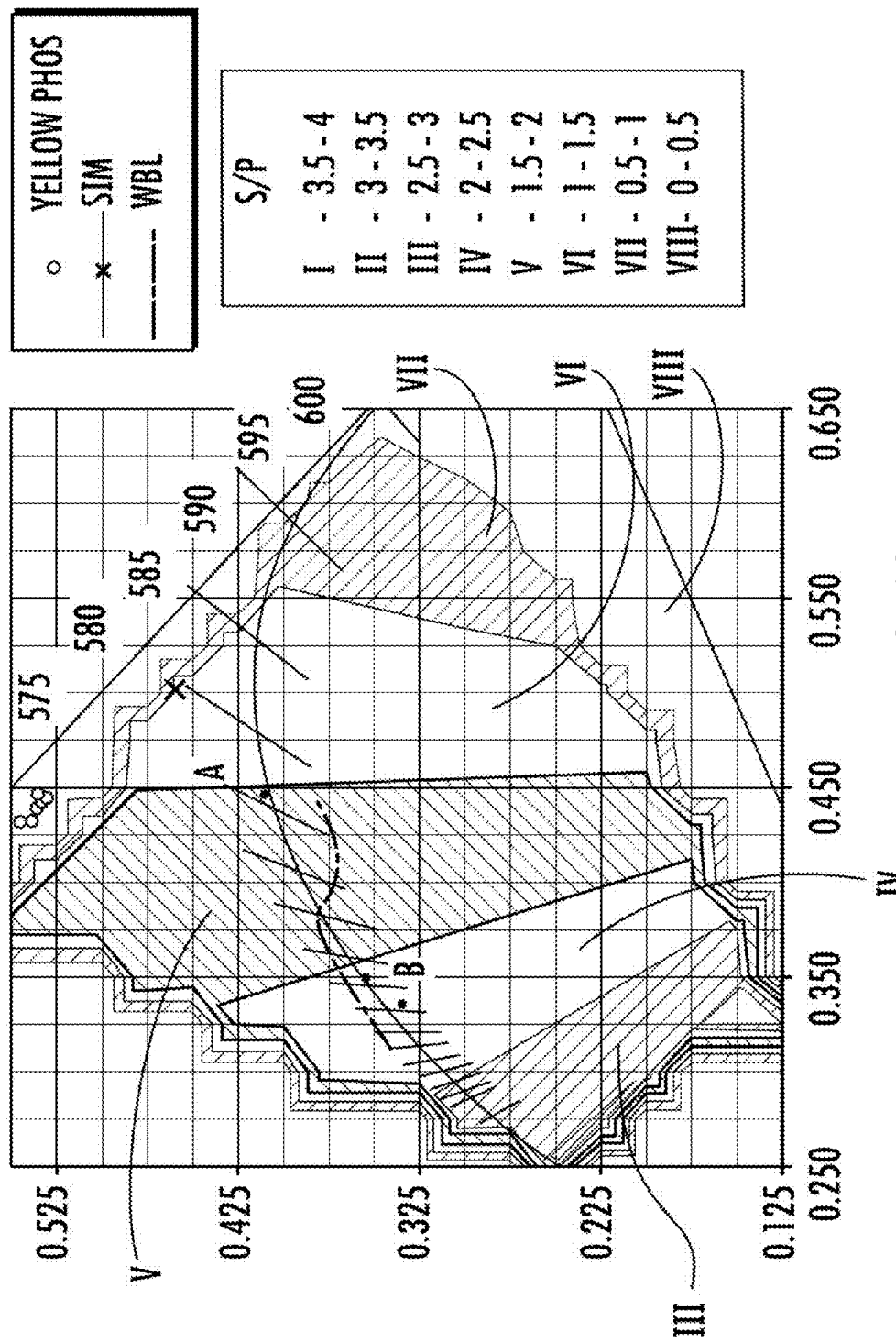
FIG._8C

| # | x | y | dm | cct | S/P | CRI | R9 | CQS | GAI | Source 1a | Source 2a | Source 3a | 1a L% | 2a L% | 3a L% | 1a x | 1a y | 2a x | 2a y | 3a x | 3a y | 1a dm | 2a dm | 3a dm | 1a pk | 2a pk | 3a pk |
|---|---|---|---|---|---|---|---|---|---|---|---|---|---|---|---|---|---|---|---|---|---|---|---|---|---|---|---|
| 1 | 0.38 | 0.36 | 585 | 3679 | 1.88 | 90.5 | 82 | 89.2 | 85.5 | ORed 619 | P1 NYAG7 | XTE 470 | 0.14 | 0.80 | 0.06 | 0.69 | 0.31 | 0.43 | 0.55 | 0.13 | 0.07 | 619 | 569 | 470 | 627 | 541 | 465 |
| 2 | 0.40 | 0.35 | 589 | 3347 | 1.55 | 92.5 | 94 | 85.2 | 90.6 | ORed 619 | P1 NYAG7 | XTE 465 | 0.16 | 0.81 | 0.03 | 0.69 | 0.31 | 0.43 | 0.55 | 0.15 | 0.03 | 619 | 569 | 459 | 627 | 541 | 454 |
| 3 | 0.40 | 0.36 | 589 | 3347 | 1.64 | 92.0 | 83 | 90.2 | 88.9 | ORed 619 | P1 NYAG7 | XTE 465 | 0.17 | 0.79 | 0.03 | 0.69 | 0.31 | 0.43 | 0.55 | 0.14 | 0.05 | 619 | 569 | 465 | 627 | 541 | 459 |
| 4 | 0.40 | 0.35 | 589 | 3347 | 1.52 | 91.5 | 95 | 84.6 | 91.2 | ORed 619 | P1 NYAG7 | XP 457 | 0.16 | 0.79 | 0.05 | 0.69 | 0.31 | 0.43 | 0.55 | 0.14 | 0.03 | 619 | 569 | 457 | 627 | 541 | 452 |
| 5 | 0.38 | 0.34 | 589 | 3691 | 1.80 | 89.6 | 71 | 89.0 | 93.8 | ORed 619 | P1 NYAG7 | XTE 465 | 0.16 | 0.79 | 0.05 | 0.69 | 0.31 | 0.43 | 0.55 | 0.15 | 0.03 | 619 | 569 | 465 | 627 | 541 | 459 |
| 6 | 0.40 | 0.34 | 589 | 3347 | 1.62 | 91.3 | 54 | 87.9 | 84.6 | Strd SPD1 | P1 NYAG7 | XTE 459 | 0.19 | 0.77 | 0.03 | 0.69 | 0.31 | 0.43 | 0.55 | 0.14 | 0.03 | 613 | 569 | 465 | 620 | 541 | 459 |
| 7 | 0.38 | 0.34 | 589 | 3691 | 1.67 | 91.1 | 56 | 82.6 | 97.2 | Strd SPD1 | P1 NYAG7 | XTE 459 | 0.17 | 0.80 | 0.03 | 0.67 | 0.33 | 0.43 | 0.55 | 0.15 | 0.03 | 613 | 569 | 459 | 620 | 541 | 454 |
| 8 | 0.40 | 0.36 | 589 | 3347 | 1.53 | 90.9 | 45 | 84.0 | 86.5 | Strd SPD1 | P1 NYAG7 | XTE 459 | 0.18 | 0.79 | 0.03 | 0.67 | 0.33 | 0.43 | 0.55 | 0.15 | 0.03 | 613 | 569 | 459 | 620 | 541 | 454 |
| 9 | 0.40 | 0.36 | 589 | 3347 | 1.48 | 90.1 | 52 | 82.9 | 91.9 | Strd SPD1 | P1 NYAG7 | XPH 455 | 0.18 | 0.82 | 0.02 | 0.67 | 0.33 | 0.43 | 0.55 | 0.15 | 0.03 | 613 | 569 | 454 | 620 | 541 | 449 |
| 10 | 0.38 | 0.34 | 592 | 3691 | 1.63 | 90.1 | 52 | 80.8 | 97.5 | Strd SPD1 | P1 NYAG7 | XP 457 | 0.17 | 0.81 | 0.03 | 0.67 | 0.33 | 0.43 | 0.55 | 0.15 | 0.05 | 613 | 569 | 457 | 620 | 541 | 452 |
| 11 | 0.38 | 0.34 | 589 | 3691 | 1.78 | 90.0 | 67 | 87.0 | 95.2 | Strd SPD1 | P1 NYAG7 | XTE 465 | 0.18 | 0.77 | 0.05 | 0.67 | 0.33 | 0.43 | 0.55 | 0.14 | 0.05 | 613 | 569 | 465 | 620 | 541 | 459 |
| 12 | 0.40 | 0.36 | 589 | 3347 | 1.50 | 90.0 | 42 | 82.4 | 87.7 | Strd SPD1 | P1 NYAG7 | XP 457 | 0.18 | 0.80 | 0.02 | 0.67 | 0.33 | 0.43 | 0.55 | 0.15 | 0.03 | 613 | 569 | 457 | 620 | 541 | 452 |
| 13 | 0.42 | 0.36 | 592 | 2912 | 1.49 | 89.9 | 43 | 83.3 | 85.8 | Strd SPD1 | P1 NYAG7 | XP 457 | 0.23 | 0.75 | 0.02 | 0.67 | 0.33 | 0.43 | 0.55 | 0.15 | 0.03 | 613 | 569 | 457 | 620 | 541 | 452 |
| 14 | 0.42 | 0.36 | 592 | 2912 | 1.41 | 89.8 | 45 | 84.9 | 85.1 | Strd SPD1 | P1 NYAG7 | XTE 459 | 0.23 | 0.74 | 0.03 | 0.67 | 0.33 | 0.43 | 0.55 | 0.15 | 0.02 | 613 | 569 | 459 | 620 | 541 | 454 |
| 15 | 0.42 | 0.36 | 592 | 2912 | 1.43 | 89.6 | 88 | 85.6 | 90.7 | Strd SPD1 | P1 NYAG7 | XP 457 | 0.21 | 0.77 | 0.02 | 0.67 | 0.33 | 0.43 | 0.55 | 0.15 | 0.03 | 613 | 569 | 457 | 620 | 541 | 449 |
| 16 | 0.42 | 0.36 | 592 | 2912 | 1.37 | 89.6 | 41 | 81.6 | 86.6 | Strd SPD1 | P1 NYAG7 | XPH 455 | 0.23 | 0.76 | 0.02 | 0.67 | 0.33 | 0.43 | 0.55 | 0.15 | 0.03 | 613 | 569 | 454 | 620 | 541 | 449 |
| 17 | 0.40 | 0.34 | 592 | 2912 | 1.40 | 89.4 | 91 | 83.8 | 91.4 | ORed 619 | P1 NYAG7 | XPH 455 | 0.20 | 0.78 | 0.02 | 0.67 | 0.33 | 0.43 | 0.55 | 0.15 | 0.03 | 619 | 569 | 454 | 627 | 541 | 449 |
| 18 | 0.42 | 0.36 | 589 | 3347 | 1.56 | 89.3 | 64 | 85.6 | 92.8 | Red 623 | P1 NYAG7 | XP 457 | 0.16 | 0.82 | 0.02 | 0.69 | 0.31 | 0.43 | 0.55 | 0.15 | 0.03 | 623 | 569 | 457 | 632 | 541 | 454 |
| 19 | 0.40 | 0.34 | 602 | 3138 | 1.49 | 89.3 | 51 | 80.4 | 99.2 | Strd SPD1 | P1 NYAG7 | XTE 459 | 0.21 | 0.76 | 0.03 | 0.67 | 0.33 | 0.43 | 0.55 | 0.15 | 0.02 | 613 | 569 | 459 | 620 | 541 | 454 |
| 20 | 0.42 | 0.34 | 592 | 2912 | 1.45 | 89.1 | 85 | 87.2 | 90.0 | ORed 619 | P1 NYAG7 | XPH 455 | 0.21 | 0.77 | 0.02 | 0.67 | 0.33 | 0.43 | 0.55 | 0.15 | 0.03 | 619 | 569 | 454 | 627 | 541 | 449 |
| 21 | 0.40 | 0.34 | 602 | 3138 | 1.53 | 89.0 | 54 | 82.2 | 96.3 | ORed 619 | P1 NYAG7 | XPH 455 | 0.22 | 0.76 | 0.02 | 0.67 | 0.33 | 0.43 | 0.55 | 0.15 | 0.03 | 619 | 569 | 454 | 627 | 541 | 454 |
| 22 | 0.40 | 0.34 | 602 | 3138 | 1.53 | 89.0 | 68 | 85.1 | 93.3 | Red 623 | P1 NYAG7 | XPH 455 | 0.15 | 0.83 | 0.02 | 0.67 | 0.33 | 0.43 | 0.55 | 0.15 | 0.02 | 623 | 569 | 454 | 632 | 541 | 449 |
| 23 | 0.40 | 0.36 | 589 | 3347 | 1.56 | 88.8 | 57 | 84.0 | 97.6 | Strd SPD1 | P1 NYAG7 | XTE 459 | 0.22 | 0.75 | 0.03 | 0.67 | 0.33 | 0.43 | 0.55 | 0.15 | 0.02 | 613 | 569 | 459 | 620 | 541 | 454 |
| 24 | 0.38 | 0.34 | 592 | 3691 | 1.55 | 88.5 | 50 | 90.7 | 91.1 | Strd SPD1 | P1 NYAG7 | XTE 465 | 0.16 | 0.80 | 0.04 | 0.67 | 0.33 | 0.43 | 0.55 | 0.14 | 0.05 | 613 | 569 | 465 | 620 | 541 | 459 |
| 25 | 0.42 | 0.36 | 589 | 2912 | 1.59 | 88.5 | 48 | 79.1 | 98.5 | Strd SPD1 | P1 NYAG7 | XPH 455 | 0.16 | 0.81 | 0.03 | 0.67 | 0.33 | 0.43 | 0.55 | 0.15 | 0.03 | 613 | 569 | 454 | 620 | 541 | 449 |
| 26 | 0.42 | 0.34 | 592 | 2912 | 1.32 | 88.4 | 37 | 78.8 | 87.7 | Strd SPD1 | P1 NYAG7 | XP 450 | 0.22 | 0.77 | 0.01 | 0.67 | 0.33 | 0.43 | 0.55 | 0.16 | 0.02 | 613 | 569 | 450 | 620 | 541 | 444 |
| 27 | 0.40 | 0.36 | 589 | 3347 | 1.47 | 88.3 | 39 | 80.8 | 87.8 | Strd SPD1 | P1 NYAG7 | XPH 455 | 0.18 | 0.80 | 0.02 | 0.67 | 0.33 | 0.43 | 0.55 | 0.15 | 0.03 | 613 | 569 | 454 | 620 | 541 | 454 |
| 28 | 0.40 | 0.36 | 592 | 3347 | 1.35 | 88.1 | 94 | 80.9 | 92.4 | ORed 619 | P1 NYAG7 | XP 450 | 0.20 | 0.79 | 0.01 | 0.67 | 0.33 | 0.43 | 0.55 | 0.16 | 0.02 | 619 | 569 | 450 | 627 | 541 | 444 |
| 29 | 0.44 | 0.36 | 594 | 2565 | 1.23 | 87.9 | 34 | 83.7 | 84.6 | Strd SPD1 | P1 NYAG7 | XP 450 | 0.27 | 0.72 | 0.01 | 0.67 | 0.33 | 0.43 | 0.55 | 0.16 | 0.02 | 613 | 569 | 450 | 620 | 541 | 444 |
| 30 | 0.42 | 0.36 | 592 | 2912 | 1.52 | 87.9 | 53 | 86.7 | 93.1 | Strd SPD1 | P1 NYAG7 | XTE 465 | 0.24 | 0.72 | 0.03 | 0.67 | 0.33 | 0.43 | 0.55 | 0.14 | 0.05 | 613 | 569 | 465 | 620 | 541 | 459 |
| 31 | 0.44 | 0.36 | 594 | 2565 | 1.22 | 87.8 | 32 | 77.1 | 84.9 | Strd SPD1 | P1 NYAG7 | XR 447 | 0.27 | 0.72 | 0.01 | 0.67 | 0.33 | 0.43 | 0.55 | 0.16 | 0.02 | 613 | 569 | 447 | 620 | 541 | 440 |

| # | x | y | dm | cct | S/P | CRI | R9 | CQS | GAI | Source 1a | Source 2a | Source 3a | 1a L% | 2a L% | 3a L% | 1a x | 1a y | 2a x | 2a y | 3a x | 3a y | 1a dm | 2a dm | 3a dm | 1a pk | 2a pk | 3a pk |
|---|---|---|---|---|---|---|---|---|---|---|---|---|---|---|---|---|---|---|---|---|---|---|---|---|---|---|---|
| 63 | 0.40 | 0.38 | 583 | 3530 | 1.76 | 88.6 | 77 | 92.1 | 80.8 | Strd SPD1 | P1 LUAG2 | XPH 455 | 0.24 | 0.74 | 0.01 | 0.67 | 0.33 | 0.35 | 0.57 | 0.15 | 0.02 | 613 | 558 | 454 | 620 | 532 | 449 |
| 64 | 0.40 | 0.38 | 583 | 3530 | 1.71 | 88.4 | 73 | 89.6 | 82.5 | Strd SPD1 | P1 LUAG2 | XR 447 | 0.24 | 0.75 | 0.01 | 0.67 | 0.33 | 0.35 | 0.57 | 0.16 | 0.03 | 613 | 558 | 447 | 620 | 532 | 440 |
| 65 | 0.40 | 0.38 | 586 | 3101 | 1.39 | 87.8 | 77 | 85.0 | 81.1 | Red 623 | P1 NYAG7 | XPH 455 | 0.16 | 0.82 | 0.01 | 0.70 | 0.30 | 0.43 | 0.55 | 0.15 | 0.02 | 623 | 569 | 454 | 632 | 541 | 449 |
| 66 | 0.42 | 0.38 | 586 | 3101 | 1.34 | 87.8 | 65 | 81.8 | 83.1 | ORed 619 | P1 NYAG7 | XPH 450 | 0.17 | 0.82 | 0.01 | 0.69 | 0.31 | 0.43 | 0.55 | 0.15 | 0.02 | 619 | 569 | 450 | 627 | 541 | 444 |
| 67 | 0.38 | 0.36 | 585 | 3879 | 1.63 | 87.6 | 36 | 81.7 | 85.3 | Strd SPD1 | P1 NYAG7 | XTE 459 | 0.13 | 0.84 | 0.03 | 0.70 | 0.30 | 0.43 | 0.55 | 0.15 | 0.02 | 613 | 569 | 459 | 620 | 541 | 454 |
| 68 | 0.40 | 0.36 | 583 | 3530 | 1.47 | 86.9 | 98 | 83.3 | 81.3 | Red 623 | P1 NYAG7 | XPH 455 | 0.12 | 0.86 | 0.02 | 0.70 | 0.30 | 0.43 | 0.55 | 0.15 | 0.02 | 623 | 569 | 454 | 632 | 541 | 449 |
| 69 | 0.34 | 0.34 | 599 | 3691 | 1.52 | 85.3 | 42 | 76.2 | 99.5 | Strd SPD1 | P1 NYAG7 | XPH 450 | 0.15 | 0.83 | 0.02 | 0.67 | 0.33 | 0.43 | 0.55 | 0.16 | 0.02 | 613 | 569 | 450 | 620 | 541 | 444 |
| 70 | 0.42 | 0.38 | 586 | 3101 | 1.32 | 86.6 | 83 | 80.3 | 80.3 | ORed 619 | P1 NYAG7 | XR 447 | 0.16 | 0.83 | 0.01 | 0.69 | 0.31 | 0.43 | 0.55 | 0.16 | 0.03 | 619 | 569 | 447 | 627 | 541 | 440 |
| 71 | 0.38 | 0.36 | 585 | 3879 | 1.58 | 86.4 | 98 | 81.1 | 92.8 | Red 623 | P1 NYAG7 | XPH 455 | 0.11 | 0.87 | 0.02 | 0.70 | 0.30 | 0.43 | 0.55 | 0.15 | 0.02 | 623 | 569 | 454 | 632 | 541 | 449 |
| 72 | 0.38 | 0.36 | 585 | 3879 | 1.57 | 86.4 | 73 | 80.6 | 90.2 | Red 623 | P1 NYAG7 | XPH 450 | 0.11 | 0.87 | 0.01 | 0.70 | 0.30 | 0.43 | 0.55 | 0.15 | 0.02 | 623 | 569 | 450 | 632 | 541 | 444 |
| 73 | 0.38 | 0.36 | 586 | 3101 | 1.60 | 85.9 | 82 | 80.1 | 86.4 | Strd SPD1 | P1 NYAG7 | XP 457 | 0.13 | 0.85 | 0.02 | 0.70 | 0.30 | 0.43 | 0.55 | 0.15 | 0.02 | 613 | 569 | 457 | 620 | 541 | 452 |
| 74 | 0.38 | 0.36 | 585 | 3879 | 1.34 | 85.5 | 82 | 82.2 | 81.9 | Red 623 | P1 NYAG7 | XPH 450 | 0.16 | 0.85 | 0.01 | 0.70 | 0.30 | 0.43 | 0.55 | 0.15 | 0.02 | 623 | 569 | 450 | 632 | 541 | 444 |
| 75 | 0.36 | 0.36 | 592 | 2912 | 1.44 | 85.3 | 49 | 77.7 | 92.5 | Red 623 | P1 NYAG7 | XTE 459 | 0.20 | 0.78 | 0.02 | 0.70 | 0.30 | 0.43 | 0.55 | 0.15 | 0.03 | 623 | 569 | 459 | 632 | 541 | 454 |
| 76 | 0.36 | 0.36 | 592 | 2912 | 1.46 | 85.0 | 79 | 80.5 | 94.8 | Red 623 | P1 NYAG7 | XTE 459 | 0.15 | 0.84 | 0.01 | 0.70 | 0.30 | 0.43 | 0.55 | 0.16 | 0.02 | 623 | 569 | 459 | 632 | 541 | 454 |
| 77 | 0.34 | 0.34 | 604 | 2710 | 1.22 | 84.9 | 51 | 83.7 | 96.0 | Strd SPD1 | P1 LUAG2 | XR 447 | 0.27 | 0.70 | 0.03 | 0.67 | 0.33 | 0.35 | 0.57 | 0.16 | 0.03 | 613 | 558 | 447 | 620 | 532 | 440 |
| 78 | 0.44 | 0.38 | 605 | 2381 | 1.36 | 84.8 | 33 | 74.4 | 98.0 | Strd SPD1 | P1 LUAG2 | XR 447 | 0.31 | 0.67 | 0.02 | 0.67 | 0.33 | 0.35 | 0.57 | 0.16 | 0.03 | 613 | 558 | 447 | 620 | 532 | 440 |
| 79 | 0.36 | 0.36 | 592 | 2912 | 1.71 | 84.7 | 61 | 81.2 | 94.9 | Strd SPD1 | P1 LUAG2 | XPH 450 | 0.19 | 0.80 | 0.02 | 0.67 | 0.33 | 0.35 | 0.57 | 0.15 | 0.02 | 613 | 558 | 450 | 620 | 532 | 444 |
| 80 | 0.40 | 0.36 | 589 | 3347 | 1.77 | 84.4 | 80 | 88.1 | 94.4 | Strd SPD1 | P1 LUAG2 | XPH 455 | 0.27 | 0.72 | 0.02 | 0.67 | 0.33 | 0.35 | 0.57 | 0.15 | 0.02 | 613 | 558 | 454 | 620 | 532 | 449 |
| 81 | 0.40 | 0.36 | 589 | 3347 | 1.24 | 84.4 | 84 | 92.0 | 92.4 | Strd SPD1 | P1 LUAG2 | XPH 450 | 0.27 | 0.71 | 0.02 | 0.67 | 0.33 | 0.35 | 0.57 | 0.15 | 0.02 | 613 | 558 | 450 | 620 | 532 | 444 |
| 82 | 0.44 | 0.38 | 605 | 2381 | 1.16 | 84.8 | 34 | 75.4 | 95.6 | Strd SPD1 | P1 LUAG2 | XPH 450 | 0.31 | 0.67 | 0.02 | 0.67 | 0.33 | 0.35 | 0.57 | 0.16 | 0.02 | 613 | 558 | 450 | 620 | 532 | 444 |
| 83 | 0.46 | 0.38 | 596 | 2289 | 1.18 | 84.4 | 90 | 77.2 | 86.0 | ORed 619 | P1 LUAG2 | XR 447 | 0.29 | 0.70 | 0.01 | 0.69 | 0.31 | 0.35 | 0.57 | 0.16 | 0.03 | 619 | 558 | 447 | 627 | 532 | 440 |
| 84 | 0.40 | 0.36 | 589 | 3347 | 1.80 | 84.4 | 89 | 78.3 | 85.7 | Strd SPD1 | P1 LUAG2 | XR 447 | 0.29 | 0.70 | 0.01 | 0.67 | 0.33 | 0.35 | 0.57 | 0.16 | 0.03 | 613 | 558 | 447 | 620 | 532 | 440 |
| 85 | 0.46 | 0.38 | 596 | 2289 | 1.39 | 83.6 | 86 | 81.6 | 91.4 | Strd SPD1 | P1 LUAG2 | XR 447 | 0.27 | 0.71 | 0.02 | 0.67 | 0.33 | 0.35 | 0.57 | 0.16 | 0.03 | 613 | 558 | 447 | 620 | 532 | 440 |
| 86 | 0.42 | 0.36 | 589 | 3347 | 1.42 | 84.0 | 32 | 77.2 | 95.0 | Strd SPD1 | P1 NYAG7 | XP 457 | 0.17 | 0.82 | 0.01 | 0.69 | 0.31 | 0.43 | 0.55 | 0.15 | 0.03 | 619 | 569 | 457 | 627 | 541 | 452 |
| 87 | 0.42 | 0.36 | 589 | 3347 | 1.75 | 93.8 | 74 | 79.6 | 95.0 | Red 623 | P1 NYAG7 | XTE 465 | 0.14 | 0.84 | 0.04 | 0.70 | 0.30 | 0.43 | 0.55 | 0.14 | 0.03 | 623 | 569 | 465 | 632 | 541 | 459 |
| 88 | 0.42 | 0.38 | 586 | 3101 | 1.33 | 84.5 | 84 | 88.3 | 82.1 | Red 623 | P1 NYAG7 | XR 447 | 0.12 | 0.84 | 0.03 | 0.70 | 0.30 | 0.43 | 0.55 | 0.16 | 0.03 | 623 | 569 | 447 | 632 | 541 | 440 |
| 89 | 0.40 | 0.36 | 592 | 2912 | 1.34 | 83.9 | 64 | 83.2 | 95.1 | Red 623 | P1 NYAG7 | XR 447 | 0.16 | 0.80 | 0.03 | 0.70 | 0.30 | 0.43 | 0.55 | 0.16 | 0.03 | 623 | 569 | 447 | 632 | 541 | 440 |
| 90 | 0.46 | 0.38 | 596 | 2289 | 1.22 | 84.4 | 50 | 81.2 | 87.0 | ORed 619 | P1 NYAG7 | XPH 450 | 0.19 | 0.80 | 0.01 | 0.69 | 0.31 | 0.43 | 0.55 | 0.15 | 0.02 | 619 | 569 | 450 | 627 | 541 | 444 |
| 91 | 0.46 | 0.38 | 596 | 2289 | 1.56 | 83.8 | 29 | 78.3 | 83.0 | Strd SPD1 | P1 NYAG7 | XPH 455 | 0.29 | 0.69 | 0.02 | 0.67 | 0.33 | 0.43 | 0.55 | 0.15 | 0.02 | 613 | 569 | 454 | 620 | 541 | 449 |
| 92 | 0.38 | 0.36 | 585 | 3879 | 1.41 | 83.6 | 81 | 87.0 | 85.0 | Red 623 | P1 NYAG7 | XR 447 | 0.13 | 0.85 | 0.02 | 0.70 | 0.33 | 0.43 | 0.55 | 0.15 | 0.03 | 623 | 569 | 447 | 632 | 541 | 440 |
| 93 | 0.40 | 0.38 | 583 | 3530 | 1.47 | 83.5 | 66 | 83.1 | 83.5 | ORed 619 | P1 NYAG7 | XPH 450 | 0.12 | 0.85 | 0.01 | 0.69 | 0.31 | 0.43 | 0.55 | 0.16 | 0.02 | 619 | 569 | 450 | 627 | 541 | 444 |

| # | x | y | dm | cct | S/P | CRI | R9 | CQS | GAI | Source 1a | Source 2a | Source 3a | 1a L% | 2a L% | 3a L% | 1a x | 1a y | 2a x | 2a y | 3a x | 3a y | 1a dm | 2a dm | 3a dm | 1a pk | 2a pk | 3a pk |
|---|---|---|---|---|---|---|---|---|---|---|---|---|---|---|---|---|---|---|---|---|---|---|---|---|---|---|---|
| 94 | 0.40 | 0.38 | 583 | 3530 | 1.42 | 83.3 | 92 | 80.7 | 82.1 | Red 623 | P1 NYAG7 | XPH 450 | 0.12 | 0.87 | 0.01 | 0.70 | 0.30 | 0.43 | 0.55 | 0.16 | 0.02 | 623 | 569 | 450 | 632 | 541 | 444 |
| 95 | 0.40 | 0.36 | 589 | 3347 | 1.78 | 83.8 | 33 | 91.8 | 88.5 | Red 623 | P1 NYAG7 | XTE 470 | 0.18 | 0.77 | 0.05 | 0.70 | 0.30 | 0.43 | 0.55 | 0.13 | 0.07 | 623 | 569 | 470 | 632 | 541 | 465 |
| 96 | 0.38 | 0.36 | 585 | 3879 | 1.75 | 94.9 | 94 | 87.7 | 87.7 | ORed 619 | P1 NYAG7 | XTE 465 | 0.13 | 0.83 | 0.04 | 0.69 | 0.31 | 0.43 | 0.55 | 0.14 | 0.05 | 619 | 569 | 465 | 627 | 541 | 459 |
| 97 | 0.38 | 0.36 | 585 | 3879 | 1.52 | 82.1 | 90 | 78.5 | 92.5 | Red 623 | P1 NYAG7 | XPH 450 | 0.10 | 0.88 | 0.02 | 0.70 | 0.30 | 0.43 | 0.55 | 0.16 | 0.02 | 623 | 569 | 450 | 632 | 541 | 444 |
| 98 | 0.38 | 0.36 | 585 | 3879 | 1.52 | 82.1 | 65 | 77.9 | 90.9 | ORed 619 | P1 NYAG7 | XPH 450 | 0.11 | 0.88 | 0.02 | 0.69 | 0.31 | 0.43 | 0.55 | 0.16 | 0.02 | 619 | 569 | 450 | 627 | 541 | 444 |
| 99 | 0.40 | 0.38 | 583 | 3530 | 1.40 | 82.1 | 63 | 79.4 | 80.7 | ORed 619 | P1 NYAG7 | XPH 450 | 0.12 | 0.87 | 0.01 | 0.69 | 0.31 | 0.43 | 0.55 | 0.16 | 0.02 | 619 | 569 | 450 | 627 | 541 | 440 |
| 100 | 0.40 | 0.38 | 583 | 3530 | 1.40 | 81.9 | 89 | 80.0 | 82.2 | Red 623 | P1 NYAG7 | XR 447 | 0.12 | 0.87 | 0.01 | 0.70 | 0.30 | 0.43 | 0.55 | 0.16 | 0.02 | 623 | 569 | 447 | 632 | 541 | 440 |
| 101 | 0.38 | 0.34 | 599 | 3691 | 1.50 | 83.6 | 39 | 75.4 | 99.8 | ORed 619 | P1 NYAG7 | XR 447 | 0.15 | 0.83 | 0.02 | 0.67 | 0.33 | 0.43 | 0.55 | 0.16 | 0.02 | 619 | 569 | 447 | 620 | 541 | 440 |
| 102 | 0.44 | 0.36 | 594 | 2565 | 1.44 | 83.5 | 75 | 90.4 | 85.4 | ORed 619 | P1 NYAG7 | XTE 465 | 0.26 | 0.71 | 0.03 | 0.69 | 0.31 | 0.43 | 0.55 | 0.14 | 0.05 | 619 | 569 | 465 | 627 | 541 | 459 |
| 103 | 0.45 | 0.36 | 596 | 2289 | 1.24 | 83.5 | 85 | 82.8 | 83.9 | ORed 619 | P1 NYAG7 | XP 457 | 0.30 | 0.69 | 0.02 | 0.69 | 0.31 | 0.43 | 0.55 | 0.15 | 0.03 | 619 | 569 | 457 | 627 | 541 | 452 |
| 104 | 0.38 | 0.36 | 585 | 3879 | 1.94 | 80.1 | 34 | 91.3 | 97.6 | ORed 619 | P1 LUAG2 | XP 457 | 0.21 | 0.77 | 0.02 | 0.69 | 0.31 | 0.35 | 0.57 | 0.15 | 0.03 | 619 | 558 | 457 | 627 | 532 | 452 |
| 105 | 0.44 | 0.34 | 605 | 2381 | 1.87 | 80.5 | 42 | 89.6 | 99.9 | ORed 619 | P1 LUAG2 | XPH 450 | 0.20 | 0.78 | 0.01 | 0.69 | 0.31 | 0.35 | 0.57 | 0.16 | 0.02 | 619 | 558 | 450 | 627 | 532 | 444 |
| 106 | 0.44 | 0.34 | 605 | 2381 | 1.29 | 83.3 | 38 | 78.3 | 94.3 | Strd SPD1 | P1 LUAG2 | XPH 455 | 0.32 | 0.66 | 0.02 | 0.67 | 0.33 | 0.43 | 0.55 | 0.15 | 0.03 | 613 | 558 | 455 | 620 | 532 | 449 |
| 107 | 0.38 | 0.36 | 585 | 3879 | 1.89 | 88.9 | 53 | 89.7 | 87.4 | Red 623 | P1 LUAG2 | XTE 470 | 0.14 | 0.81 | 0.06 | 0.70 | 0.30 | 0.35 | 0.57 | 0.13 | 0.07 | 623 | 558 | 470 | 632 | 532 | 465 |
| 108 | 0.38 | 0.36 | 585 | 3879 | 1.83 | 88.4 | 81 | 91.1 | 94.8 | Strd SPD1 | P1 LUAG2 | XPH 450 | 0.22 | 0.76 | 0.01 | 0.67 | 0.33 | 0.35 | 0.57 | 0.16 | 0.02 | 613 | 558 | 450 | 620 | 532 | 444 |
| 109 | 0.38 | 0.36 | 585 | 3879 | 1.91 | 88.3 | 86 | 93.5 | 92.4 | Strd SPD1 | P1 LUAG2 | XP 457 | 0.23 | 0.75 | 0.02 | 0.67 | 0.33 | 0.35 | 0.57 | 0.15 | 0.03 | 613 | 558 | 457 | 620 | 532 | 452 |
| 110 | 0.38 | 0.36 | 585 | 3879 | 1.91 | 80.5 | 37 | 90.9 | 98.5 | ORed 619 | P1 LUAG2 | XPH 455 | 0.21 | 0.77 | 0.02 | 0.69 | 0.31 | 0.35 | 0.57 | 0.15 | 0.03 | 619 | 558 | 455 | 627 | 532 | 449 |
| 111 | 0.42 | 0.36 | 592 | 2912 | 1.55 | 83.0 | 38 | 91.7 | 90.6 | ORed 619 | P1 LUAG2 | XTE 465 | 0.21 | 0.76 | 0.03 | 0.69 | 0.31 | 0.43 | 0.55 | 0.14 | 0.05 | 619 | 569 | 465 | 632 | 558 | 459 |
| 112 | 0.38 | 0.36 | 585 | 3879 | 2.02 | 82.9 | 90 | 90.2 | 89.1 | Strd SPD1 | P1 LUAG2 | XTE 465 | 0.24 | 0.72 | 0.04 | 0.67 | 0.33 | 0.35 | 0.57 | 0.14 | 0.05 | 613 | 558 | 465 | 620 | 532 | 459 |
| 113 | 0.38 | 0.36 | 585 | 3879 | 1.87 | 88.6 | 62 | 87.2 | 81.9 | Strd SPD1 | P1 LUAG2 | XTE 470 | 0.16 | 0.78 | 0.06 | 0.67 | 0.33 | 0.35 | 0.57 | 0.13 | 0.07 | 613 | 558 | 470 | 620 | 532 | 465 |
| 114 | 0.38 | 0.36 | 585 | 3879 | 1.81 | 88.1 | 79 | 90.1 | 95.3 | Strd SPD1 | P1 LUAG2 | XR 447 | 0.22 | 0.77 | 0.01 | 0.67 | 0.33 | 0.35 | 0.57 | 0.16 | 0.02 | 613 | 558 | 447 | 620 | 532 | 440 |
| 115 | 0.40 | 0.38 | 583 | 3530 | 1.76 | 80.8 | 48 | 88.6 | 86.6 | ORed 619 | P1 LUAG2 | XPH 450 | 0.22 | 0.77 | 0.01 | 0.69 | 0.31 | 0.35 | 0.57 | 0.16 | 0.02 | 619 | 558 | 450 | 627 | 532 | 444 |
| 116 | 0.40 | 0.38 | 583 | 3530 | 1.74 | 80.8 | 49 | 87.7 | 87.0 | ORed 619 | P1 LUAG2 | XR 447 | 0.22 | 0.77 | 0.01 | 0.69 | 0.31 | 0.35 | 0.57 | 0.16 | 0.02 | 619 | 558 | 447 | 627 | 532 | 440 |
| 117 | 0.38 | 0.36 | 585 | 3879 | 1.50 | 80.5 | 86 | 77.8 | 92.6 | Red 623 | P1 NYAG7 | XR 447 | 0.10 | 0.89 | 0.01 | 0.70 | 0.30 | 0.43 | 0.55 | 0.16 | 0.02 | 623 | 569 | 447 | 632 | 541 | 440 |
| 118 | 0.38 | 0.36 | 585 | 3879 | 1.94 | 87.4 | 88 | 93.2 | 91.6 | Strd SPD1 | P1 NYAG7 | XTE 459 | 0.23 | 0.74 | 0.03 | 0.67 | 0.33 | 0.43 | 0.55 | 0.15 | 0.03 | 613 | 569 | 459 | 620 | 541 | 454 |
| 119 | 0.40 | 0.36 | 585 | 3530 | 1.80 | 80.5 | 44 | 89.7 | 85.4 | ORed 619 | P1 LUAG2 | XPH 455 | 0.22 | 0.77 | 0.02 | 0.69 | 0.31 | 0.35 | 0.57 | 0.15 | 0.03 | 619 | 558 | 455 | 627 | 532 | 449 |
| 120 | 0.38 | 0.36 | 585 | 3879 | 1.49 | 80.4 | 62 | 77.2 | 91.1 | ORed 619 | P1 NYAG7 | XR 447 | 0.11 | 0.88 | 0.01 | 0.69 | 0.31 | 0.43 | 0.55 | 0.16 | 0.02 | 619 | 569 | 447 | 627 | 541 | 440 |
| 121 | 0.40 | 0.38 | 583 | 3530 | 1.82 | 80.4 | 41 | 89.9 | 84.6 | ORed 619 | P1 LUAG2 | XP 457 | 0.22 | 0.76 | 0.02 | 0.69 | 0.31 | 0.35 | 0.57 | 0.15 | 0.03 | 619 | 558 | 457 | 627 | 532 | 452 |
| 122 | 0.40 | 0.38 | 583 | 3530 | 1.88 | 80.9 | 84 | 93.0 | 93.4 | Strd SPD1 | P1 LUAG2 | XPH 455 | 0.23 | 0.75 | 0.02 | 0.67 | 0.33 | 0.35 | 0.57 | 0.15 | 0.03 | 613 | 558 | 455 | 620 | 532 | 449 |
| 123 | 0.38 | 0.36 | 585 | 3879 | 1.51 | 80.0 | 23 | 76.1 | 87.9 | Strd SPD1 | P1 NYAG7 | XPH 450 | 0.12 | 0.86 | 0.02 | 0.67 | 0.33 | 0.43 | 0.55 | 0.16 | 0.02 | 613 | 569 | 450 | 620 | 541 | 444 |
| 124 | 0.38 | 0.36 | 585 | 3879 | 1.73 | 91.4 | 47 | 85.4 | 84.3 | Strd SPD1 | P1 NYAG7 | XTE 465 | 0.14 | 0.81 | 0.04 | 0.67 | 0.33 | 0.43 | 0.55 | 0.14 | 0.05 | 613 | 569 | 465 | 620 | 541 | 459 |

|  | Incan-descent | Unfiltered BS(Y+R) | High CRI Nd filtered BS(Y+R) | Neo WBL Nd filtered BS(Y+R) |
|---|---|---|---|---|
| GAI | 49% | 49% | 63% | 78% |
| CRI Ra | 100 | 81 | 92 | 80 |
| R9 | 100 | 17 | 82 | 58 |
| LEP | 149 | 319 | 294 | 270 |
| S/P ratio | 1.35 | 1.14 | 1.25 | 1.35 |
| LPW | - | 106 | 86 | 70 |
| Filter lumen loss | 0% | 0% | 19% | 34% |
| Du'v' BBL | 0.000 | 0.000 | 0.006 | 0.014 |
| Nd density (3.2 mm ref.) | 0.00 | 0.00 | 0.50 | 1.20 |
FIG._10
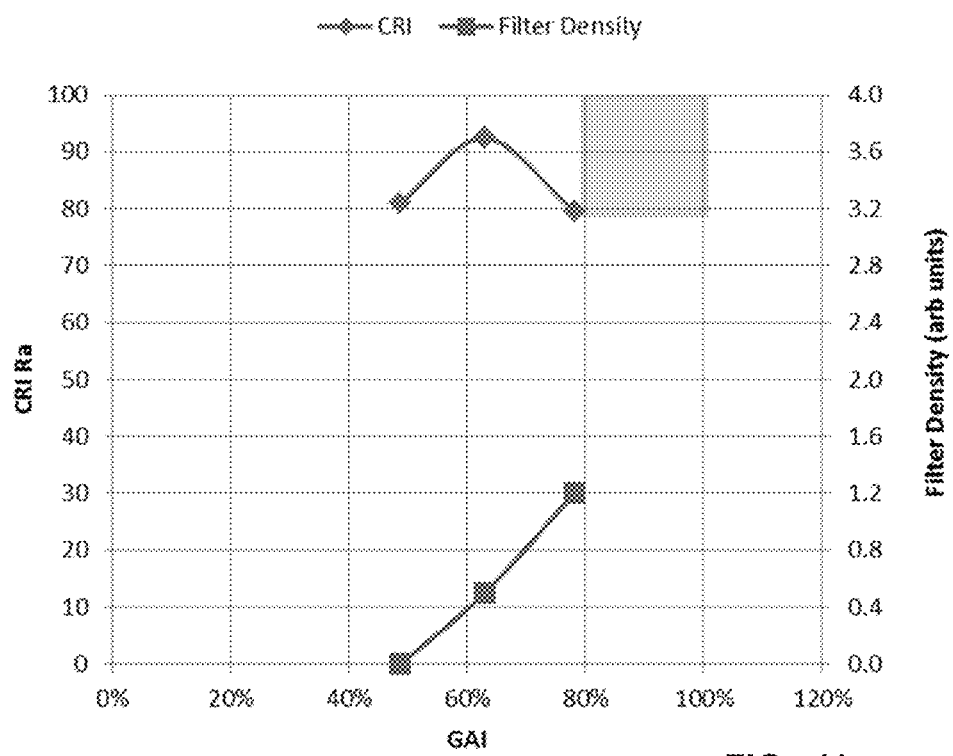
FIG._11

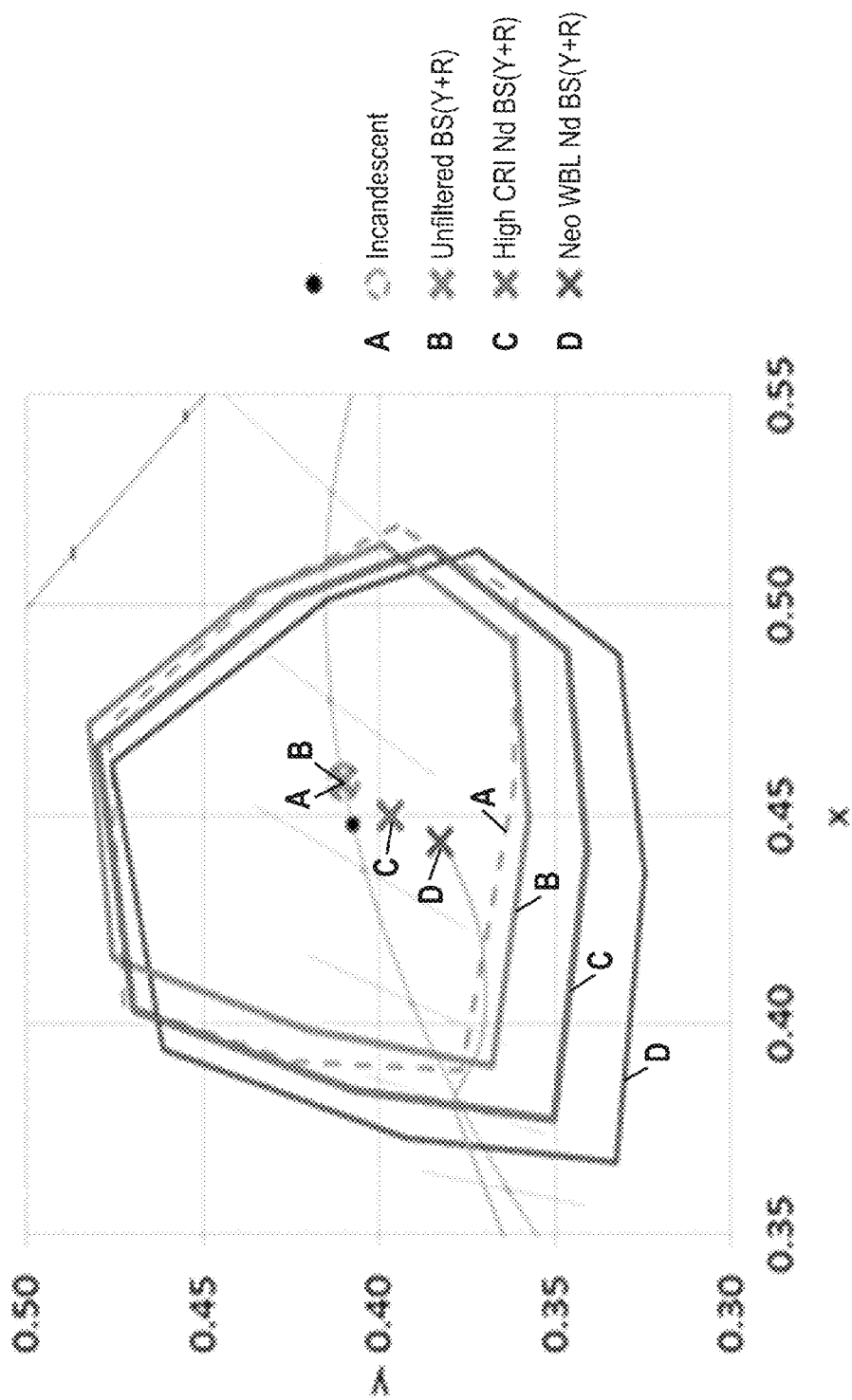
FIG._12

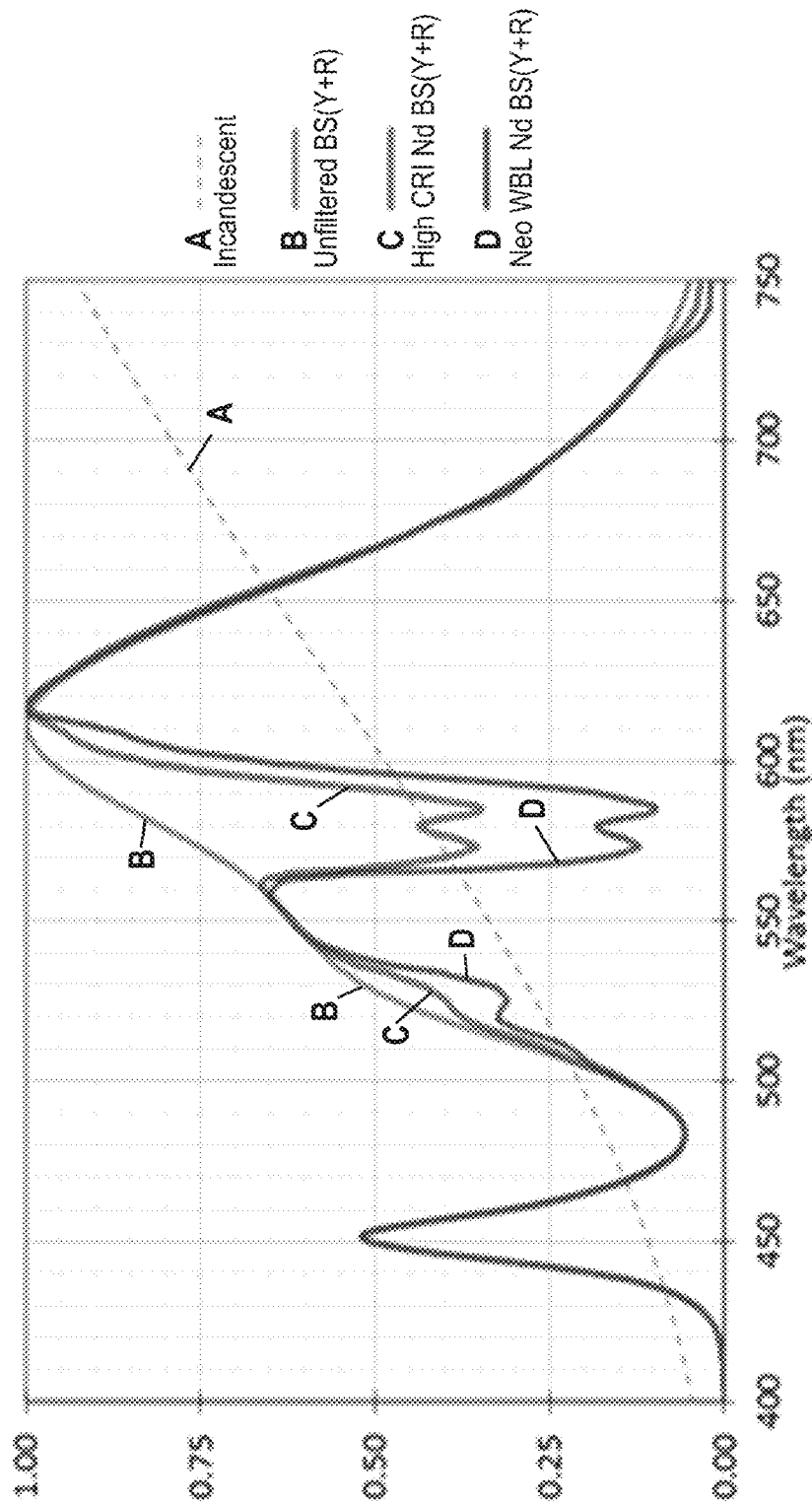
FIG._13

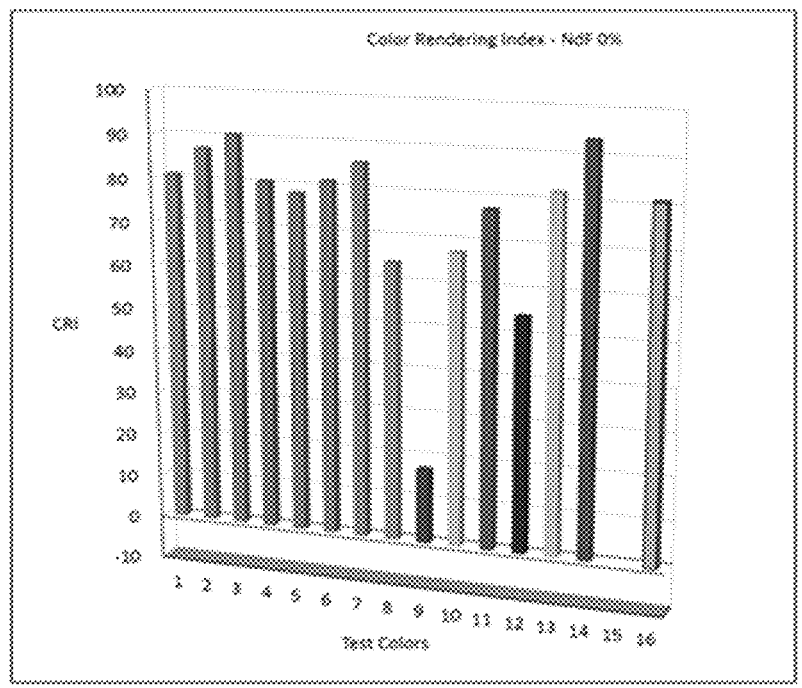
FIG._14A
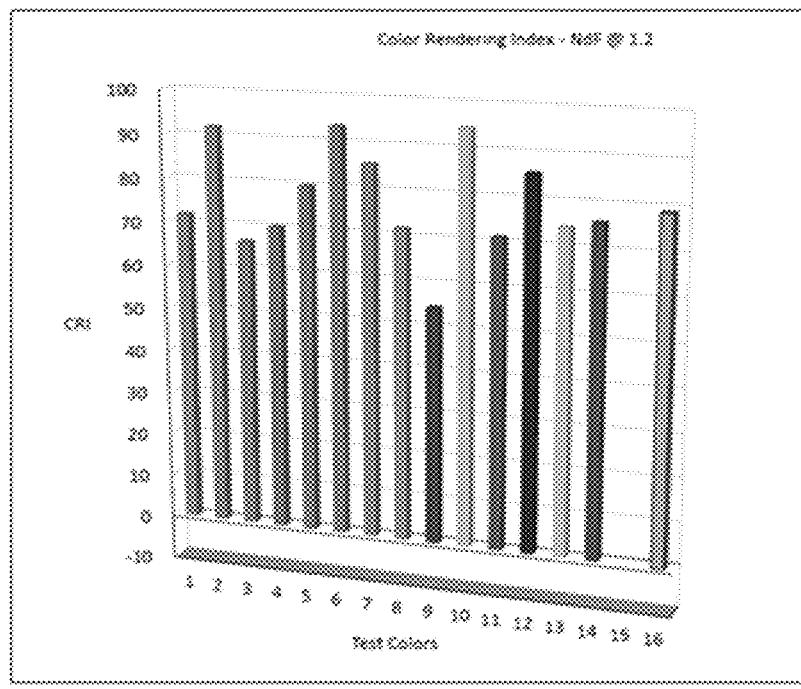
FIG._14B

FIG. 15A

| | x | y | u' | v' | nm (dom) | Arb. Units | CCT | CRI Ra | R9 | GAI | CQS | S/P ratio | LPW | du v' BBL/DLL | duv |
|---|---|---|---|---|---|---|---|---|---|---|---|---|---|---|---|
| LED1 | Orange 606 dm | 0.6668 | 0.3329 | 0.4712 | 0.5292 | 610.4 | 3.48 | | | | | | | | |
| Phosphor | P1LuGaAG 4 | 0.3213 | 0.5551 | 0.1423 | 0.5544 | 551.8 | 1.54 | | | | | | | | |
| LED2 | XPH 450 dm | 0.9000 | 0.1554 | 0.0215 | 0.2109 | 452.1 | 0.9 | | | | | | | | |
| Combined | | 0.3881 | 0.3457 | | | | | 3511 | 80 | 65 | 100 | 90 | 1.88 | 97.8 | 0.024 | -0.017 |

FIG. 16A

| | x | y | u' | v' | nm (dom) | Arb. Units | CCT | CRI Ra | R9 | GAI | CQS | S/P ratio | LPW | du v' BBL/DLL | duv |
|---|---|---|---|---|---|---|---|---|---|---|---|---|---|---|---|
| LED1 | Cred 617 dm | 0.6836 | 0.3152 | 0.5050 | 0.5238 | 616.9 | 1.2882 | | | | | | | | |
| Phosphor | NYAG7 | 0.4299 | 0.5508 | 0.1866 | 0.5665 | 568.9 | 1.0271 | | | | | | | | |
| LED2 | XPH 455 dm | 0.1531 | 0.0246 | 0.2048 | 0.0741 | 454.5 | 0.4792 | | | | | | | | |
| Combined | | 0.4211 | 0.3713 | 0.2547 | 0.5053 | | | 2999 | 91 | 83 | 83 | 84 | 1.24 | 96.2 | 0.017 | -0.011 |

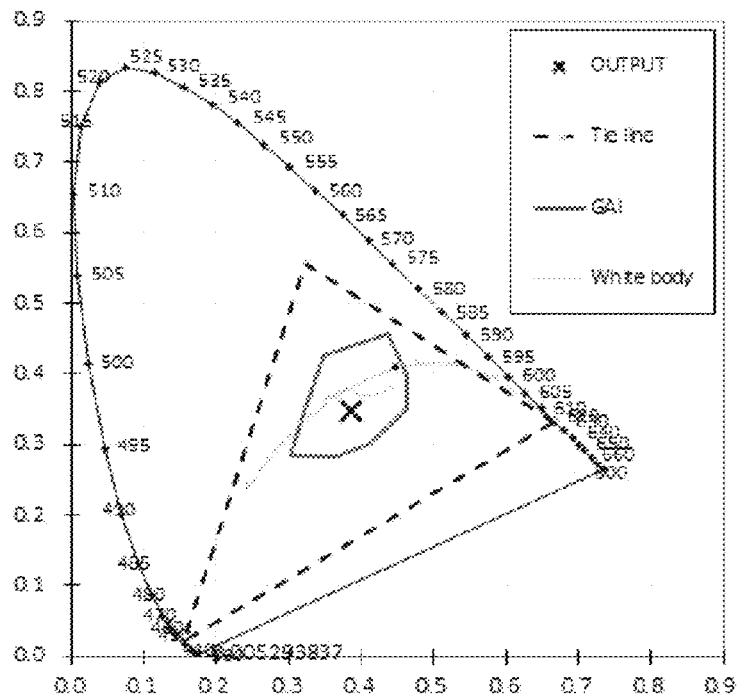
FIG._15B
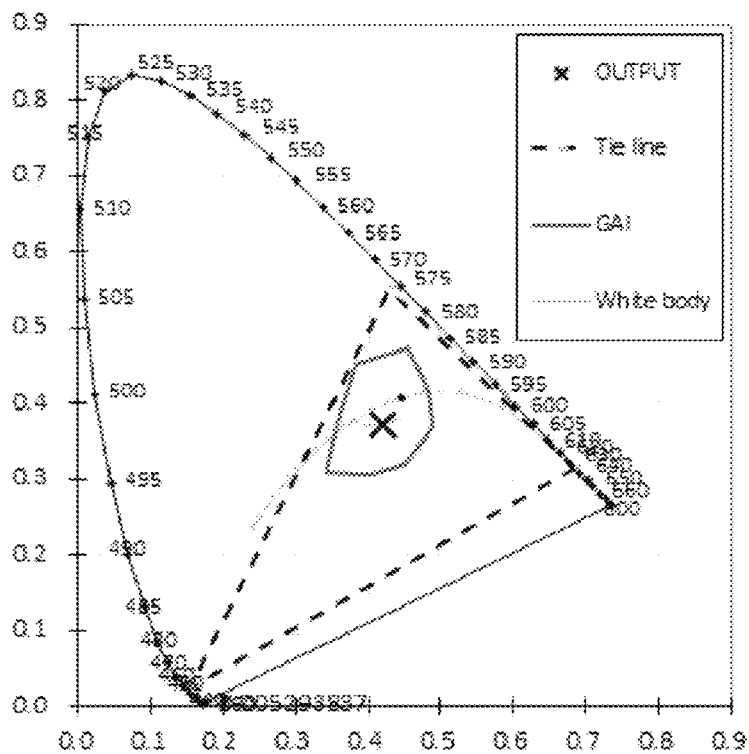
FIG._16B

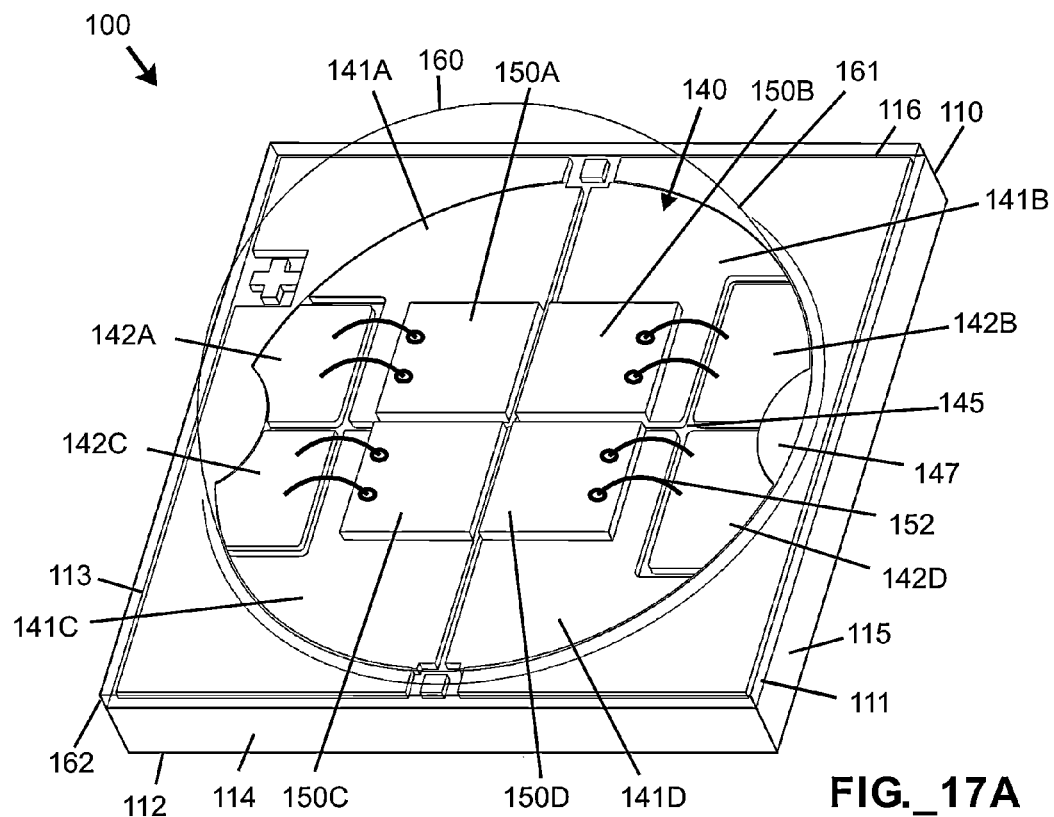
FIG._17A
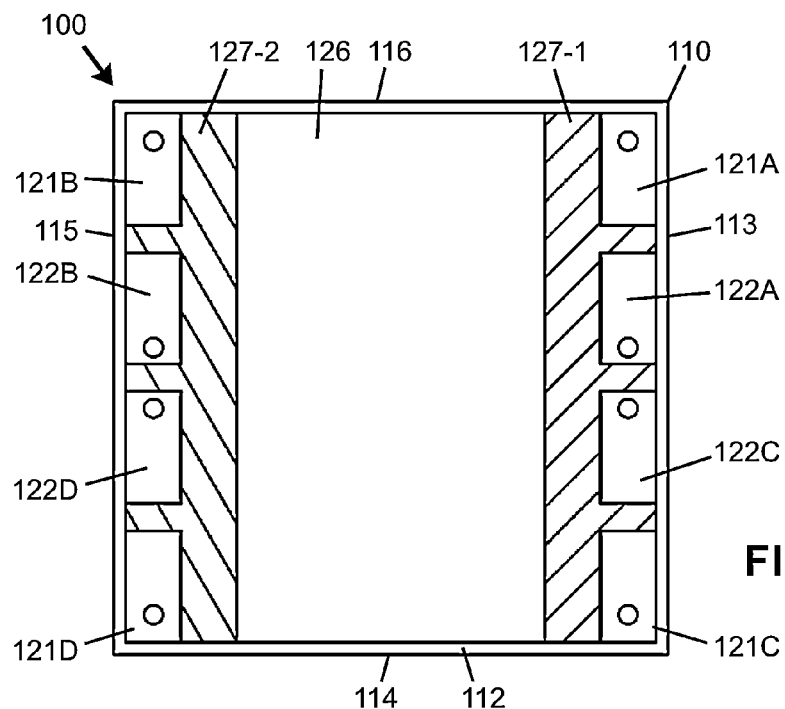
FIG._17B

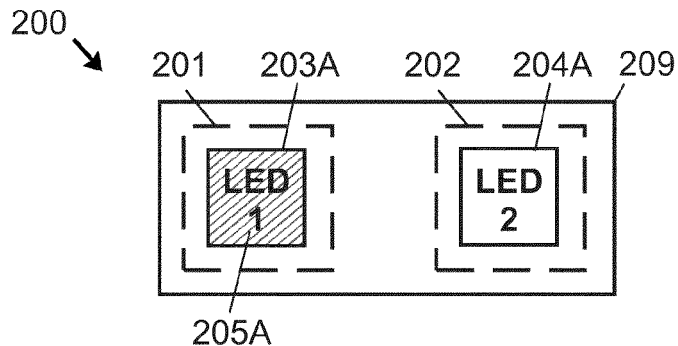
FIG._18A
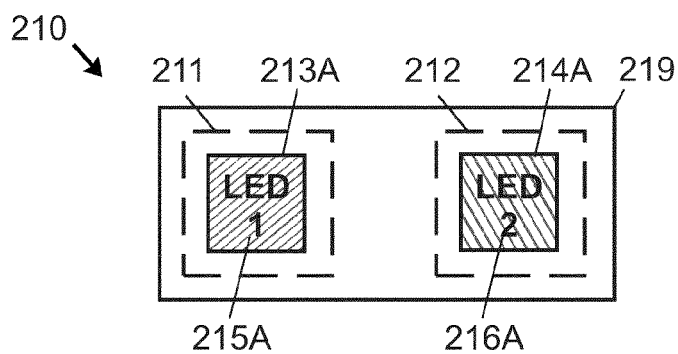
FIG._18B
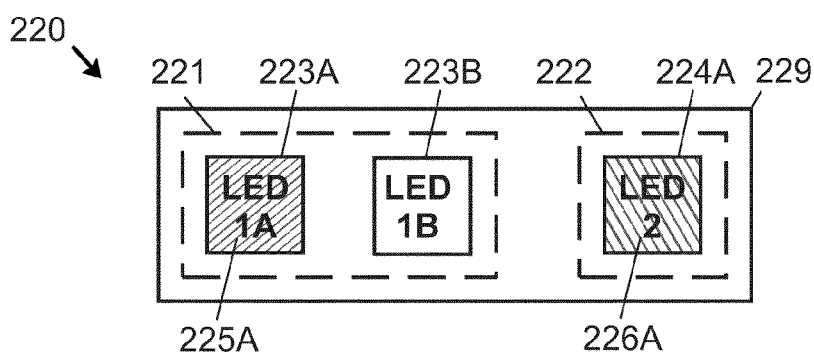
FIG._18C
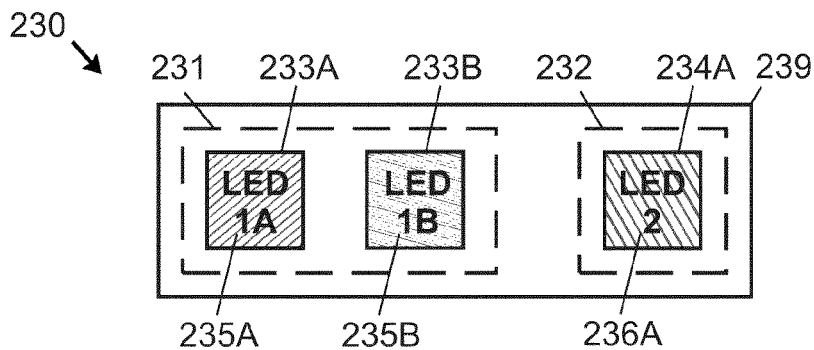
FIG._18D

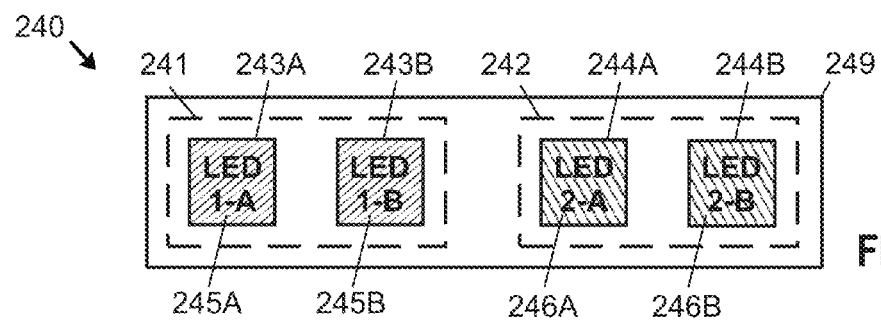
FIG._18E
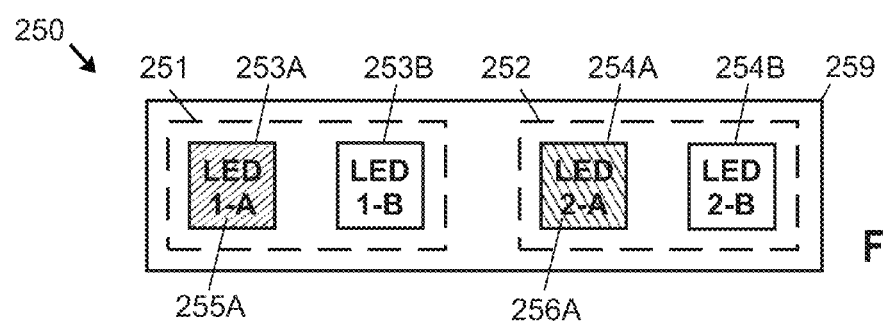
FIG._18F
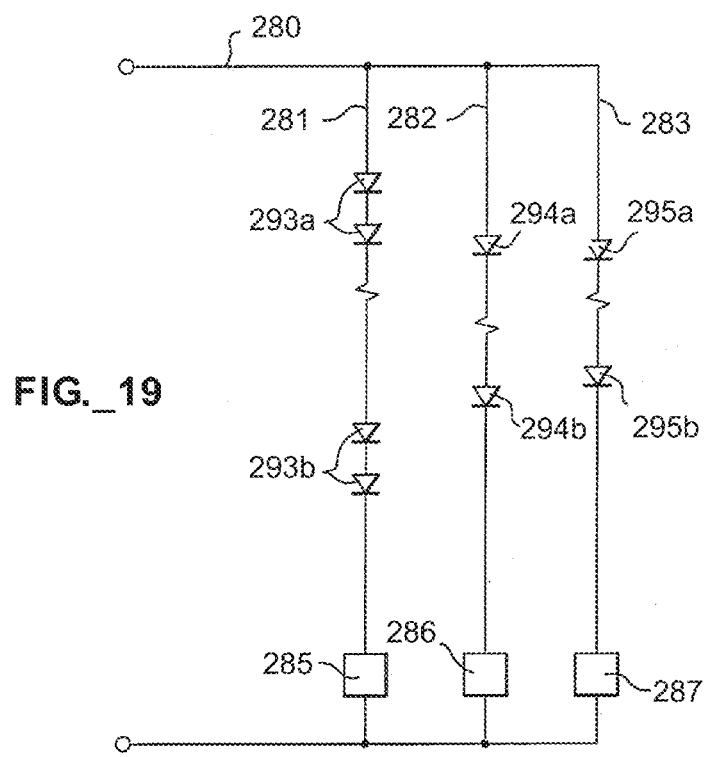
FIG._19

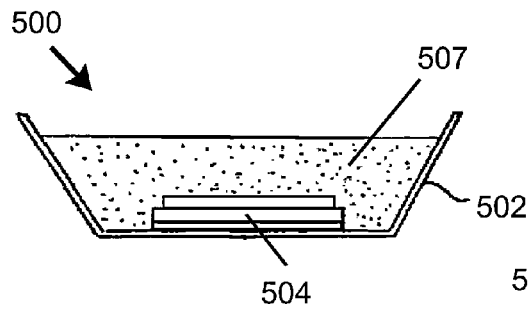
FIG._22A
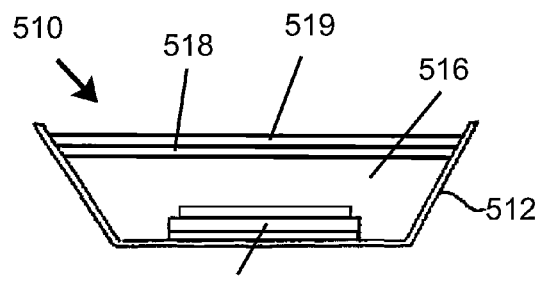
FIG._22B
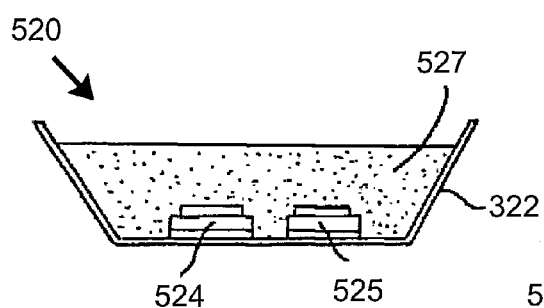
FIG._22C
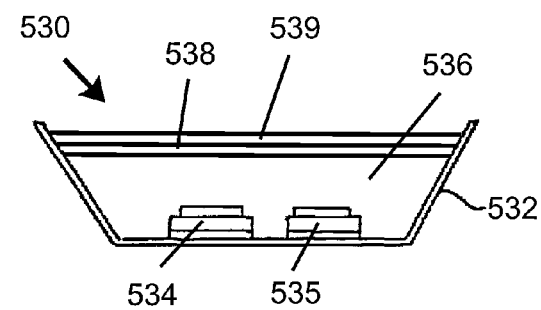
FIG._22D
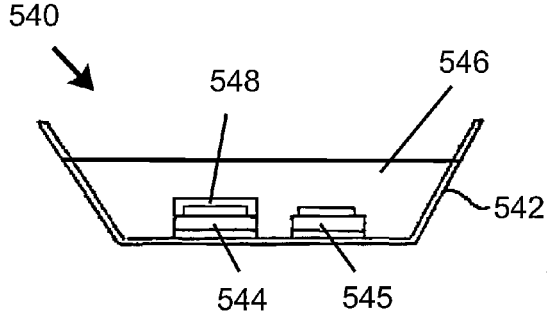
FIG._22E
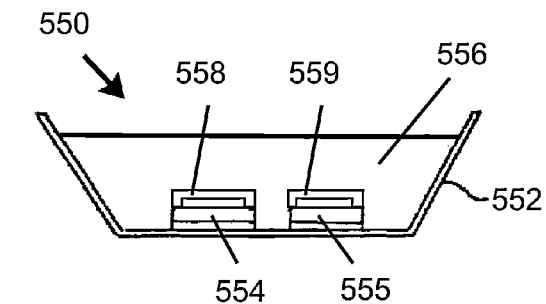
FIG._22F

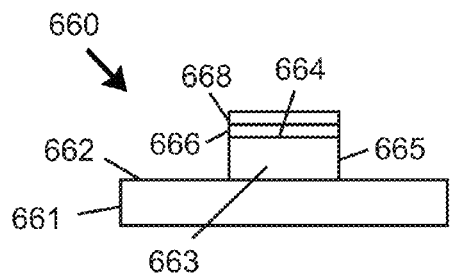
FIG._23A
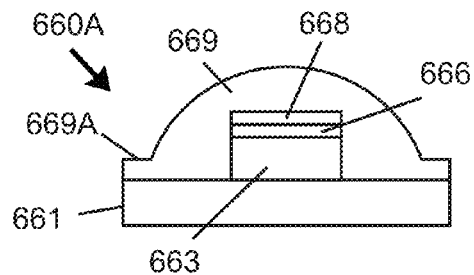
FIG._23B
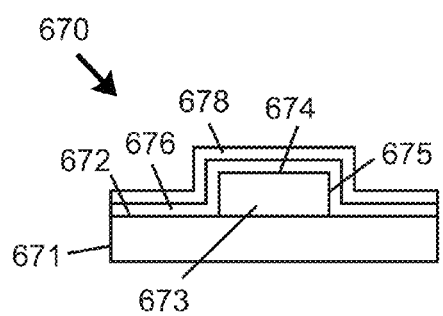
FIG._23C
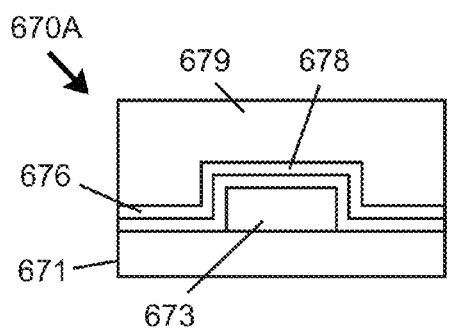
FIG._23D
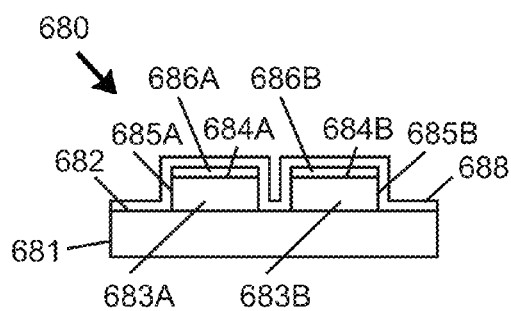
FIG._23E
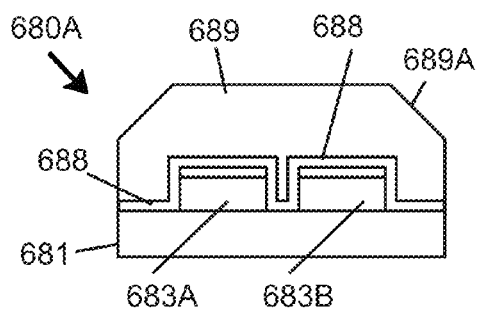
FIG._23F

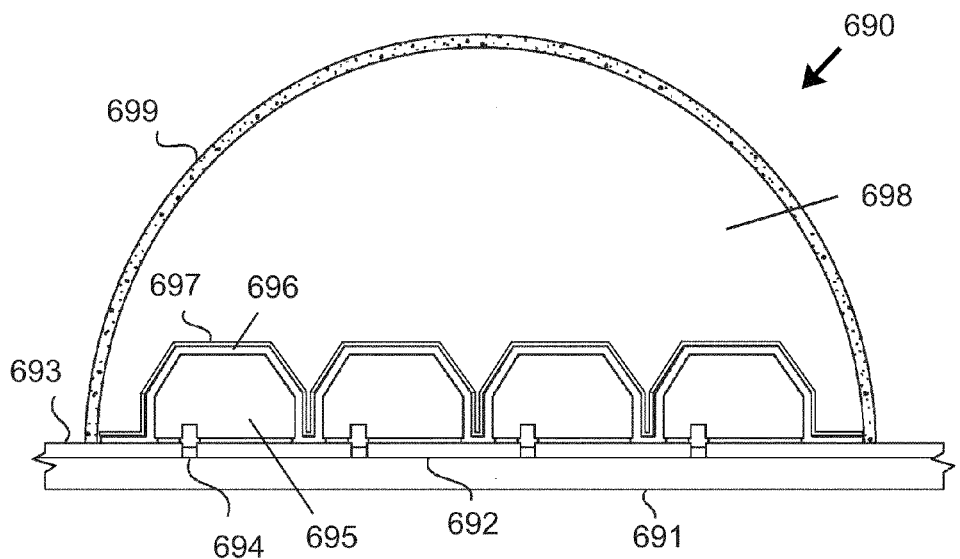
FIG._24
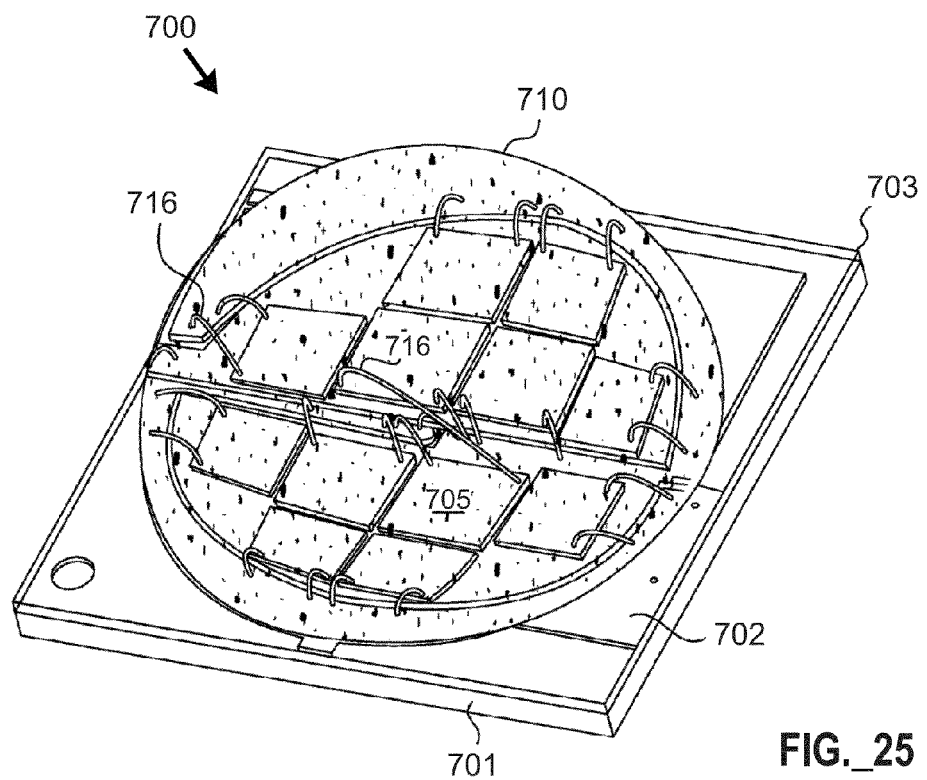
FIG._25

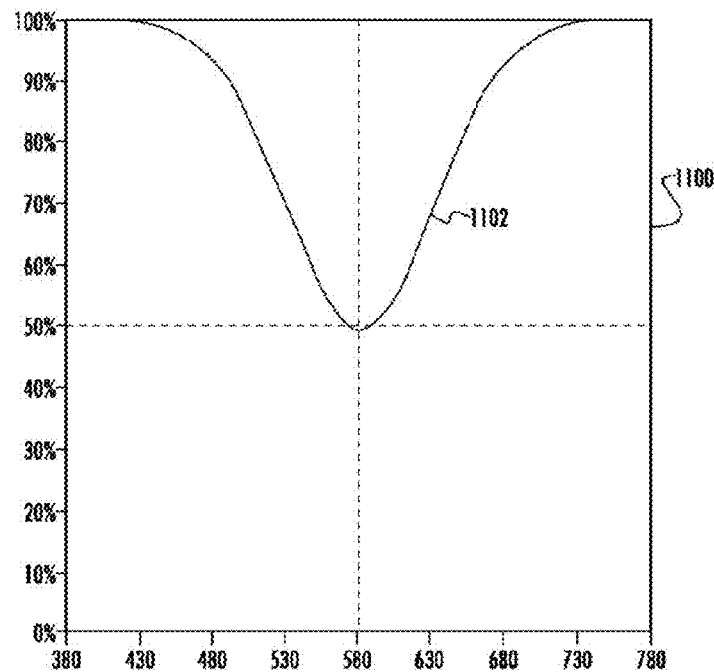
FIG._32
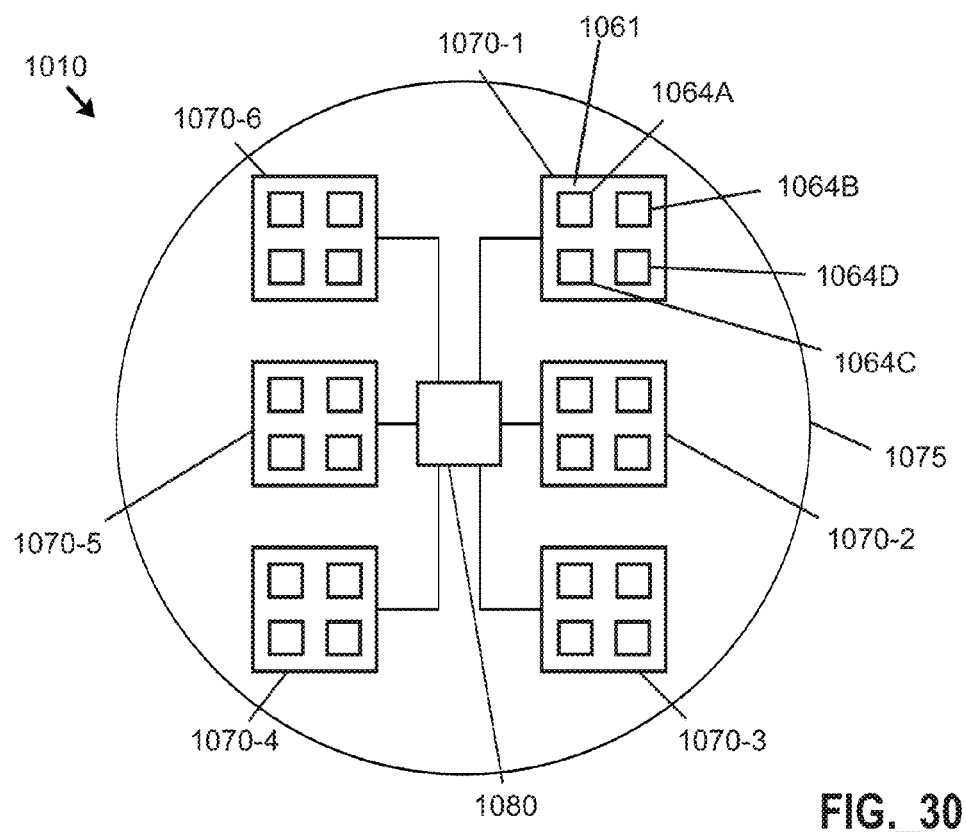
FIG._30

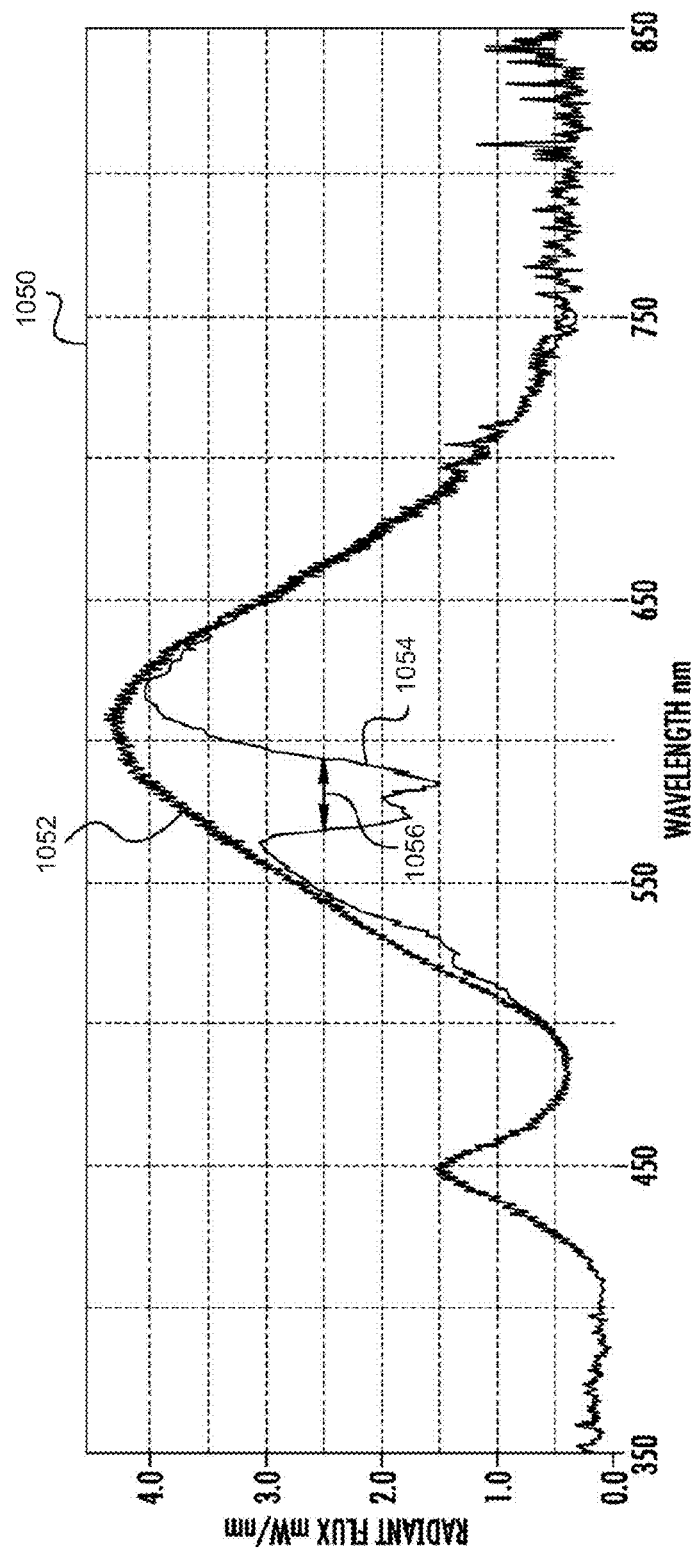
FIG._31

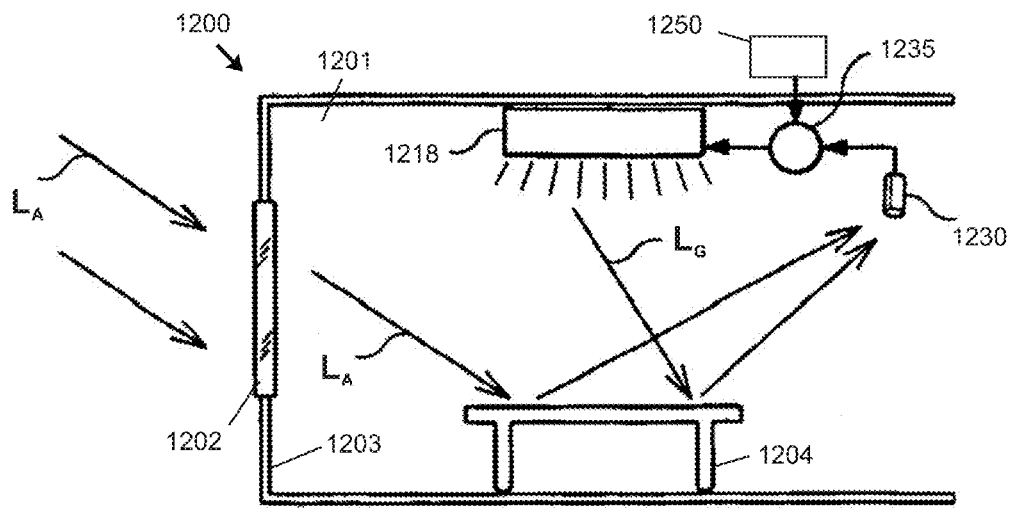
FIG._33
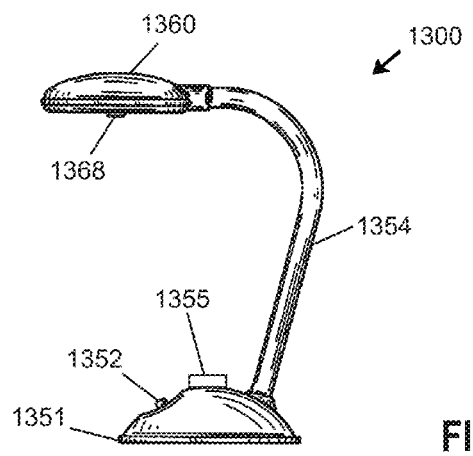
FIG._34

LIGHTING DEVICES WITH VARIABLE GAMUT

TECHNICAL FIELD

Subject matter herein relates to lighting devices, including solid state lighting device which may include electrically activated solid state light emitters optionally arranged to stimulate emissions of one or more lumiphors, and relates to associated methods of making and using such lighting devices.

BACKGROUND

Solid state emitters such as LEDs or lasers may be used to provide white light (e.g., perceived as being white or near-white), and are increasingly attractive as potential replacements for white incandescent lamps. Solid state emitters may include lumiphoric materials (also known as lumiphors) that absorb a portion of emissions having a first peak wavelength emitted by the emitter and re-emit light having a second peak wavelength that differs from the first peak wavelength. Phosphors, scintillators, and lumiphoric inks are common lumiphoric materials. Light perceived as white or near-white may be generated by a combination of red, green, and blue ("RGB") emitters, or, alternatively, by combined emissions of a blue light emitting diode ("LED") and a lumiphor such as a yellow phosphor (e.g., YAG:Ce or Ce:YAG). In the latter case, a portion of the blue LED emissions pass through the phosphor, while another portion of the blue emissions is downconverted to yellow, and the blue and yellow light in combination are perceived as white. White light may also be produced by stimulating phosphors or dyes of multiple colors with a violet or ultraviolet (UV) LED source.

It is known to enclose an LED chip in a package to provide environmental and/or mechanical protection, color selection, light focusing and other functions. A LED package also includes electrical leads, contacts, and/or traces for electrically connecting the LED package to an external circuit. A conventional LED package 20 is illustrated in FIG. 1, including one or more LED chips 22 mounted over a carrier such as a printed circuit board (PCB) carrier, substrate or submount 23, which may include ceramic material. The package 20 may include one or more LED chips 22 of any suitable spectral output (e.g., ultraviolet, blue, green, red, white (e.g., blue LED chip arranged to stimulate emissions of phosphor material) and/or other colors). A reflector 24 may be mounted on the submount 23 (e.g., with solder or epoxy) to surround the LED chip(s) 22, reflect light emitted by the LED chips 22 away from the package 20, and also provide mechanical protection to the LED chips 22. One or more wirebond connections 21 may be made between ohmic contacts on the LED chips 22 and electrical traces 25A, 25B on the submount 23. The LED chips 22 are covered with a transparent encapsulant 26, which may provide environmental and mechanical protection to the chips while also acting as a lens.

Emissions of a blue LED in combination with a yellow or green lumiphoric material may be near-white in character and referred to as "blue-shifted yellow" ("BSY") light or "blue-shifted green" ("BSG") light. Addition of red spectral output from a red-emitting LED (to yield a "BSY+R" device) or from a red lumiphoric material (to yield a "BS(Y+R)" device) may be used to increase the warmth of the aggregated light output and better approximate light produced by incandescent lamps.

Quality artificial lighting generally attempts to emulate the characteristics of natural light. Natural light sources include daylight with a relatively high color temperature (e.g., ~5000K) and incandescent lamps with a lower color temperature (e.g., ~2800K).

Color reproduction is commonly measured using Color Rendering Index (CRI) or average Color Rendering Index (CRI Ra). To calculate CRI, the color appearance of 14 reflective samples is simulated when illuminated by a reference radiator (illuminant) and the test source. The general or average color rendering index CRI Ra is a modified average utilizing the first eight indices, all of which have low to moderate chromatic saturation. (R9 is one of six saturated test colors not used in calculating CRI, with R9 embodying a large red content.) CRI and CRI Ra are used to determine how closely an artificial light source matches the color rendering of a natural light source at the same correlated color temperature. Daylight has a high CRI Ra (approximately 100), with incandescent bulbs also being relatively close (CRI Ra greater than 95), and fluorescent lighting being less accurate (with typical CRI Ra values of approximately 70-80).

CRI Ra (or CRI) alone is not a satisfactory measure of the benefit of a light source, since it confers little ability to predict color discrimination (i.e., to perceive subtle difference in hue) or color preference. There appears to be a natural human attraction to brighter color. Daylight provides a spectrum of light that allows the human eye to perceive bright and vivid colors, which allows objects to be distinguished even with subtle color shade differences. Accordingly, it is generally recognized that daylight is the "best" light for emphasizing and distinguishing color. The ability of human vision to differentiate color is different under correlated color temperature conditions providing the same CRI Ra. Such differentiation is proportional to the gamut of the illuminating light.

Gamut area of a light source can be calculated as the area enclosed within a polygon defined by the chromaticities in CIE 1976 u'v' color space of the eight color chips used to calculate CRI Ra when illuminated by a test light source. Gamut area index (GAI) is a convenient way of characterizing in chromaticity space how saturated the illumination makes objects appear—with a larger GAI making object colors appear more saturated. GAI is a relative number whereby an imaginary equal-energy spectrum (wherein radiant power is equal at all wavelengths) is scored as 100. GAI for a test source is determined by comparing color space area of the light being tested to the color space area produced by the imaginary or theoretical equal-energy spectrum (EES) source. Unlike CRI Ra (or CRI), which has a maximum value of 100, GAI can exceed 100, meaning that some sources saturate colors more than an equal-energy source serves to saturate color.

It is found that typical blackbody-like light sources and typical daylight-like light sources have different gamut areas. Low correlated color temperature (CCT) sources (e.g., incandescent emitters) have a gamut area index of approximately 50% (i.e., about half the gamut area of the EES source). Sources with higher CCT values have a larger GAI. For example, a very bluish light with a CCT of 10,000K may have a GAI of 140%.

Another way of characterizing how saturated an illuminant makes objects appear is relative gamut area, or $Q_g$, which is the area formed by the (a*, b*) coordinates of the 15 test-color samples in CIELAB normalized by the gamut area of a reference illuminant at the same CCT and multiplied by 100. Like GAI, $Q_g$ values can exceed 100. Because of chromatic adaptation, and because CCT is selected to set the overall color tone of an environment as part of the lighting design process, variable-reference measures such as $Q_g$ may be especially relevant to applied lighting design. If the relative gamut is greater than that of the reference, and illuminance is lower than that provided by daylight, then an increase in preference and discrimination might be expected relative to the reference at that same CCT. Conversely, if the relative gamut is smaller than that of the reference, then a decrease in preference and discrimination might be expected relative to the reference at the same CCT.

The reference spectra used in color rendering index calculations were chosen as ideal illumination sources defined in terms of their color temperature. As a heated object becomes incandescent, it first glows reddish, then yellowish, then white, and finally bluish. Thus, apparent colors of incandescing materials are directly related to their actual temperature (in Kelvin (K). Practical materials that incandesce are said to have correlated color temperature (CCT) values that are directly related to color temperatures of blackbody sources. CCT is intended to characterize the apparent "tint" of the illumination (e.g., warm or cool) produced by an electric light source. Certain implicit assumptions are embedded in this CCT designation—such as the assumption that chromaticities along the line of blackbody radiation are perceived as 'white', and that a CCT designation for a manufactured light source implies consistency in chromaticities of all sources having that designation. Recent research suggests, however, that most sources with chromaticities along the line of blackbody radiation do not appear "white"; rather, such sources provide illumination with discernible tint. An empirically established line of minimum tint in CIE 1931 (x,y) chromaticity space for CCTs between 2700K and 6500K is shown in FIG. 2 Researchers have determined that a majority of people prefer sources of illumination on this "white body line" (i.e., line of minimum tint) more than those of the same CCT line of blackbody radiation. (See, e.g., Rea, M. S. and Freyssinier, J. P.: White lighting for residential applications, Light Res. Tech., 45(3), pp. 331-344 (2013).) As shown in FIG. 2, at CCT values below about 4000K, the "white body line" (WBL) is below the blackbody curve, whereas at higher CCT values, the WBL is above the blackbody curve.

Rea and Freyssinier have proposed that lighting could be generally improved by ensuring that its CRI Ra value is at least 80 while its GAI is in a range of from 80 to 100 (i.e., from 80% to 100% of an equal energy spectrum).

Characteristics including CCT, CRI Ra, GAI, CIE 1931 (x,y) coordinates, luminous efficacy (lm/W), and scotopic/photopic (S/P) ratios for eighteen different light sources are tabulated in FIG. 3A, and chromaticities for selected sources of the foregoing eighteen light sources are plotted in FIG. 3B together with the blackbody curve and the WBL (line of minimum tint). (Source: "Value Metrics for Better Lighting," Rea, Mark S., et al., 2013, pp. 54 & 63, SPIE Press (Bellingham, Wash., US), ISBN 978-0-8194-9322-4.) As indicated in FIG. 3A, the ability of artificial lights to accurately illuminate color objects varies enormously by type. Solid state emitters such as LEDs in combination with lumiphors create white light by mixing relatively narrow wavelength bands together with spectral gaps between peaks of LEDs and/or lumiphors. The resulting light may be under-saturated with certain colors of the spectrum or oversaturated with certain colors. One way to alleviate oversaturation with respect to certain portions of the visible spectrum and thereby improve CRI includes notch filtering of LED lighting systems with an optical element (e.g., incorporating a rare earth compound such as neodymium oxide, or a color pigment) that filters light emissions so that light passing through or reflected by the optical element exhibits a spectral notch, as disclosed in U.S. Patent Application Publication No. 2013/0170199 A2 entitled "LED lighting using spectral notching" (which is hereby incorporated by reference herein). Such publication discloses that CRI and GAI values of LED light sources can be improved through use of notch filtering, such as to increase CRI from 84 to 90, and to increase GAI from 50 to 58. Alternatively, careful selection of materials used in LED lighting devices may permit attainment of CRI Ra values of 90 to 95 or more—see, e.g., U.S. Pat. No. 7,213,940, which is hereby incorporated by reference.

Usage of notch filtered light sources (such as widely available General Electric Reveal® incandescent light bulbs) or unfiltered light sources may be a matter of personal preference. Although a majority of viewers may subjectively prefer notch filtered light sources over unfiltered sources for general interior illumination, a minority of viewers may not. Additionally, such preference may depend on the object(s) or surfaces to be illuminated, and/or the presence or absence of natural light such as may enter an interior space through one or more windows at certain times of day. It can be challenging to accommodate viewer-dependent and/or context-dependent preferences when selecting artificial light sources.

The art continues to seek improved solid state lighting devices providing desirable illumination characteristics and capable of overcome challenges associated with conventional lighting devices.

SUMMARY

The present disclosure relates in various aspects to lighting devices including multiple electrically activated emitters arranged to be operated in multiple operating states arranged to produce different gamut area index (GAI) values (e.g., differing by at least 10%, by at least 15%, or another threshold disclosed herein) or relative gamut ($Q_g$) values (e.g., differing by at least 5%, by at least 10%, by at least 15%, or another threshold disclosed herein), preferably in conjunction with a small (e.g., preferably imperceptible) change in color point and/or luminous flux. A first emitter or emitter group (arranged to produce a mixture of light including a first color point) and a second emitter or emitter group (arranged to produce a mixture of light including a second color point) may be separately arranged to produce white light with different gamut areas and/or relative gamut values. First and second color points satisfy one or more of the following: proximity of no more than seven MacAdam ellipses on a CIE 1931 chromaticity diagram; color point difference corresponding to a Delta u'v' value of no greater than 0.01 on a CIE 1976 chromaticity diagram; correlated color temperature difference of no greater than 2%; and luminous flux difference of no greater than 2%. In certain aspects, the electrically activated emitters may include solid state emitters such as light emitting diodes, optionally arranged to stimulate emissions of one or more lumiphoric materials. A control circuit may be arranged to adjust operation of one or more emitters of a plurality of emitters to move between two operating states of a lighting device, in order to vary gamut of emissions of the lighting device. Such adjustment of operation may be responsive to a user input element and/or a sensor. In other words, at least one of a user input element and a sensor may be arranged to adjust operation of at least one of a first and a second electrically activated emitter to move between at least two operating states. One or more aggregate color points of an adjustable gamut lighting device may be on or proximate to the blackbody locus or the white body line (or line or minimum tint). At least one color point may include a desired color rendering value (e.g., CRI Ra of at least 50, at least 80, or another value disclosed herein). At least one color point may include a GAI (or $Q_g$) value in a range of from 80 to 100, optionally in combination with a CRI Ra value of at least 80. First and second color points may preferably be in a desirable range of from 2,500K to 5,000K, from 2,700K to 4,000K, or some other range described herein. At least one operating state may be arranged to provide a luminous efficacy of at least 60 lumens per watt, and/or a luminous flux of at least 500 lumens. An adjustable gamut lighting device may preferably be devoid of any non-lumiphor-converted electrically activated solid state blue light emitter.

In one aspect, a lighting device includes: a first electrically activated emitter; a second electrically activated emitter; and a control circuit configured to adjust operation of the first and second electrically activated emitter to move between at least two operating states; wherein a first operating state of the at least two operating states generates a combination of light exiting the lighting device that was emitted by the first electrically activated emitter and the second electrically activated emitter that produces, in the absence of any additional light, first operating state aggregated light emissions having a first gamut area index (GAI) value; wherein a second operating state of the at least two operating states generates a combination of light exiting the lighting device that was emitted by the first electrically activated emitter and the second electrically activated emitter that produces, in the absence of any additional light, second operating state aggregated light emissions having a second GAI value; wherein the second GAI value differs from the first GAI value by at least 10%; and wherein the first operating state aggregated light emissions produce, in the absence of any additional light, emissions including a first color point, and the second operating state aggregated light emissions produce, in the absence of any additional light, emissions including a second color point, and wherein, when plotted on a CIE 1976 u'-v' chromaticity diagram, the first color point and the second color point differ from one another by a Delta u'v' value of no greater than 0.01.

In another aspect, a solid state lighting device includes a plurality of electrically activated solid state emitters and a control circuit configured to adjust operation of the plurality of electrically activated solid state emitters to move between at least two operating states, wherein: a first operating state produces first operating state aggregated light emissions including a first gamut area index (GAI) value; a second first operating state produces second operating state aggregated light emissions including a second gamut area index (GAI) value; the second GAI value differs from the first GAI value by at least 10%; and a first color point generated by the first operating state aggregated light emissions differs from a second color point generated by the second operating state aggregated light emissions by no more than seven MacAdam ellipses on a 1931 CIE Chromaticity Diagram.

In certain aspects, gamut area index (GAI) values and comparisons stated herein may be replaced with relative gamut ($Q_g$).

In another aspect, the present disclosure relates to a method comprising illuminating an object, a space, or an environment, utilizing a solid state lighting device as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the present disclosure will be more fully apparent from the ensuing disclosure and appended claims.

BRIEF DESCRIPTION OF THE DRAWINGS

FIG. 1 is a side cross-sectional view of a first conventional light emitting diode package.

FIG. 2 is an excerpt of a CIE 1931 chromaticity diagram showing the blackbody locus and including a line of minimum tint (or "white body line") extending between CCT values of from 2700K to 6500K.

FIG. 3A is a chart including CCT, CRI Ra, GAI, CIE 1931 (x,y) coordinates, luminous efficacy (lm/W), and scotopic/photopic (S/P) ratios for eighteen different light sources.

FIG. 3B is an excerpt of a CIE 1931 chromaticity diagram showing the blackbody locus, the line of minimum tint (or "white body line") extending between CCT values from 2700K to 6500K, and (x,y) coordinate plots for selected sources of the eighteen light sources listed in FIG. 3A.

FIG. 4 is an excerpt of a CIE 1931 chromaticity diagram showing the blackbody locus, and showing a line of minimum tint approximated by straight line segments extending between six points.

FIG. 5 embodies a black and white CIE 1976 (u'v') chromaticity diagram as modified to include regions with identification of respective colors.

FIG. 6 is an excerpt of a CIE 1976 chromaticity diagram illustrating the blackbody locus (BBL) (also known as the Planckian locus) and a closed dash-line shape embodying potential color points to be output by a lighting device as disclosed herein, with the dash-line shape embodying a region defined by a CCT value in a range of from 2,500K to 10,000K, and spanning a Planckian offset Delta u'v' range (i.e., distance between a point of interest on a CIE 1976 chromaticity diagram and the nearest point on the Planckian locus (e.g., at the same correlated color temperature)) of from negative 0.01 to negative 0.02.

FIG. 7A is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of nine zones with different ranges of gamut area index (GAI) obtained by modeling a first exemplary lighting device including a blue LED (452 nm peak wavelength) arranged to stimulate emissions of a yellow (YAG 108) phosphor, in combination with an orange-red LED (619 nm dominant wavelength).

FIG. 7B is an excerpt of a CIE 1931 chromaticity diagram showing the blackbody locus, the line of minimum tint (or "white body line") extending between CCT values from 2700K to 6500K, periodic color temperature lines intersecting the blackbody or Planckian locus, and plots of ten zones with different ranges of color rendering index (CRI Ra) obtained by modeling the same lighting device according to FIG. 7A.

FIG. 8C is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of eight zones with different ranges of scotopic/photopic (S/P) ratio obtained by modeling the same lighting device according to FIGS. 8A-8B.

Figure 9B:
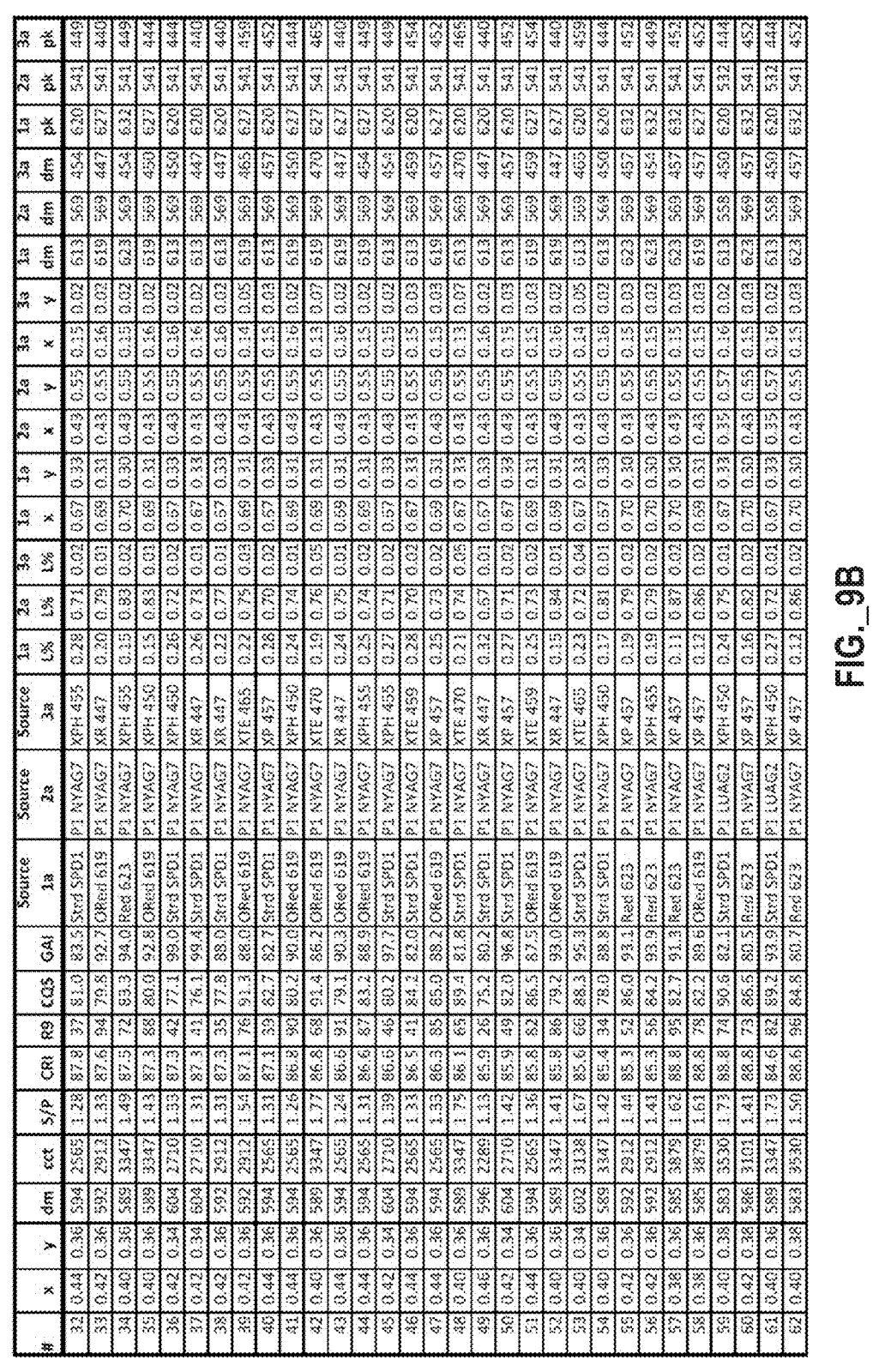
Figure 9E:
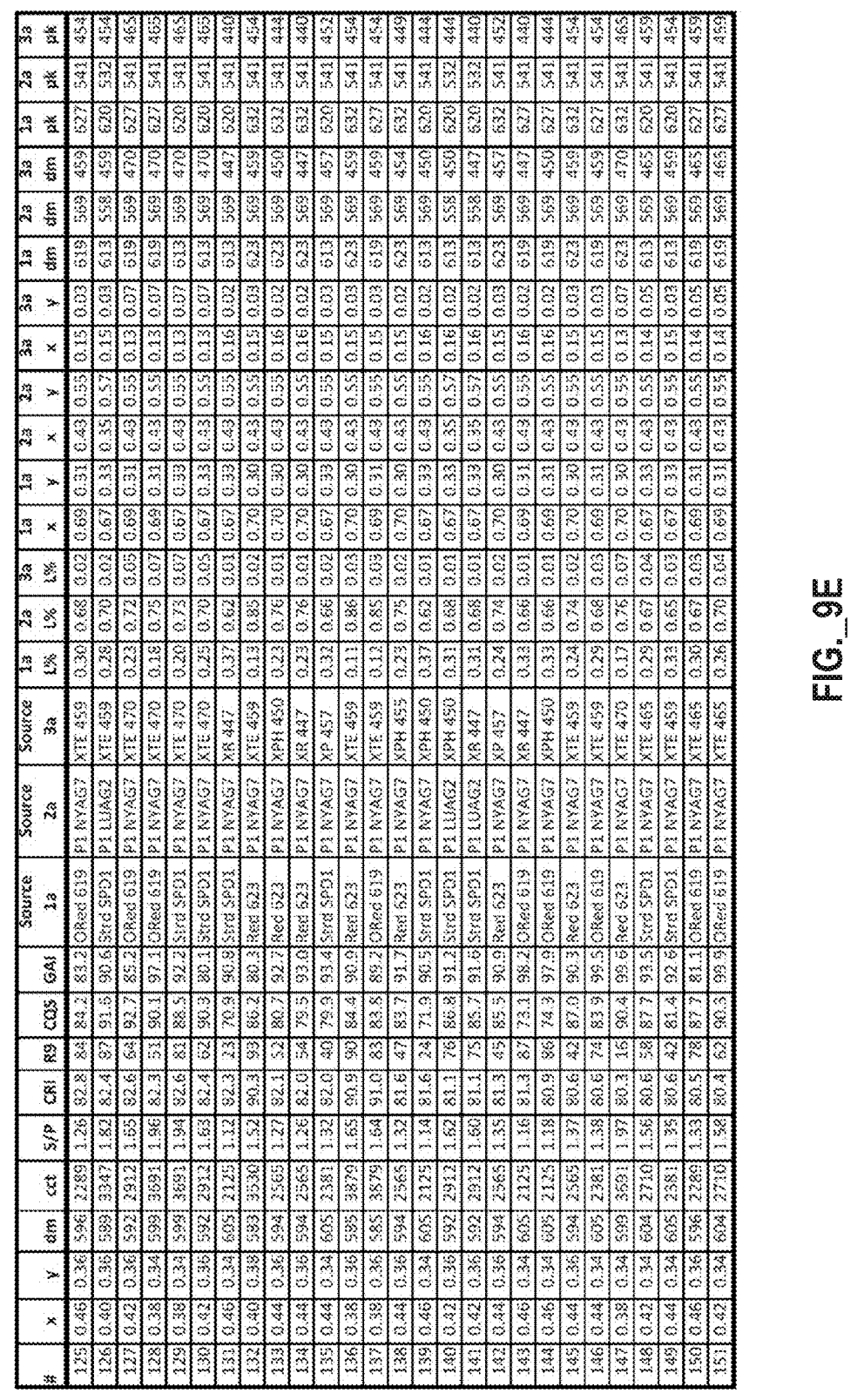

FIGS. 9A-9E in combination embody a table providing numerical results for modeling of 151 solid state lighting devices each including an orange or red LED (source 1a), a yellow or yellow/green phosphor (source 2a), and a blue LED (source 3a), including device number, CIE 1931 x,y coordinates of combined emissions, dominant LED wavelength (dm), correlated color temperature (cct), S/P ratio, CRI Ra, R9 color rendering, color quality scale (CQS), gamut area index (GAI), source identifiers, lumen percentage for each individual source, CIE 1931 x,y coordinates for each individual source, dominant wavelength (dm) for each individual source, and peak wavelength (pk) for each individual source.

FIG. 10 is a table providing GAI, CRI Ra, R9 rendering, LEP luminous efficacy (optical), S/P ratio, lumens per watt, filter lumen loss percentage, Du'v' (distance from BBL in 1976 CIE color space), and neodymium filter density values for four light sources.

FIG. 11 is a GAI as a function of filter density, with an overlaid plot of CRI Ra, for the three solid state light sources summarized in FIG. 10.

FIG. 12 illustrates gamut area and color point for each of the four light sources characterized in FIG. 10, superimposed with an excerpt of the 1931 CIE chromaticity diagram including the blackbody locus and the line of minimum tint (white body line).

FIG. 13 illustrates spectral output (relative intensity) versus wavelength for the four light sources characterized in FIG. 10, showing the effect of increased neodymium filter concentration on spectral output.

FIG. 14A is a bar chart representing CRI values including results for 14 color chips and the composite CRI Ra value for the second (i.e., unfiltered solid state) light source characterized in FIG. 10.

FIG. 14B is a bar chart representing CRI values including results for 14 color chips and the composite CRI Ra value for the fourth (i.e., Neo WBL neodymium filtered) solid state light source characterized in FIG. 10.

FIG. 15A is a table including numerical results for modeling of a solid state lighting device including an orange (606 nm dominant wavelength) LED, a blue (450 nm dominant wavelength) LED, and a green phosphor (P1LuGaAg 4 with 551.8 nm dominant wavelength), yielding composite emissions with a CCT of 3511 K, a CRI Ra value of 80, and a GAI value of 100.

FIG. 15B is an excerpt of a CIE 1931 chromaticity diagram showing the blackbody locus, a portion of the line of minimum tint (or white body line), and the following items for the LEDs and phosphor of FIG. 15A: tie lines, gamut area, and composite color point.

FIG. 16A is a table including numerical results for modeling of a solid state lighting device including an orange-red (617 nm dominant wavelength) LED, a blue (455 nm dominant wavelength) LED, and a yellow-green phosphor (NYAG 7 with 568.9 nm dominant wavelength), yielding composite emissions with a CCT of 2999K, a CRI Ra value of 91, and a GAI value of 83.

FIG. 16B is an excerpt of a CIE 1931 chromaticity diagram showing the blackbody locus, a portion of the line of minimum tint (or white body line), and the following items for the LEDs and phosphor of FIG. 16A: tie lines, gamut area, and composite color point.

FIG. 17A is a top perspective view of a solid state emitter package including four solid state emitter chips arranged over a substrate, covered with a hemispherical lens, and connected to electrical traces via wirebonds.

FIG. 17B is a bottom plan view of the solid state emitter package of FIG. 17A including four anodes and four cathodes arranged along opposing sides of a substrate, and including a thermally conductive contact pad arranged between the anodes and cathodes.

FIG. 18A is a schematic view of a first lighting device including first and second solid state emitters (e.g., including LEDs) arranged on a single submount or substrate.

FIG. 18B is a schematic view of a second lighting device including first and second solid state emitters arranged on a single submount or substrate.

FIG. 18C is a schematic view of a third lighting device including a pair of solid state emitters arranged in a first mounting region and another solid state emitter arranged in a second mounting region, all arranged on a single submount or substrate.

FIG. 18D is a schematic view of a fourth lighting device including a pair of solid state emitters arranged in a first mounting region and another solid state emitter arranged in a second mounting region, all arranged on a single submount or substrate.

FIG. 18E is a schematic view of a fifth lighting device including a first pair of solid state emitters arranged in a first mounting region and another pair of solid state emitters arranged in a second mounting region, all arranged on a single submount or substrate.

FIG. 18F is a schematic view of a sixth lighting device including a first pair of solid state emitters arranged in a first mounting region and another pair of solid state emitters arranged in a second mounting region, all arranged on a single submount or substrate.

FIG. 19 illustrates a portion of a first control circuit arranged to control multiple strings of solid state emitters (e.g., LEDs).

FIG. 22A is a side cross-sectional schematic view of a portion of a solid state lighting device including an electrically activated solid state light emitter (e.g., LED) and at least one lumiphor dispersed in an encapsulant material disposed over the solid state light emitter.

FIG. 22B is a side cross-sectional schematic view of a portion of a solid state lighting device including an electrically activated solid state light emitter (e.g., LED) and at least one lumiphor arranged in one or more layers spatially separated from the solid state light emitter.

FIG. 22C is a side cross-sectional schematic view of a portion of a solid state lighting device including multiple electrically activated solid state light emitters (e.g., LEDs) and at least one lumiphor dispersed in an encapsulant material disposed over the multiple solid state light emitters.

FIG. 22D is a side cross-sectional schematic view of a portion of a solid state lighting device including multiple solid state light emitters (e.g., LEDs) and at least one lumiphor arranged in one or more layers spatially separated from the multiple solid state light emitters.

FIG. 22E is a side cross-sectional schematic view of a portion of a solid state lighting device including multiple solid state light emitters (e.g., LEDs), with at least one solid state light emitter having a lumiphor material individually applied or coated over at least one surface of the solid state light emitter.

FIG. 22F is a side cross-sectional schematic view of a portion of a solid state lighting device including multiple solid state light emitters (e.g., LEDs), with multiple solid state light emitters each having a lumiphor material individually applied or coated over at least one surface of the respective emitter.

FIG. 23A is a side cross-sectional schematic view of at least a portion of a solid state light emitting device including a solid state emitter chip arranged over a package mount, with a top surface of the emitter chip being covered with a wavelength conversion material and a filtering (e.g., notch filtering) material.

FIG. 23B is a side cross-sectional schematic view of at least a portion of a solid state light emitting device including the device of FIG. 23A with addition of a curved (e.g., hemispherical) lens.

FIG. 23C is a side cross-sectional schematic view of at least a portion of a solid state light emitting device including a solid state emitter chip arranged over a package mount, with top and side surfaces of the emitter chip and an upper surface of the package mount being covered with a wavelength conversion material and a filtering material.

FIG. 23D is a side cross-sectional schematic view of at least a portion of a solid state light emitting device including the device of FIG. 23C with addition of a lens having a substantially rectangular cross-sectional shape.

FIG. 23E is a side cross-sectional schematic view of at least a portion of a solid state light emitting device including a solid state emitter chip arranged over a package mount, with a top surface of the emitter chip being covered with a wavelength conversion material and a filtering material, and with side surfaces of the emitter chip and an upper surface of the package mount being covered with a filtering material.

FIG. 23F is a side cross-sectional schematic view of at least a portion of a solid state light emitting device including the device of FIG. 23E with addition of a lens having a beveled upper edge with a non-rectangular (polygonal) cross-sectional shape.

FIG. 24 is a side cross-sectional view of at least a portion of a solid state lighting emitting device including multiple solid state emitter chips coated with multiple functional materials and arranged under a hemispherical optical element.

FIG. 25 is a perspective view of at least a portion of a solid state emitter package including multiple solid state emitter chips coated with one or more functional materials, with the chips coupled to electrical traces via wirebonds and arranged under a hemispherical optical element.

FIG. 30 is a simplified plan view of a light emitting apparatus including multiple LED components and at least one control circuit.

FIG. 31 is a plot of radiant flux versus wavelength for a spectral output of a solid state light emitting device with superimposed notch filtered spectral output.

FIG. 32 depicts spectral transmittance versus wavelength for an illustrative color pigment material.

FIG. 33 is a schematic diagram of an interior space with a light fixture including multiple electrically activated emitters as described herein arranged to illuminate an indoor environment.

FIG. 34 is a side elevation view of a desk lamp or table lamp including multiple electrically activated emitters as described herein.

DETAILED DESCRIPTION

Figure 8A:
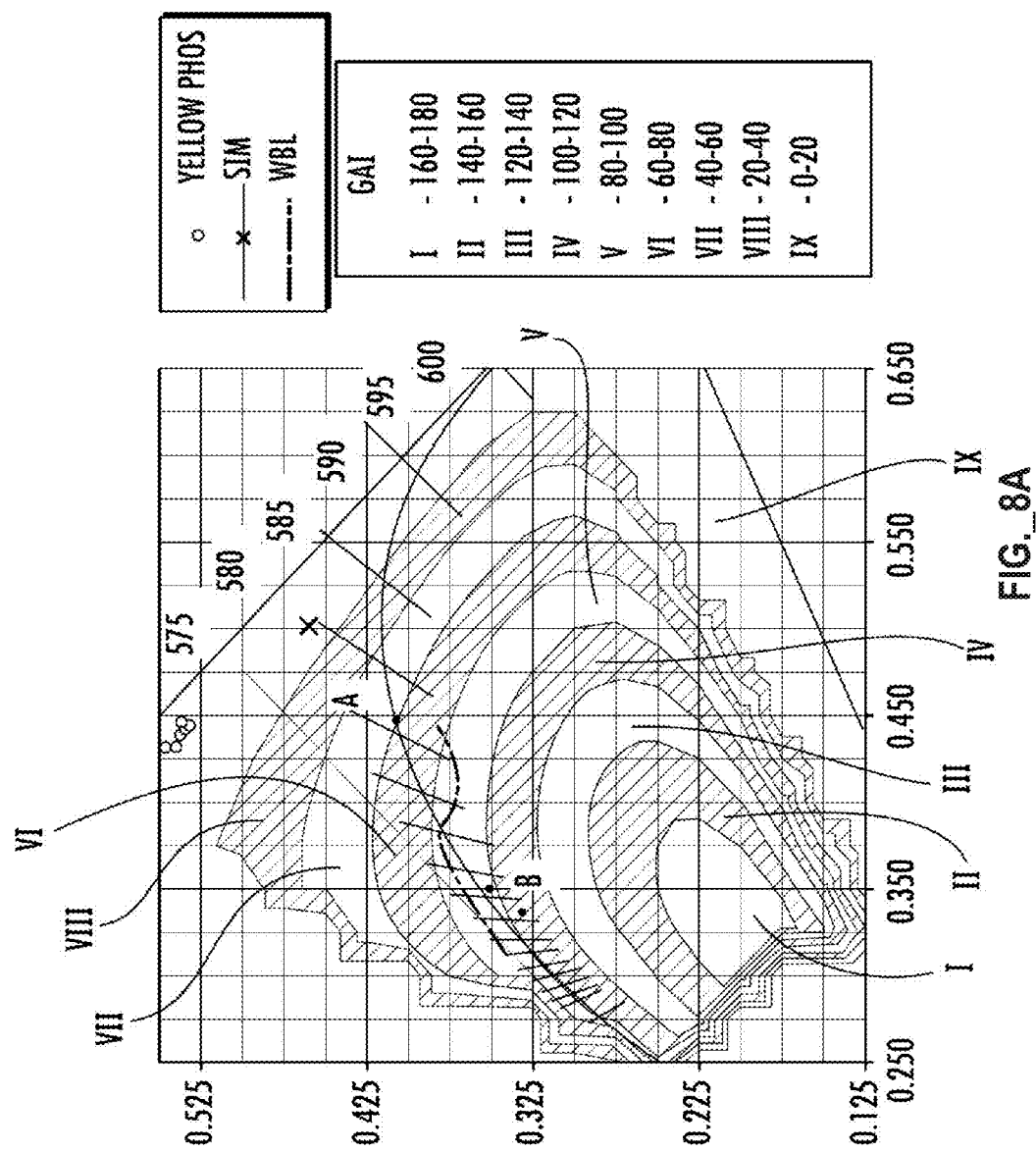
FIG. 8A is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of nine zones with different ranges of gamut area index (GAI) obtained by modeling a second exemplary lighting device including a blue LED (452 nm peak wavelength) arranged to stimulate emissions of a yellow/green (LuAg) phosphor, in combination with an orange-red (619 nm dominant wavelength) LED.

As noted previously, the art continues to seek solid state lighting devices providing desirable illumination characteristics. Subject matter disclosed herein relates to lighting devices arranged to provide variable (e.g., adjustable) gamut area index values.

Various embodiments disclosed herein relate to lighting devices including multiple electrically activated emitters arranged to be operated in multiple operating states arranged to produce different gamut area index (GAI) values (e.g., differing by at least 10%, by at least 15%, or another threshold disclosed herein) or relative gamut ($Q_g$) values (e.g., differing by at least 5%, by at least 10%, by at least 15%, or another threshold disclosed herein), preferably in conjunction with a small (i.e., imperceptible) change in color point and/or luminous flux. First and second color points may satisfy one or more of the following conditions: proximity of no more than 7 MacAdam ellipses on a CIE 1931 chromaticity diagram; color point difference corresponding to a Delta u'v' value of no greater than 0.01 on a CIE 1976 chromaticity diagram; and correlated color temperature difference of no greater than 2%; luminous flux difference of no greater than 2%. By changing gamut area without dramatically changing color point and/or luminous flux, vibrancy of color of illuminated surfaces and objects may be adjusted, but in a manner whereby a viewer is may not be alerted (e.g., through perceptible change in color point) to the adjustment. As observed by at least some viewers in selected contexts, one or more adjustable color points corresponding to one or more of the multiple operating states may be provide light of aesthetically pleasing character or improved performance relative to conventional light sources.

In certain embodiments, relative gamut ($Q_g$) may be substituted for gamut area index (GAI).

In certain embodiments, one or more electrically activated emitters may include solid state emitters such as (but not limited to) light emitting diodes. In certain embodiments, one or more electrically activated emitters may be arranged to stimulate emissions of one or more lumiphoric materials. In certain embodiments, multiple different electrically activated solid state light emitters wherein one is arranged to stimulate lumiphor emissions (but in the absence of any lumiphor-converted blue electrically activated emitter, such as a LED arranged to generate emissions having a dominant wavelength in a range of from 430 nm to 480 nm with at least one lumiphor positioned to receive at least a portion of the LED emissions) may be used to attain a color point as specified herein. In certain embodiments, multiple lumiphor-converted electrically activated solid state emitters may be used to attain one or more color points as specified herein.

In certain embodiments, at least one control circuit may be arranged to adjust operation of one or more emitters of a plurality of emitters to move between two operating states of a lighting device, in order to vary gamut of emissions of the lighting device. In certain embodiments, such adjustment of operation may be responsive to a user input element and/or a sensor. In certain embodiments, one or more aggregate color points of an adjustable gamut lighting device may be on or proximate to the blackbody locus or the white body line. In certain embodiments, at least one color point may include a desired color rendering value (e.g., CRI Ra of at least 50, at least 80, or another value disclosed herein). In certain embodiments, at least one color point may include a GAI value in a range of from 80 to 100, optionally in combination with a CRI Ra value of at least 80. In certain embodiments, first and second color points may preferably be in a desirable range of from 2,500K to 5,000K, from 2,700K to 4,000K, or some other range described herein. In certain embodiments, at least one operating state may be arranged to provide a luminous efficacy of at least 60 lumens per watt, and/or a luminous flux of at least 500 lumens.

Unless otherwise defined, terms used herein should be construed to have the same meaning as commonly understood by one of ordinary skill in the art to which the present disclosure belongs. It will be further understood that terms used herein should be interpreted as having a meaning that is consistent with their meaning in the context of this specification and the relevant art, and should not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Embodiments of the present disclosure are described herein with reference to cross-sectional, perspective, elevation, and/or plan view illustrations that are schematic illustrations of idealized embodiments of the present disclosure. Variations from the shapes of the illustrations as a result, for example, of manufacturing techniques and/or tolerances, are to be expected, such that embodiments of the present disclosure should not be construed as limited to particular shapes illustrated herein. The present disclosure may be embodied in different forms and should not be construed as limited to the specific embodiments set forth herein. In the drawings, the size and relative sizes of layers and regions may be exaggerated for clarity. In certain drawings, conventional features inherent to LED devices known in the art but not essential to the understanding of the present disclosure have been omitted to facilitate ease of explanation of the inventive subject matter.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "on", "above", "upper", "top", "lower", or "bottom" may be used herein to describe a relationship between one structure or portion to another structure or portion as illustrated in the figures, but it should be understood that such relative terms are intended to encompass different orientations of the device in addition to the orientation depicted in the figures. For example, if the device in the figures is turned over, structure or portion described as "above" other structures or portions would now be oriented "below" the other structures or portions.

The terms "solid state light emitter" or "solid state emitter" (which may be qualified as being "electrically activated") may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the present disclosure may include, but are not limited to, III-V nitride based LED chips or laser chips fabricated on a silicon, silicon carbide, sapphire, or III-V nitride growth substrate, including (for example) devices manufactured and sold by Cree, Inc. of Durham, N.C. Such LEDs and/or lasers may optionally be configured to operate such that light emission occurs through the substrate in a so-called "flip chip" orientation. Such LED and/or laser chips may also be devoid of growth substrates (e.g., following growth substrate removal).

LED chips useable with lighting devices as disclosed herein may include horizontal devices (with both electrical contacts on a same side of the LED) and/or vertical devices (with electrical contacts on opposite sides of the LED). A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or printed circuit board (PCB), and have a second terminal wire bonded to the carrier substrate, electrical element, or PCB. Although certain embodiments shown in the figures may be appropriate for use with vertical LEDs, it is to be appreciated that the present disclosure is not so limited, such that any combination of one or more of the following LED configurations may be used in a single solid state light emitting device: horizontal LED chips, horizontal flip LED chips, vertical LED chips, vertical flip LED chips, and/or combinations thereof, with conventional or reverse polarity. Examples of vertical and horizontal LED chip structures are discussed by way of example in U.S. Publication No. 2008/0258130 to Bergmann et al. and in U.S. Pat. No. 7,791,061 to Edmond et al. which are hereby incorporated by reference herein.

Solid state light emitters may be used individually or in groups to emit one or more beams to stimulate emissions of one or more lumiphoric materials (e.g., phosphors, scintillators, lumiphoric inks, quantum dots, day glow tapes, etc.) to generate light at one or more peak wavelength(s), or of at least one desired perceived color (including combinations of colors that may be perceived as white). Lumiphoric materials may be provided in the form of particles, films, or sheets.

Inclusion of lumiphoric (also called 'luminescent') materials in lighting devices as described herein may be accomplished by any suitable means, including: direct coating on solid state emitters, dispersal in encapsulant materials arranged to cover solid state emitters; coating on lumiphor support elements (e.g., by powder coating, inkjet printing, or the like); incorporation into diffusers or lenses; and the like. Examples of lumiphoric materials are disclosed, for example, in U.S. Pat. No. 6,600,175, U.S. Patent Application Publication No. 2009/0184616, and U.S. Patent Application Publication No. 2012/0306355, and methods for coating light emitting elements with phosphors are disclosed in U.S. Patent Application Publication No. 2008/0179611, with the foregoing publications being incorporated by reference. Other materials, such as light scattering elements (e.g., particles) and/or index matching materials, may be associated with a lumiphoric material-containing element or surface. One or more lumiphoric materials useable in devices as described herein may be down-converting or up-converting, or can include a combination of both types.

In certain embodiments, at least one lumiphoric material may be spatially segregated ("remote") from and arranged to receive emissions from at least one electrically activated solid state emitter, with such spatial separation reducing thermal coupling between a solid state emitter and lumiphoric material. In certain embodiments, a spatially segregated lumiphor may be arranged to fully cover one or more electrically activated emitters of a lighting device. In certain embodiments, a spatially segregated lumiphor may be arranged to cover only a portion or subset of one or more emitters electrically activated emitters.

In certain embodiments, at least one lumiphoric material may be arranged with a substantially constant thickness and/or concentration relative to different electrically activated emitters. In certain embodiments, one or more lumiphoric materials may be arranged with presence, thickness, and/or concentration that vary relative to different emitters. Multiple lumiphors (e.g., lumiphors of different compositions) may be applied with different concentrations or thicknesses relative to different electrically activated emitters. In one embodiment, lumiphor presence, composition, thickness and/or concentration may vary relative to multiple electrically activated emitters. In certain embodiment, at least one lumiphoric material may be applied to a solid state emitter or a lumiphoric material support surface by patterning, such may be aided by one or more masks.

Various substrates may be used as mounting elements on which, in which, or over which multiple solid state light emitters (e.g., emitter chips) may be arranged or supported (e.g., mounted). Exemplary substrates include printed circuit boards (including but not limited to metal core printed circuit boards, flexible circuit boards, dielectric laminates, and the like) having electrical traces arranged on one or multiple surfaces thereof. A substrate, mounting plate, or other support element may include a printed circuit board (PCB), a metal core printed circuit board (MCPCB), a flexible printed circuit board, a dielectric laminate (e.g., FR-4 boards as known in the art) or any suitable substrate for mounting LED chips and/or LED packages. In certain embodiments, at least a portion of a substrate may include a dielectric material to provide desired electrical isolation between electrical traces or components of multiple LED sets. In certain embodiments, a substrate can comprise ceramic such as alumina, aluminum nitride, silicon carbide, or a polymeric material such as polyimide, polyester, etc. In certain embodiments, a substrate can comprise a flexible circuit board or a circuit board with plastically deformable portions to allow the substrate to take a non-planar (e.g., bent) or curved shape allowing for directional light emission with LED chips of one or more LED components also being arranged in a non-planar manner.

In certain embodiments, one or more LED components can include one or more "chip-on-board" (COB) LED chips and/or packaged LED chips that can be electrically coupled or connected in series or parallel with one another and mounted on a portion of a substrate. In certain embodiments, COB LED chips can be mounted directly on portions of substrate without the need for additional packaging.

Certain embodiments may involve use of solid state emitter packages. A solid state emitter package may include at least one solid state emitter chip (more preferably multiple solid state emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be arranged to stimulate one or more lumiphoric materials, which may be coated on, arranged over, or otherwise disposed in light receiving relationship to one or more solid state emitters. At least one lumiphoric material may be arranged to receive emissions of at least some emitters of a plurality of solid state light emitters and responsively emit lumiphor emissions. A lens and/or encapsulant material, optionally including lumiphoric material, may be disposed over solid state emitters, lumiphoric materials, and/or lumiphor-containing layers in a solid state emitter package.

In certain embodiments, a light emitting apparatus as disclosed herein (whether or not including one or more LED packages) may include at least one of the following items arranged to receive light from multiple LEDs: a single leadframe arranged to conduct electrical power to the plurality of electrically activated solid state light emitters; a single reflector arranged to reflect at least a portion of light emanating from the plurality of electrically activated solid state light emitters; a single submount or mounting element supporting the plurality of electrically activated solid state light emitters; a single lens arranged to transmit at least a portion of light emanating from the plurality of electrically activated solid state light emitters; and a single diffuser arranged to diffuse at least a portion of light emanating from the plurality of electrically activated solid state light emitters. In certain embodiments, a light emitting apparatus including multiple LEDs may include at least one of the following items arranged to receive light from multiple LEDs: multiple lenses; multiple optical elements; and multiple reflectors. Examples of optical elements include, but are not limited to elements arranged to affect light mixing, focusing, collimation, dispersion, and/or beam shaping.

In certain embodiments, a package including multiple solid state emitters may include multiple die attach pads, with a single die attach pad supporting each separately controllable solid state emitter or each separately controllable group of solid state emitters. A package including multiple solid state emitters may include a single lens (e.g., a molded lens) arranged to transmit at least a portion of light emanating from each solid state emitter. In certain embodiments, a molded lens may be arranged in direct contact with LED chips, die attach pads, other electrical elements, and/or exposed insulating material along a top surface of a substrate comprising insulating material. In certain embodiments, a lens may be textured or faceted to improve light extraction, and/or a lens may contain or have coated thereon various materials such as lumiphors and/or scattering particles.

In certain embodiments, a package may include a molded lens arranged to transmit light emitted by multiple LEDs. As known in the art, a mold including one or more cavities can be arranged over a substrate (or a panel of substrate material, from which multiple substrates may be singulated by sawing or other means) and LED chips arranged thereon, with the mold comprising a lens material and/or encapsulant in liquid form. In certain embodiments, a lens may be formed of liquid curable silicone, and LED chips may be embedded in liquid silicone, which is subsequently cured to form one or more lenses. Alternatively, a lens may be pre-molded and then affixed (e.g., with adhesives, thermal bonding, or any other suitable joining method) to a subassembly including a substrate to which, or over which, multiple LED chips are mounted.

The expressions "lighting device," "light emitting device," and "light emitting apparatus" as used herein are not limited, except that such elements are capable of emitting light. That is, a lighting device or light emitting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, street lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting-work lights, etc., mirrors/vanity lighting, or any other light emitting devices. An illuminated area may include at least one of the foregoing items. In certain embodiments, lighting devices or light emitting apparatuses as disclosed herein may be self-ballasted. In certain embodiments, a light emitting apparatus may be embodied in a light fixture.

In preferred embodiments, a solid state lighting device is devoid of any incandescent light emitting element. In certain embodiments, a solid state lighting device lacks any "unconverted" blue-emitting solid state emitter not arranged to stimulate emissions of a lumiphoric material.

Methods include illuminating an object, a space, or an environment, utilizing one or more lighting devices or light emitting apparatuses as disclosed herein. In certain embodiments, a lighting apparatus as disclosed herein includes multiple LED components arranged in an array (e.g., a two-dimensional array).

In certain embodiments, lighting devices as disclosed herein may utilize a notch filtering material arranged to at least partially inhibit transmission of selected wavelengths of light. Such a filtering material may be used to affect (e.g., enhance) GAI and/or CRI Ra. The term "notch filtering material" refers to a material that affects passage of light to cause light exiting the material to exhibit a spectral notch. A spectral notch is a portion of the color spectrum where the light is attenuated, thus forming a "notch" when light intensity is plotted against wavelength. Examples of notch filtering materials include rare earth and lanthanide materials, such as lanthanum, cerium, praseodymium, neodymium, promethium, samarium, europium, gadolinium, terbium, dysprosium, holmium, erbium, thulium, ytterbium, lutetium, scandium, and yttrium, as well as oxides thereof (e.g., neodymium oxide). Different rare earth compounds may exhibit notch filtering characteristics of different wavelength ranges. For example, neodymium (or oxide thereof) when used as a filtering material may produce a spectral notch in the yellow range, whereas erbium (or oxide thereof) when used as a filtering material may produce a spectral notch in the cyan range. Additional notch filtering materials include color pigments. As with the use of rare earth compounds, the use of color pigments can impart notch filtering properties in either transmissive or reflective applications. In many instances, color pigments may provide softer spectral notch (with more gradually sloping wavelength attenuation) characteristics relative to other notch filtering materials. One example of a color pigment includes an ultramarine pigment based on $CoAl_2O_4$, providing peak attenuation at a wavelength of about 580 nm. A cobalt blue pigment of similar composition could also be used. Other color pigments based on $CuSO_4$ or $NiCl_2$ can also be used. A variety of natural and synthetic pigments are available and could be used as notch filtering materials according to certain embodiments disclosed herein. Notch filters may also be fabricated by depositing one or more dielectric layers (e.g., to form dielectric stacks) on substrates, such as filters commercially available from Thorlabs, Inc. (Newton, N.J., US) having the following center wavelengths (CWL) and full width at half maximum (FWHM) characteristics: CWL=488 nm, FWHM=15 nm; CWL=514 nm, FWHM=17 nm; CWL=533 nm, FWHM=17 nm; CWL=561 nm, FWHM=18 nm; CWL=594 nm, FWHM=23 nm; 633 nm, FWHM=25 nm; and CWL=658 nm, FWHM=26 nm.

In certain embodiments utilizing one or more notch filtering materials, a spectral notch provided by at least one filtering material may have a full width in a range of less than or equal to 40 nm, or less than or equal to 35 nm, or less than or equal to 30 nm, or less than or equal to 25 nm, or less than or equal to 20 nm, in each case corresponding to a half maximum relative reduction in light transmission. In certain embodiments utilizing one or more notch filtering materials, at least one filtering material may be arranged to filter light within (or overlapping) the yellow-green range or yellow range, such as to provide peak attenuation in a range of from 550 nm to 590 nm, or from 570 nm to 590 nm.

In embodiments utilizing notch filtering materials, such materials may be provided as microparticles or nanoparticles of any desired size, size distribution, and geometric shape. In certain embodiments, multiple notch filtering materials may be mixed and incorporated in a carrier material or binder, or multiple notch filtering materials may otherwise be used in combination (e.g., in sequential layers, with or without a binding medium) to provide multiple spectral notches. In certain embodiments, notch filtering materials may be arranged in or on an at least partially light-transmissive optical element or enclosure, which may serve as a lens and/or diffuser. Examples of desirable materials for carriers, binding media, enclosures, and/or optical elements include (but are not limited to) silicone, resin, epoxy, thermoplastic polycondensate, polymeric materials, and glass. In certain embodiments, such materials may be molded and/or cured together with at least one notch filtering material. In certain embodiments, a lighting device may include one or more transmissive optical elements and/or reflective optical elements incorporating at least one notch filtering material. For example, a so-called "troffer" style ceiling fixture may include a reflector that serves as an optical element, and may additionally include optical elements such as glass plates or lenses.

In certain embodiments utilizing notch filtering materials, at least one filtering material (e.g., notch filtering material) may be arranged with a substantially constant thickness and/or concentration relative to different electrically activated emitters (e.g., solid state emitters such as LEDs). In certain embodiments, one or more filtering materials may be arranged on or over at least one solid state emitter (optionally with an intervening lumiphoric material) with presence, composition, thickness, and/or concentration that vary relative to different emitters. Multiple filtering materials (e.g., filtering materials of different compositions and arranged to provide spectral notches at different wavelengths) may be applied to one or more electrically activated emitters. In certain embodiments, at least one filtering material may be applied over one or more solid state light emitters, or over a support surface (e.g., lens, diffuser, reflector, etc.) utilizing a patterning technique, such may be aided by one or more masks. In certain embodiments, one or more notch filtering materials may be integrated with or arranged in contact with one or more portions of a solid state emitter package.

In certain embodiments utilizing notch filtering materials, one or more notch filtering materials may be mixed with one or more other functional materials (e.g., lumiphoric materials, scattering materials, and the like) and preferably incorporated into a binder or other carrier medium. In certain embodiments, at least one filtering material may be arranged in or on a carrier arranged on or over a plurality of solid state light emitters.

In certain embodiments utilizing notch filtering materials, notch filtering materials may be arranged in or on a reflector, which may be either specularly reflective or diffusively reflective. Any suitable reflective material in the art may be used, including (but not limited to) MCPET (foamed white polyethylene terephthalate), and surfaces metalized with one or more metals such as (but not limited to) silver (e.g., a silvered surface). A preferred light-reflective material would be at least about 90% reflective, more preferably at least about 95% reflective, and still more preferably at least about 98-99% reflective of light of a desired wavelength range, such as one or more of visible light, ultraviolet light, and/or infrared light, or subsets thereof. In certain embodiments, at least one notch filtering material may be deposited on a surface of a reflector by spray coating, spin coating, sputtering, dipping, rolling, electrostatic deposition, or electrophoretic deposition. In certain embodiments, at least one notch filtering may be incorporated into a surface of a reflector via methods such as molding or sintering.

In certain embodiments utilizing notch filtering materials, one or more notch filtering materials may be coated or otherwise arranged on, over, or against at least one surface of one or more one solid state emitter chips. In certain embodiments, one or more notch filtering materials may be coated or otherwise arranged on, over, or against at least one surface of at least one lumiphoric material, wherein the at least one lumiphoric material may be arranged in direct contact with at least one surface of a solid state emitter chip, or may be arranged remotely from (i.e., spatially segregated from) at least one surface of a solid state emitter chip. In certain embodiments, one or more notch filtering materials may be conformally coated on the surface of at least one solid state emitter chip and/or lumiphoric material, wherein conformal coating in this regard refers to a coating that follows the shape and contour of at least one surface (or preferably multiple surfaces) of a chip with a substantially uniform thickness.

Parameters such as the type or composition of carrier or binding medium; the thickness, concentration, particle size, and particle size distribution of notch filtering material(s); and the presence, amount, and type of other trace substances accompanying one or notch filtering elements, may be adjusted to provide one or more spectral notches of desired width and/or depth.

As noted previously, one or more aggregate color points of an adjustable gamut lighting device may be on or proximate to (e.g., within 7 MacAdam ellipses, within 5 MacAdam ellipses, within 4 MacAdam ellipses, or within 2 MacAdam ellipses) the blackbody locus (or the Planckian locus) in certain embodiments. In certain embodiments, a first aggregate color point associated with a first operating state and a second color point associated with a second operating state may both be on or proximate to (e.g., 7 MacAdam ellipses, within 5 MacAdam ellipses, within 4 MacAdam ellipses, or within 2 MacAdam ellipses) of a Planckian locus definable on a CIE 1976 u'-v' chromaticity diagram. Any of the foregoing color points may be in one or more of the following CCT ranges: from 2,500K to 10,000K, from 2,500 to 4,000K, from 2,500K to 4,000K, from 2,500K to 3,500K, from 2,500K to 3,000K, from 2,700K to 5,000K, from 2,700K to 4,100K, from 2,700K to 4,000K, from 4,100K to 10,000K, from 4,100K to 8,000K, and from 4,100K to 6,500K.

In certain embodiments, one or more aggregate color points of an adjustable gamut lighting device may be on or proximate to (e.g., 7 MacAdam ellipses, within 5 MacAdam ellipses, within 4 MacAdam ellipses, or within 2 MacAdam ellipses) the white body line (a/k/a, the white body locus or line of minimum tint). The white body line may be approximated by a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808). Such segments are illustrated in FIG. 4 to form a composite white body line. In certain embodiments, a first aggregate color point associated with a first operating state and a second color point associated with a second operating state may both be on or proximate to (e.g., 7 MacAdam ellipses, within 5 MacAdam ellipses, within 4 MacAdam ellipses, or within 2 MacAdam ellipses) of the white body line. Any of the foregoing color points may be in one or more of the following CCT ranges: from 2,500K to 10,000K, from 2,500 to 4,000K, from 2,500K to 4,000K, from 2,500K to 3,500K, from 2,500K to 3,000K, from 2,700K to 5,000K, from 2,700K to 4,100K, from 2,700K to 4,000K, from 4,100K to 10,000K, from 4,100K to 8,000K, and from 4,100K to 6,500K.

In certain embodiments, at least one color point obtainable with at least one operating state of a variable gamut lighting device is non-coincident with the blackbody locus but is coincident with the white body line. In certain embodiments, the resulting color point is non-coincident with both the blackbody locus and the white body line.

In certain embodiments, multiple (e.g., first and second; first through third; first through fourth, or any other suitable number of) color points of an adjustable gamut light device provide small (e.g., preferably imperceptible) change in color point and/or luminous flux), such as by satisfying one, multiple, or all of the following conditions: proximity of no more than 7 (or no more than 5 or 4) MacAdam ellipses on a CIE 1931 chromaticity diagram; color point difference corresponding to a Delta u'v' value of no greater than 0.01 (or no greater than 0.007, or 0.005) on a CIE 1976 chromaticity diagram; correlated color temperature difference of no greater than 2%; and luminous flux difference of no greater than 2%. The term "Delta u'v'" in this context refers to a distance between two color points in the CIE 1976 color space.

In certain embodiments, the mixture of light generated by a lighting device according to at least one operating state (and preferably all operating states) has a luminous efficacy in at least one of the following lumens per watt ranges: at least 60, at least 80, at least 100, at least 120, or at least 140. In certain embodiments, the mixture of light generated by a lighting device according to at least one operating state (and preferably all operating states) has a GAI (or $Q_g$) value of at least 50 and a CRI Ra value of at least 50, with the foregoing ranges optionally being bounded by 70, 80, 90, or 100 at the upper end. In certain embodiments the mixture of light generated by a lighting device according to at least one operating state (and preferably all operating states) has a GAI (or $Q_g$) value in a range of from 80 to 100, in conjunction with a CRI Ra value of at least 80 (optionally bounded at the upper end by a CRI RA value of 90, 92, 94, or 96).

In certain embodiments, a lighting device may include a first electrically activated emitter; a second electrically activated emitter; and a control circuit configured to adjust operation of the first and second electrically activated emitter to move between at least two operating states; wherein a first operating state of the at least two operating states generates a combination of light exiting the lighting device that was emitted by the first electrically activated emitter and the second electrically activated emitter that produces, in the absence of any additional light, first operating state aggregated light emissions having a first gamut area index (GAI) value; wherein a second operating state of the at least two operating states generates a combination of light exiting the lighting device that was emitted by the first electrically activated emitter and the second electrically activated emitter that produces, in the absence of any additional light, second operating state aggregated light emissions having a second GAI value; wherein the second GAI value differs from the first GAI value by at least 10%; and wherein the first operating state aggregated light emissions produce, in the absence of any additional light, emissions including a first color point, and the second operating state aggregated light emissions produce, in the absence of any additional light, emissions including a second color point, and wherein, when plotted on a CIE 1976 u'-v' chromaticity diagram, the first color point and the second color point differ from one another by a Delta u'v' value of no greater than 0.01. In certain embodiments, relative gamut ($Q_g$) may be substituted for gamut area index (GAI). In such a case, a change of 5% of $Q_g$ is readily distinguishable. In certain embodiments, each of the first electrically activated emitter and the second electrically activated emitter may include a solid state light emitter (such as at least one LED). In certain embodiments, one or more of the first electrically activated emitter and the second electrically activated emitter (and optionally each of the foregoing emitters) may include at least one light emitting diode and at least one lumiphor arranged to receive and be stimulated by at least a portion of emissions of the at least one light emitting diode and responsively emit lumiphor emissions. In certain embodiments, one or more of the following conditions may be satisfied: the first color point and the second color point differ in correlated color temperature by an amount of no greater than 2% relative to one another; and the first operating state aggregated light emissions and the second operating state aggregated light emissions differ in luminous flux by an amount of no greater than 2%. In certain embodiments, the second GAI value may differ from the first GAI value by at least 15%, or by at least 20%. If $Q_g$ is substituted for GAI, then the second $Q_g$ value may differ from the first $Q_g$ value by at least 5%, by at least 10%, by at least 15%, by at least 20%, or some other threshold disclosed herein. In certain embodiments, one or more of the following conditions may be satisfied: at least one of the first operating state aggregated light emissions and the second operating state aggregated light emissions comprises a luminous efficacy of at least 60 lumens per watt, and each of the first operating state aggregated light emissions and the second operating state aggregated light emissions comprises a luminous flux of at least 500 lumens. In certain embodiments, at least one of the first color point and the second color point is on or proximate to the white body line, with such proximity as defined herein. In certain embodiments, at least one of the first color point and the second color point is on or proximate to the blackbody (Planckian) locus. In certain embodiments, at least one of the first color point and the second color point comprises a CRI Ra of at least 80, a GAI (or $Q_g$) value in a range of 80 to 800, or a CRI Ra value of at least 80 in conjunction with a GAI (or $Q_g$) value in a range of from 80 to 100. In certain embodiments, the foregoing conditions may be attained when each of the first color point and the second color point comprises a desired CCT, such as in a range of from 2,500K to 5,000K, or in a range of from 2,700K to 4,000K. In certain embodiments, a lighting device may be devoid of any lumiphor-converted blue electrically activated emitter (such as a LED arranged to generate emissions having a dominant wavelength in a range of from 430 nm to 480 nm with at least one lumiphor positioned to receive at least a portion of the LED emissions). In certain embodiments, the lighting device may embody a solid state emitter package and/or include one or more features associated with solid state packages disclosed herein. In certain embodiments, a light bulb or light fixture may comprise a lighting device as disclosed herein. In certain embodiments, a method comprises illuminating an object, a space, or an environment utilizing a lighting device as disclosed herein.

In certain embodiments, a solid state lighting device may include a plurality of electrically activated solid state emitters and a control circuit configured to adjust operation of the plurality of electrically activated solid state emitters to move between at least two operating states, wherein: a first operating state produces first operating state aggregated light emissions including a first gamut area index (GAI) or $Q_g$ value; a second first operating state produces second operating state aggregated light emissions including a second gamut area index (GAI) or $Q_g$ value; the second GAI value differs from the first GAI value by at least 10% or another threshold disclosed herein (or alternatively the second $Q_g$ value differs from the first $Q_g$ value by at least 5% or another threshold disclosed herein); and a first color point generated by the first operating state aggregated light emissions differs from a second color point generated by the second operating state aggregated light emissions by no more than 7 MacAdam ellipses (or optionally within 5 or 4 MacAdam Ellipses) on a 1931 CIE Chromaticity Diagram. In certain embodiments, at least one emitter (and optionally each of the foregoing emitters) may include at least one LED and at least one lumiphor arranged to receive and be stimulated by at least a portion of emissions of the at least one LED and responsively emit lumiphor emissions. In certain embodiments, one or more of the following conditions may be satisfied: the first color point and the second color point differ in correlated color temperature by an amount of no greater than 2% relative to one another; and the first operating state aggregated light emissions and the second operating state aggregated light emissions differ in luminous flux by an amount of no greater than 2%. In certain embodiments, the second GAI value may differ from the first GAI value by at least 15%, or by at least 20%. Alternatively, in certain embodiments, the second $Q_g$ value may differ from the first $Q_g$ value by at least 10%, by at least 15%, or by at least 20%. In certain embodiments, one or more of the following conditions may be satisfied: at least one of the first operating state aggregated light emissions and the second operating state aggregated light emissions comprises a luminous efficacy of at least 60 lumens per watt, and each of the first operating state aggregated light emissions and the second operating state aggregated light emissions comprises a luminous flux of at least 500 lumens. In certain embodiments, at least one of the first color point and the second color point is on or proximate to the white body line, with such proximity as defined herein. In certain embodiments, at least one of the first color point and the second color point is on or proximate to the blackbody (Planckian) locus. In certain embodiments, at least one of the first color point and the second color point comprises a CRI Ra of at least 80, a GAI (or $Q_g$) value in a range of 80 to 800, or a CRI Ra value of at least 80 in conjunction with a GAI (or $Q_g$) value in a range of from 80 to 100. In certain embodiments, the foregoing conditions may be attained when each of the first color point and the second color point comprises a desired CCT, such as in a range of from 2,500K to 5,000K, or in a range of from 2,700K to 4,000K. In certain embodiments, a lighting device may be devoid of any lumiphor-converted blue electrically activated emitter (such as a LED arranged to generate emissions having a dominant wavelength in a range of from 430 nm to 480 nm with at least one lumiphor positioned to receive at least a portion of the LED emissions). In certain embodiments, the lighting device may embody a solid state emitter package and/or include one or more features associated with solid state packages disclosed herein. In certain embodiments, a light bulb or light fixture may comprise a lighting device as disclosed herein. In certain embodiments, a method comprises illuminating an object, a space, or an environment utilizing a lighting device as disclosed herein.

Various features and embodiments of the present disclosure are described with reference to the accompanying figures.

FIG. 6 is an excerpt of a CIE 1976 chromaticity diagram illustrating the blackbody locus (BBL) and a closed dash-line shape (enclosing a region 70, which is below the BBL) embodying potential color points to be output by a lighting device as disclosed herein, with the dash-line shape embodying a region defined by a CCT value in a range of from 2,500K to 10,000K, and spanning a Planckian offset Delta u'v' range of from negative 0.01 to negative 0.02. CCT lines for selected values are additionally shown (i.e., spanning Planckian offset Delta u'v' values of about ±0.05). The region 70 is bounded from above by curve 71 (representing Planckian offset Delta u'v' values of negative 0.01), from the left by line 73 corresponding to a CCT value of 10,000K, from the right by line 74 corresponding to a CCT value of 2,500K, and from below by curve 72 (representing Planckian offset Delta u'v' values of negative 0.02). FIG. 6 includes two color points 36, 37 for a hypothetical lighting device (not shown), with the points both having a CCT of 3000K while differing from one another by a Delta u'v' value of no greater than 0.01.

FIGS. 7A-7B graphically illustrate GAI and CRI Ra values, respectively, obtained by modeling a first exemplary lighting device including a blue LED (452 nm peak wavelength) arranged to stimulate emissions of a yellow (YAG 108) phosphor, in combination with an orange-red LED (619 nm dominant wavelength), with the lighting device being devoid of any notch filtering material. In particular, FIG. 7A is an excerpt of a CIE 1931 chromaticity diagram showing the blackbody locus, the line of minimum tint (also termed "white body line" or "WBL" herein) extending between CCT values from 2700K to 6500K, periodic color temperature lines intersecting the blackbody locus, and plots of nine zones (i.e., zones I to IX) with different ranges of gamut area index (GAI) obtained such modeling. In FIG. 7A, zone V is of particular interest since it corresponds to a preferred range of GAI values from 80 to 100, and further encompasses a portion of the white body line (WBL) in a range of certain desirable CCT values below 4000K (with such region of the WBL being below the blackbody locus). FIG. 7B is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of ten zones (i.e., zones I to X) with different ranges of color rendering index (CRI Ra) obtained by modeling the same lighting device according to FIG. 7A. In FIG. 7B, zone I (corresponding to CRI Ra values of 90 to 100) and zone II (corresponding to CRI Ra values of from 80 to 90) are of particular interest since the recited ranges are suitable for general illumination and encompass the white body line (WBL) in a range of desirable CCT values below 4000K (with such region of the WBL being below the blackbody locus). FIGS. 7A-7B in combination show that a first solid state lighting device including a phosphor-converted blue primary LED and a supplemental orange/red LED can simultaneously achieve the preferred combination of CRI Ra≥80 (or CRI Ra≥90) and 80≤GAI≤100. Such condition is achieved in combination with high luminous efficacy (e.g., at least 60 LPW, at least 80 LPW, at least 100 LPW (or up to 120 LPW or more) without use of notch filtering material.

FIGS. 7A-7B in combination show that emitters or groups of emitters may be used to attain color points having different GAI and CRI Ra characteristics. When multiple emitters or groups of emitters arranged to produce color points having different GAI characteristics are provided in a single lighting device, and such emitters or groups of emitters are separately controllable, the resulting lighting device may be operated according to multiple operating states arranged to produce different GAI values.

Figure 8B:
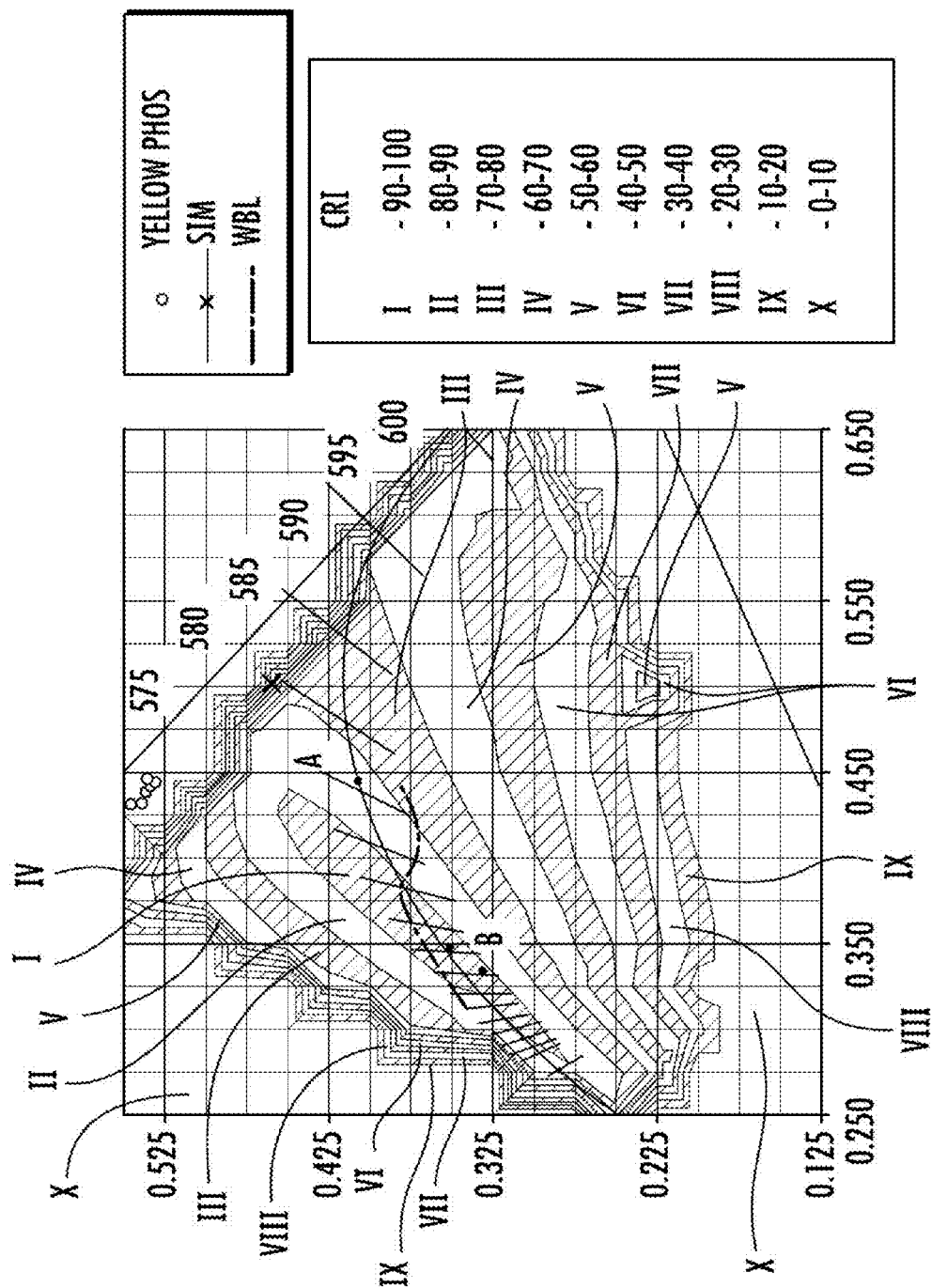
FIG. 8B is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of ten zones with different ranges of color rendering index (CRI Ra) obtained by modeling the same lighting device according to FIG. 8A.

FIGS. 8A-8C graphically illustrate GAI, CRI Ra, and S/P ratio values, respectively, obtained by modeling a second exemplary device including a blue LED (452 nm peak wavelength) arranged to stimulate emissions of a yellow/green (LuAg) phosphor, in combination with an orange-red (619 nm dominant wavelength) LED. In particular, FIG. 8A is a an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of nine zones with different ranges of gamut area index (GAI) obtained by such modeling. In FIG. 8A, zone V is of particular interest since it corresponds to a preferred range of GAI values from 80 to 100, and further encompasses the majority of the white body line (WBL) (including numerous values in a range of certain desirable CCT values below 4000K below the blackbody locus. FIG. 8B is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of ten zones with different ranges of color rendering index (CRI Ra) obtained by modeling the same lighting device according to FIG. 6A. In FIG. 6B, zone I (corresponding to CRI Ra values of 90 to 100) and zone II (corresponding to CRI Ra values of from 80 to 90) are of particular interest since the recited ranges are suitable for general illumination and encompass the white body line (WBL) in a range of desirable CCT values below 4000K (with such region of the WBL being below the blackbody locus). FIG. 8C is an excerpt of a CIE 1931 chromaticity diagram showing the blackbody locus, the line of minimum tint (or "white body line") extending between CCT values from 2700K to 6500K, periodic color temperature lines intersecting the blackbody locus, and plots of eight zones with different ranges of scotopic/photopic (S/P) ratio obtained by modeling the same lighting device. In FIG. 8C, zone V (corresponding to S/P ratio values in a range of from 1.5 to 2) is of particular interest since it encompasses the WBL for all CCT values of less than about 4000K. FIGS. 8A-8B in combination show that a second solid state lighting device including a phosphor-converted blue primary LED and a supplemental orange/red LED can simultaneously achieve the preferred combination of CRI Ra≥80 (or CRI Ra≥90) and 80≤GAI≤100. Such condition is achieved in combination with elevated S/P ratio and high luminous efficacy (e.g., at least 60 LPW, at least 80 LPW, at least 100 LPW (or up to 120 LPW or more) without use of notch filtering material.

FIGS. 7A-7B and FIGS. 8A-8B show that emitters or groups of emitters may be used to attain color points having different GAI and CRI Ra characteristics. When multiple emitters or groups of emitters arranged to produce color points having different GAI characteristics are provided in a single lighting device, and such emitters or groups of emitters are separately controllable, the resulting lighting device may be operated according to multiple operating states arranged to produce different GAI values.

FIGS. 9A-9E in combination embody a table providing numerical results for modeling of 151 solid state lighting devices each including an orange or red LED (source $1a$), a yellow or yellow/green phosphor (source $2a$), and a blue LED (source $3a$), including device number, CIE 1931 x,y coordinates of combined emissions, dominant LED wavelength (dm), correlated color temperature (cct), S/P ratio, CRI Ra, R9 color rendering, color quality scale (CQS), gamut area index (GAI), source identifiers, lumen percentage for each individual source, CIE 1931 x,y coordinates for each individual source, dominant wavelength (dm) for each individual source, and peak wavelength (pk) for each individual source. As shown in the last six columns of FIGS. 9A-9E, source $1a$ includes sources with dominant wavelengths in a range of from 613 nm to 623 nm and peak wavelengths in a range of from 620 nm to 632 nm; source $2a$ includes sources with dominant wavelengths in a range of from 558 nm to 569 nm and peak wavelengths in a range of from 532 nm to 541 nm; and source $3a$ includes sources with dominant wavelengths in a range of from 447 nm to 470 nm and peak wavelengths in a range of from 440 nm to 465 nm. The fourth through tenth columns of FIGS. 9A-9E show that for each device, aggregated emissions (embodying the combination of source $1a$, $2a$, and $3a$) include a dominant wavelength in a range of from 583 nm to 605 nm, CCT in a range of from 3879K to 2125K, S/P ratio in a range of from 1.12 to 2.02, CRI Ra in a range of from 80 to 95, R9 (R9 color rendering value) in a range of from 16 to 98, color quality scale in a range of from 71 to 93, and GAI in a range of from 80 to 100. Lamps with a high R9 color rendering value are desirable to reproduce reddish colors vividly. In certain embodiments, at least one operating state (and preferably multiple operating states) of a variable gamut lighting device as disclosed herein may include a R9 color rendering value in a range of preferably at least 80, more preferably at least 85, more preferably at least 90, and more preferably at least 95, in conjunction with CRI Ra in a range of preferably at least 80, more preferably at least 90, in combination with a GAI value in a range of from 80 to 100.

In certain embodiments, one or more electrically activated emitters of a lighting device as disclosed herein may include at least one notch filtering material arranged to filter at least a portion of emissions of the emitter(s) to exhibit a spectral notch. In certain embodiments, a notch filtered light emitting element may exhibit increased gamut relative to an unfiltered light emitting element. When multiple emitters or groups of emitters arranged to produce color points having different GAI characteristics (e.g., such as may include differing presence, concentration, and/or amount of notch filtering materials) are provided in a single lighting device, and such emitters or groups of emitters are separately controllable, the resulting lighting device may be operated according to multiple operating states arranged to produce different GAI values.

To demonstrate results of adding different amounts of notch filtering material to notch filtering device, FIG. 10 provides modeling results including GAI, CRI Ra, R9 rendering, LEP luminous efficacy (optical), S/P ratio, lumens per watt, filter lumen loss percentage, Du'v' (distance from BBL in 1976 CIE color space), and neodymium filter density values for four light sources—namely, an incandescent source (second column), an unfiltered blue shifted (yellow plus red) or "BS(Y+R)" phosphor-converted LED source (third column), a high CRI lightly neodymium oxide filtered BS(Y+R) phosphor-converted LED source (fourth column), and a near-white body line, more heavily neodymium oxide filtered BS(Y+R) phosphor-converted LED (or "Neo WBL Nd filtered BS(Y+R)") source (fifth column). Each BS(Y+R) source included a 457 nm dominant wavelength blue LED (1% total lumen output of the device) arranged to stimulate emissions of two phosphors—namely, a cerium-doped yttrium aluminum garnet (Ce:YAG) or "YAG" 108 yellow phosphor having a dominant wavelength of 570 nm (69.2% total lumen output of the device) and a $CaAlSiN_3$ ('CASN') based red phosphor having a dominant wavelength of 600 nm (29.8% total lumen output of the device).

Comparing the incandescent and unfiltered BS(Y+R) solid state sources, both have GAI values of 49%, while the incandescent source has better CRI Ra (100 versus 81), the incandescent source has a higher S/P ratio, and the solid state source has greater luminous efficacy. Both sources are on the blackbody locus with Du'v' values of zero.

Comparing the unfiltered BS(Y+R) and high CRI neodymium filtered BS(Y+R) solid state sources, the filtered source has higher GAI (63% versus 49%), improved CRI Ra (92 versus 81), improved R9, and higher S/P ratio, but lower luminous efficacy due to filter lumen loss (19%) and is slightly removed from the blackbody locus with a Du'v' value of 0.006. The filtered "high CRI" solid state source (which has a neodymium oxide density of 0.5 relative to a 3.2 mm reference neodymium oxide filter) therefore provides enhanced CRI Ra and enhanced GAI relative to the unfiltered solid state source.

Comparing the high CRI Nd filtered BS(Y+R) and Neo WBL Nd filtered BS(Y+R) solid state sources, the latter (Neo WBL) source has more than twice the neodymium oxide density (i.e., 1.20 versus 0.5 relative to a 3.2 mm reference neodymium oxide filter), which results in even greater GAI (78% versus 63%) and greater S/P ratio (135 versus 1.25), but reduced CRI Ra (80 versus 92). Indeed, the Neo WBL Nd filtered BS(Y+R) source has a CRI Ra that is reduced even relative to the unfiltered solid state source (i.e., 80 versus 81). The Neo WBL Nd filtered BS(Y+R) further exhibits reduced luminous efficacy (70 LPW versus 86 LPW for the more lightly filtered source), as expected due to the increased filter lumen loss (34% versus 19%). The higher filtering material concentration also causes the color point to depart further from the blackbody locus (with a Du'v' value of 0014, or more than double the Du'v' value for the more lightly filtered source). The Neo WBL filtered solid source provides enhanced GAI while sacrificing CRI Ra and efficacy. Use of notch filtering material at a sufficiently high concentration to cause CRI Ra to actually decline and depart from the blackbody locus, while reducing luminous efficacy, runs counter to the conventional desire in the art to provide increased CRI Ra without undue loss of luminous efficacy and without departing from the blackbody locus.

FIG. 11 is plot of a GAI as a function of filter density, with an overlaid plot of CRI Ra, for the three (rightmost) solid state light sources summarized in FIG. 10. The respective plots show that GAI values continue to increase with increasing filter density, and that CRI Ra initially increases with increasing filter density but then decreases as filter density continues to increase beyond an inflection point. Thus, increasing GAI beyond a certain point may be detrimental with respect to an attempt to enhance color rendering. The shaded area at upper right represents a preferred combination of combination of CRI Ra≥80 and 80≤GAI≤100, which is almost but not quite attained by the Neo WBL Nd filtered BS(Y+R) source.

FIG. 12 illustrates gamut area and color point for each of the four light sources characterized in FIG. 10, superimposed with an excerpt of the 1931 CIE chromaticity diagram including the blackbody locus and the line of minimum tint (white body line). The incandescent source A and the unfiltered solid state source B both have the same color point on the blackbody locus and similar gamut areas (resulting in the same GAI value). The high CRI Nd filtered BS(Y+R) solid state source C has a color point that is intermediately arranged between the blackbody locus and the white body line, while having a larger gamut area than each of the incandescent source A and the unfiltered solid state source B. The Neo WBL Nd filtered BS(Y+R) solid state source D has a color point that is on the white body line (line of minimum tint), while having an even larger gamut area than the preceding sources.

Given the variation in gamut areas among the four sources A to D, it is apparent that combining and separately controlling at least two sources in a single lighting device may permit gamut area of emissions of such a device to be varied. Referring back to FIG. 10, GAI values for sources B, C, and D are 49%, 63%, and 78%, respectively. By separately controlling two such sources arranged in a single lighting device, gamut area of aggregate emissions can be varied by 10%, 15%, 20%, or more.

FIG. 13 illustrates spectral output (relative intensity) versus wavelength for the four light sources characterized in FIG. 10, showing the effect of increased neodymium filter concentration on spectral output. The incandescent source A has a substantially linear relationship between spectral output and wavelength. The unfiltered solid state source B exhibits a first peak at 450 nm, a first trough centered at about 480 nm, and a broad composite peak centered at about 610 nm without a spectral notch. The high CRI Nd filtered BS(Y+R) solid state source C exhibits a significant spectral notch between about 560 nm-590 nm. The Neo WBL Nd filtered BS(Y+R) solid state source D exhibits an even deeper spectral notch between about 560 nm-590 nm, due to increased filter material concentration.

FIG. 14A is a bar chart representing CRI values including results for 14 color chips and the composite CRI Ra value for the second (i.e., unfiltered solid state) light source characterized in FIG. 10. FIG. 14B is a bar chart representing CRI values including results for 14 color chips and the composite CRI Ra value for the fourth (i.e., Neo WBL neodymium filtered) solid state light source characterized in FIG. 10. In each chart, the composite CRI Ra value is depicted at position 16. A comparison between FIGS. 14A and 14B shows that increasing neodymium oxide filter concentration can reduce CRI but increased perceived vividness of color, as shown by the increased R9 color rendering value (with R9 representing a red color that is difficult to render accurately). Such result is consistent with the increase GAI value provided by the increased neodymium oxide (notch) filter concentration.

In certain embodiments, solid state lighting devices may include (i) at least one lumiphoric material combined with at least one solid state emitter (e.g., two LEDs and a lumiphoric material), such as described in connection with FIG. 13A, or (ii) with multiple LEDs devoid of any lumiphoric material, such as described in connection with FIG. 14A. In certain embodiments, a solid state lighting device including multiple LEDs devoid of a lumiphor may include at least one LED comprising a dominant wavelength in a range of from 440 nm to 460 nm, at least one LED comprising a dominant wavelength in a range of from 535 nm to 560 nm, and at least one LED comprising a dominant wavelength in a range of from 590 nm to 620 nm.

FIG. 15A is a table including numerical results for modeling of a solid state lighting device including an orange (606 nm dominant wavelength) LED, a blue (450 nm dominant wavelength) LED, and a green phosphor (P1LuGaAg 4), yielding composite emissions with a CCT of 3511K, a CRI Ra value of 80, and a GAI value of 100. For the individual LEDs and the phosphor, FIG. 15A provides CIE 1931 x and y coordinates, CIE 1976 u' and v' coordinates, dominant wavelength, and relative intensity (arbitrary units). For the combined emissions, FIG. 15A further provides CIE 1931 x and y coordinates, CCT, CRI Ra, R9 color rendering, GAI, color quality scale (CQS), S/P ratio, luminous efficacy, du'v' (BBUDLL), and duv values. FIG. 15B is an excerpt of a CIE 1931 chromaticity diagram showing the blackbody locus, a portion of the line of minimum tint (or white body line), and the following items for the LEDs and phosphor of FIG. 15A: tie lines, gamut area, and composite color point. As demonstrated in FIG. 15A, a combination of high CRI (CRI Ra≥80) and high GAI (80≤GAI≤100) may be obtained with a lighting device utilizing two LEDs in combination with one lumiphoric material. The resulting color point (as shown by the X symbol in FIG. 15B) is below the blackbody locus and proximate to the white body line.

FIG. 16A is a table including numerical results for modeling of a solid state lighting device including an orange/red (617 nm dominant wavelength) LED, a blue (455 nm dominant wavelength) LED, and a yellow phosphor (NYAG 7), yielding composite emissions with 521 pupil lumens, a CCT of 2999K, a CRI Ra value of 91, and a GAI value of 83%. For the individual LEDs and the phosphor, FIG. 16A provides CIE 1931 x and y coordinates, CIE 1976 u' and v' coordinates, dominant wavelength, and relative intensity (arbitrary units). For the combined emissions, FIG. 16A further provides CIE 1931 x and y coordinates, CCT, CRI Ra, R9 color rendering, GAI, color quality scale (CQS), S/P ratio, luminous efficacy, du'v' (BBUDLL), and duv values. FIG. 16B is a CIE 1931 chromaticity diagram showing the blackbody locus, a portion of the line of minimum tint (or white body line), and the following items for the LEDs and phosphor of FIG. 16A: tie lines, gamut area, and composite color point (output). As demonstrated in FIG. 16A, a combination of high CRI Ra (CRI Ra≥80 and high GAI (80≤GAI≤100) and device output of greater than 500 (pupil) lumens may be obtained with a lighting device utilizing two LEDs in combination with one lumiphoric material. The resulting color point (as shown by the X symbol in FIG. 16B) is below the blackbody locus and proximate to the white body line.

Given the variation in gamut areas between the light source described in connection with FIGS. 15A-15B (i.e., with GAI of 100) and the light source described in connection with FIGS. 16A-16B (i.e., with GAI of 83), it is apparent that combining and separately controlling both sources in a single lighting device may permit gamut area of emissions of the resulting device to be varied. Although FIGS. 15A and 15B embody modeling results for color points with different CCT values, it is to be appreciated that color points with very similar CCT values (e.g., less than 2% different) but different GAI values may be attained.

FIG. 17A illustrates a solid state emitter package 100 including multiple solid state light emitters as described herein. The emitter package 100 includes multiple (e.g., four) LED chips 150A-150D that may be separately controlled (e.g., via backside anodes 121A-121D and cathodes 122A-122D) and that are supported by an insulating substrate 110. The substrate 110, which may preferably comprise a ceramic material, includes an upper surface 111, a lower surface 112, and side walls 113-116 extending between the upper surface 111 and the lower surface 112. Electrical traces 140 are arranged over the substrate 110, including multiple die attach pads 141A-141D and additional electrical elements 142A-142D arranged proximate to the die attach pads 141A-141D. Where the die attach pads 141A-141D are electrically conductive, the LED chips 150A-150D may be arranged with bottom side contacts thereof in electrical communication with the die attach pads 141A-141D, and with top side contacts thereof in electrical communication with the electrical elements 142A-142D by way of wirebonds 152. The die attach pads 141A-141D and electrical elements 142A-142D may comprise one or more metals patterned on (or in) the top surface 111 of the substrate 110. Gaps 145 may be provided between adjacent die attach pads 141A-141D and/or electrical elements 142A-142D to prevent undesired conductive electrical communication. In certain embodiments, die attach pads need not be electrically conductive, such as in cases where anode and cathode connections to a solid state emitter chip are both made with wirebonds. An insulating soldermask 147 is patterned over peripheral portions of the electrical traces 140, and a molded lens 160 (e.g., including a raised or hemispherical portion 161 and a base portion 162) is arranged over the top surface 111 of the substrate 110 and is arranged to transmit at least a portion of light generated by the emitter chips 150A-150D.

LED chips 150A-150D of any suitable peak wavelength (e.g., color) may be used, and one, some, or all of the chips 150A-150D may be arranged to stimulate emissions of one or more lumiphors (e.g., phosphors). Although some or all of the LED chips 150A-150D may be separately controlled, in certain embodiments groups of two or more LED chips 150A-150D or groups of LED chips may be controlled together in a groupwise fashion. As noted previously, the package 100 may embody one or more LED components, with each LED component comprising at least one LED chip 150A-150D (optionally multiple LED chips), with one or more LED chips 150A-150D optionally arranged to stimulate emissions of one or more lumiphoric materials. In certain embodiments, the solid state emitter package 100 may include two LED components, with each LED component including two LED chips 150A-150D. In certain embodiments, the solid state emitter package 100 may include one, two, three, or four LED components. Although four LED chips 150A-150D are illustrated in FIG. 15A, it is to be appreciated that a LED package may include any desirable number of LED chips, including groups of chips arranged in series, in parallel, or in series-parallel configurations.

FIG. 17B is a bottom plan view of each of the emitter package 100 of FIG. 17A. A lower surface 112 of the substrate includes four anodes 121A-121D and four cathodes 122A-122D patterned thereon (e.g., as electrical traces), with one paired anode/cathode per quadrant. The separate anodes 121A-121D and cathodes 122A-122D enable separate control of the multiple solid state emitters (e.g., LED chips) 150A-150B if desired. The various anodes 121A-121D and cathodes 122A-122D are separated by gaps that may be filled with solder mask material sections 127-1, 127-2. A thermal element (e.g., thermal spreading element) 126 may be arranged along the bottom surface 112 between the solder mask material sections 127-1, 127-2 and generally underlapping the solid state emitters 150A-150D. The thickness of the thermal element 126 may be the same as or different from (e.g., thicker than) the anodes 121A-121D and cathodes 122A-122D. As shown, the package 100 is devoid of any anode or cathode arranged on, or extending laterally beyond, any side wall 113-116 thereof.

By separately controlling different emitters (e.g., LED chips) of appropriate characteristics (e.g., including different gamut characteristics), the package 100 may be operated according to multiple operating states to yield emissions with different gamut area index values.

FIG. 18A illustrates a lighting emitting device 200 including first and second emitter components 201, 202 supported in or on a substrate or other body structure 209. The first and second emitter components 201, 202 each include at least one LED chip 203A-203B, wherein any one or more of the LED chips 203A-203B may be optionally arranged to stimulate emissions of one or more lumiphoric materials (e.g., such as lumiphor 205A arranged to be stimulated by LED chip 203A). Although FIG. 18A illustrates one LED chip 203A-203B as being associated with each emitter component 201, 202, it is to be appreciated that any suitable number (e.g., two, three, four, five, six or more, etc.) of LED chips may be associated with one or more emitter components in certain embodiments.

FIG. 18B illustrates a lighting emitting device 210 including first and second emitter components 211, 212 supported in or on a substrate or other body structure 219. The first and second emitter components 211, 212 each include at least one LED chip 213A-213B, wherein any one or more of the LED chips 213A-213B may be optionally arranged to stimulate emissions of one or more lumiphoric materials (e.g., such as a first lumiphor 215A arranged to be stimulated by a first LED chip 213A and a second lumiphor 216A arranged to be stimulated by a second LED chip 214A).

FIG. 18C illustrates a lighting emitting device 220 including first and second emitter components 221, 222 supported in or on a substrate (or other body structure) 229. The first emitter component 221 includes LED chips 223A, 223B with a first LED chip 223A arranged to stimulate emissions of a first lumiphor 225A, and the second emitter component 222 includes a LED chip 224A arranged to stimulate emissions of a second lumiphor 226A. In certain embodiments, any suitable number of LED chips and lumiphors may be provided in each emitter component, and additional emitter components (not shown) may be supported by the substrate 229.

FIG. 18D illustrates a lighting emitting device 230 including first and second emitter components 231, 232 supported in or on a substrate or other body structure 239. The first emitter component 231 includes a first LED chip 233A arranged to stimulate emissions of a first lumiphor 235A and a second LED chip 233B arranged to stimulate emissions of a second lumiphor 235B, and the second emitter component 232 includes a LED chip 234A arranged to stimulate emissions of another lumiphor 236A. In certain embodiments, any suitable number of LED chips and lumiphors may be provided in each emitter component, and additional emitter components (not shown) may be supported by the substrate 239.

FIG. 18E illustrates a lighting emitting device 240 including first and second emitter components 241, 242 supported in or on a substrate or other body structure 249. The first emitter component 241 includes a first LED chip 243A arranged to stimulate emissions of a first lumiphor 245A and a second LED chip 243B arranged to stimulate emissions of a second lumiphor 245B. The second emitter component 242 includes a first LED chip 244A arranged to stimulate emissions of a first lumiphor 246A and a second LED chip 244B arranged to stimulate emissions of a second lumiphor 246B. One or more lumiphoric materials 245A, 245B, 246A, 246B may be the same or different in the respective LED components 241, 242. In certain embodiments, any suitable number of LED chips and lumiphors may be provided in each emitter component, and additional emitter components (not shown) may be supported by the substrate 249.

FIG. 18F illustrates a lighting emitting device 250 including first and second emitter components 251, 252 supported in or on a substrate or other body structure 259. The first emitter component 251 includes a first LED chip 253A arranged to stimulate emissions of a first lumiphor 255A in addition to a second LED chip 253B, and the second emitter component 252 includes a first LED chip 254A arranged to stimulate emissions of a first lumiphor 256A in addition to a second LED chip 254B. In certain embodiments, any suitable number of LED chips and lumiphors may be provided in each emitter component, and additional emitter components (not shown) may be supported by the substrate 259.

With general reference to FIGS. 18A-18F, the first and second emitter components in each instance may embody any suitable LED chips, lumiphors, features, and/or capabilities as described herein, and are preferably separately controllable (but may be controlled together). Additional emitter components (not shown) including one or more LED chips may be further provided in or on the substrate in each instance. In embodiments including one or more emitter components with multiple LEDs, each LED within a single LED component may be individually controlled, or groups of two or more LEDs within a single component may be controlled together.

With continued reference to FIGS. 18A-18F, in certain embodiments each first emitter component may be arranged to produce emissions (or a mixture of emissions) having a first color point, each second emitter component may be arranged to produce emissions (or a mixture of emissions) have a second color point, and a mixture of light generated by the respective first and second emitter component for each device may be arranged to yield an aggregate color point. In certain embodiments, adjustment of current or current pulse width to the first emitter component (and/or individual emitters thereof) relative to the second emitter component may be used to adjust gamut area of the aggregate emissions associated with different operating states.

FIG. 19 illustrates a portion of a first control circuit arranged to control multiple strings 281, 282, 283 of solid state emitters (e.g., LEDs) 293a, 293b, 294a, 294b, 295a, 295b all being electrically connected to a common power line 280. Connected to the first string 281 are a first current regulating element 285 and a first group of LEDs 293A, 293B, which may be arranged to output the same of different dominant wavelengths, and may optionally be arranged to stimulate emissions of one or more lumiphoric materials. Connected to the second string 282 are a second current regulating element 286 and a second group of LEDs 294A, 294B, which may be arranged to output the same of different dominant wavelengths, and may optionally be arranged to stimulate emissions of one or more lumiphoric materials. Connected to the third string 283 are a third current regulating element 287 and a third group of LEDs 295A, 295B, which may be arranged to output the same of different dominant wavelengths, and may optionally be arranged to stimulate emissions of one or more lumiphoric materials. The current regulating elements 285-287 may be used to regulate currents through the respective strings 281-283 to any desired value. Such regulating elements 285-287 may be adjustable in certain embodiments. In certain embodiments, the number of LEDs in each string 281-283 may be the same or different. If the strings 281-283 have different gamut area characteristics, then the strings 281-283 may be separately controlled to adjust gamut area of emissions of a lighting device.

Figure 20:
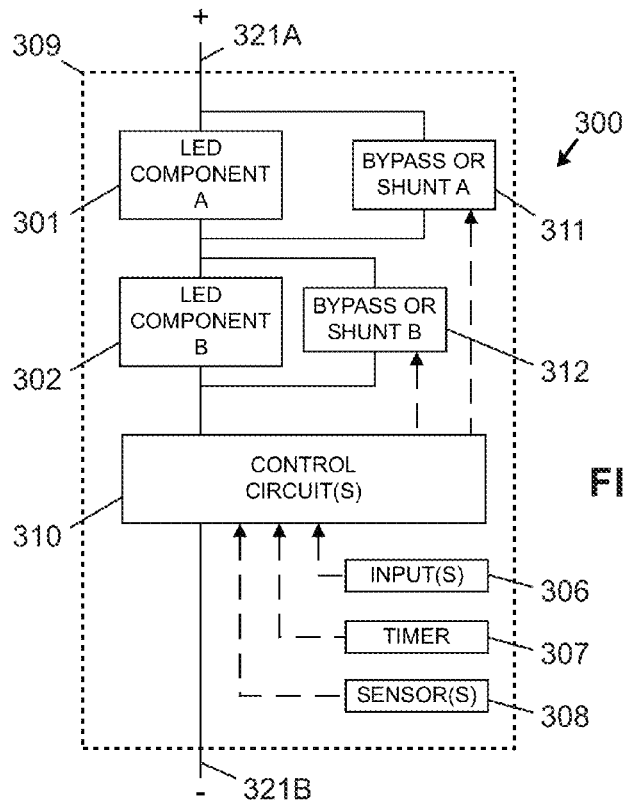
FIG. 20 is a simplified schematic diagram illustrating interconnections between various components of a light emitting apparatus including first and second solid state emitters (e.g., LED components) arranged in series and at least one control circuit.

FIG. 20 illustrates interconnections between various components of a light emitting apparatus 300 including first and second LED components (or LEDs) 301, 302 arranged in series, with at least one control circuit 310 arranged to control modulation of current and/or duty cycle of the LED components 301, 302 using controllable bypass and/or shunt elements 311, 312. In certain embodiments, each LED component 301, 302 may include one or more (optionally, all) LEDs (not shown) arranged to stimulate emissions of one or more lumiphors. In certain embodiments, each LED component 301, 302 may include multiple LEDs arranged in series, in parallel, or in series/parallel configurations. The at least one control circuit 310 may optionally be controlled responsive to one or more user input elements 306, one or more timer elements 307, and/or one or more sensor elements 308 (e.g., temperature sensing element, photosensors, etc.). Various components of the light emitting apparatus 300 may be supported by, arranged on, or arranged in electrical communication with portions of a substrate or other support element 309. In operation, current is applied to the lighting apparatus 300 between anode 321A and cathode 321B. Supply of current to, and/or duty cycle of, a first LED component 301 may be controlled with a first controllable bypass or shunt element 311. Similarly, supply of current to, and/or duty cycle of, a second LED component 302 may be controlled with a second controllable bypass or shunt element 312, with the second LED component 302 arranged in series with the first LED component 301. Each of the first and second controllable bypass or shunt elements 311, 312 may be controlled by at least one control circuit 310, optionally in response one or more user input elements 306, one or more timer elements 307, and/or one or more sensor elements 308. If the light emitting components 301, 302 have different gamut area characteristics, then the LED components 301, 302 may be separately controlled to adjust gamut area of emissions of the light emitting apparatus 300.

Figure 21:
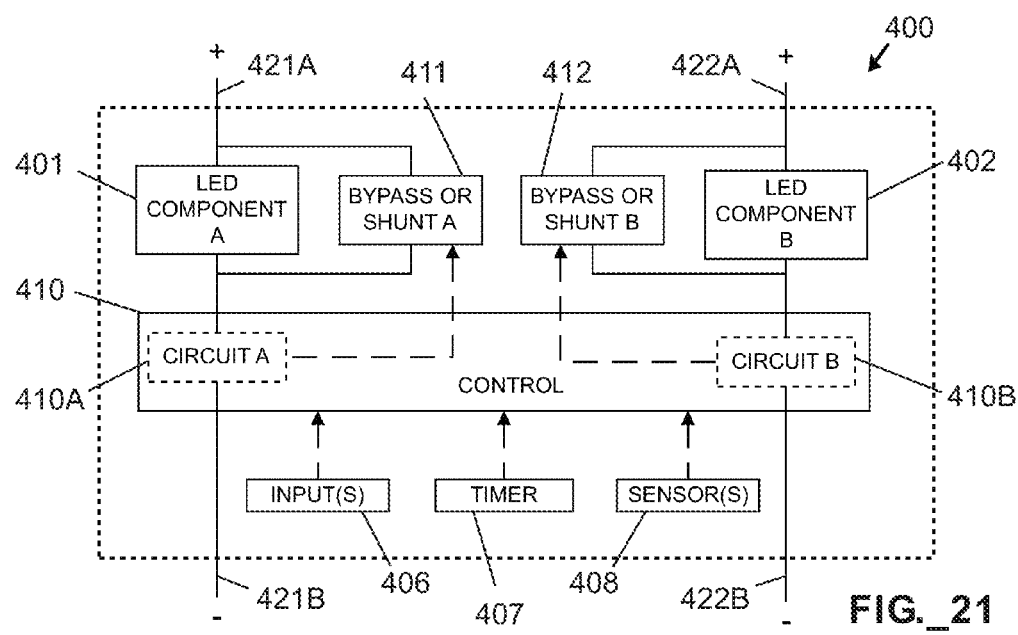
FIG. 21 is a simplified schematic diagram illustrating interconnections between various components of a light emitting apparatus including first and second solid state emitters (e.g., LED components) arranged in parallel and at least one control circuit.

FIG. 21 illustrates interconnections between various components of a light emitting apparatus 400 including first and second LED components 401, 402 arranged in parallel, with at least one control circuit 410 (e.g., optionally including control circuit portions 410A, 410B) arranged to control modulation of current and/or duty cycle of the LED components 401, 402 using controllable bypass and/or shunt elements 411, 412. In certain embodiments, each LED component 401, 402 may include one or more (optionally, all) LEDs (not shown) arranged to stimulate emissions of one or more lumiphors. In certain embodiments, each LED component 401, 402 may include multiple LEDs arranged in series, in parallel, or in series/parallel configurations. The at least one control circuit 410 may optionally be controlled responsive to one or more user input elements 406, one or more timer elements 407, and/or one or more sensor elements 408. Various components of the light emitting apparatus 400 may be supported by, arranged on, or arranged in electrical communication with portions of a substrate or support element 409. In operation, current may be supplied to the first LED component 401 via a first anode 421A and cathode 421B, wherein supply of current to, and/or duty cycle of, the first LED component 401 may be modulated with a first controllable bypass or shunt element 411. In a like manner, current may be supplied to the second LED component 402 via a second anode 422A and cathode 422B, wherein supply of current to, and/or duty cycle of, the second LED component 402 may be modulated with a second controllable bypass or shunt element 412. The first and second controllable bypass or shunt elements 411, 412 may be controlled by at least one control circuit 410 (optionally with dedicated portions 410A, 410B), optionally in response one or more user input elements 406, one or more timer elements 407, and/or one or more sensor elements 408. If the light emitting components 401, 402 have different gamut area characteristics, then the light emitting components 401, 402 may be separately controlled to adjust gamut area of emissions of the light emitting apparatus 400.

FIGS. 22A-22F illustrate exemplary portions of solid state lighting devices incorporating electrically activated solid state light emitters and lumiphoric materials, which may be used alone or in groups according to certain embodiments described herein. It is to be appreciated that various structures employed within complete lighting devices (e.g., package leads, leadframes, contacts, wirebonds, bond structures, heat transfer elements, light extracting optics, diffusers, additional reflecting surfaces, power supplies, and the like) have been omitted for clarity of illustration, but one skilled in the art would appreciate that known structures could be incorporated in operative lighting devices including the illustrative portions provided in the figures.

FIG. 22A is a side cross-sectional schematic view of a portion of a solid state lighting device 500 including at least one electrically activated solid state light emitter (e.g., LED) 504, a reflector cup 502 or other support structure on or over which the LED 504 is mounted, and (optionally) at least one lumiphor (e.g., phosphor) 507 dispersed in an encapsulant material disposed over the LED 504 and within the reflector cup 502. Although FIG. 22A illustrates the at least one lumiphor 507 as being dispersed in an encapsulant material, in various embodiments one or more lumiphors (e.g., phosphors) may be disposed in any suitable conformation to receive emissions from a solid state (e.g., LED) emitter and responsively re-emit light. In certain embodiments, at least one lumiphor may be coated directly on or over a solid state emitter. In certain embodiments, one or more lumiphors may be arranged in separate layers that may be spatially separated from each solid state emitter and/or one another. In certain embodiments, the device 500 including a lumiphor may be utilized in conjunction with a comparable device including a LED but lacking a lumiphor.

FIG. 22B is a side cross-sectional schematic view of a portion of a solid state lighting device 510 including at least one electrically activated solid state emitter (e.g., LED) 514, a reflector cup 512 or other support structure on or over which the solid state emitter 514 is mounted, and multiple lumiphors (e.g., phosphors) 518, 519 arranged in layers that are spatially segregated from the solid state emitter 514. An encapsulant 516 may be disposed between the solid state emitter 514 and the lumiphors 518, 519; alternatively, at least one void may be arranged between the solid state emitter 514 and the lumiphors 518, 519 to reduce conductive thermal coupling therebetween. In certain embodiments, the device 510 including at least one lumiphor may be utilized in conjunction with a comparable device including a LED but lacking a lumiphor.

FIG. 22C is a side cross-sectional schematic view of a portion of a solid state lighting device 520 including first and second solid state emitters (e.g., LEDs) 524, 525, a reflector cup 522 or other support structure on or over which the solid state emitters 524, 525 are mounted, and at least one lumiphor (e.g., phosphor) 527 dispersed in an encapsulant material disposed over the solid state emitters 524, 525 and within the reflector cup 522. In certain embodiments, multiple lumiphors 527 may be provided. In one embodiment, one or more lumiphors may be arranged to interact with only a single solid state emitter 524, 525. At least one lumiphor may be disposed in an amount (e.g., thickness, width, etc.) or concentration that varies with respect to position within a solid state lighting device, such embodied in variations of presence, amount or concentration with respect to one or more solid state emitters. For example, at least one lumiphor may be coated over or arranged over one solid state emitter, and not arranged over (or arranged in a different thickness or concentration over) another solid state emitter.

In certain embodiments, a solid state lighting device may include multiple electrically activated solid state emitters (e.g., LEDs) and one or more lumiphors (e.g., phosphors) arranged in one or more layers spatially separated from the solid state emitters. FIG. 22D is a side cross-sectional schematic view of a portion of a solid state lighting device 530 including first and second solid state emitters (e.g., LEDs) 534, 535, a reflector cup 532 or similar support structure on or over which the solid state emitters 534, 535 are mounted, and one or more lumiphors (e.g., phosphors) 538, 539 arranged in layers that are spatially segregated from the solid state emitters 534, 535. An encapsulant 536 or other material may be disposed between the solid state emitters 534, 535 and the lumiphors 538, 539; alternatively, the solid state emitters 534, 535 and lumiphors 538, 539 may be separated by a gap. In one embodiment, the lumiphors 538, 539 may be arranged in alternating layers including at least two non-adjacent layers including lumiphors of substantially same material composition. One advantage of confining different lumiphors to different layers is to avoid undue absorption of emission spectrum of one lumiphor that may overlap with excitation spectrum of another lumiphor (e.g., excitation spectrum of a red phosphor may overlap with emission spectrum of a yellow phosphor) which would result in loss of efficiency). In certain embodiments, presence of a lumiphoric material may be non-uniform (e.g., patterned) within an individual lumiphor layer. In certain embodiments, a lumiphoric material layer may have a thickness that is non-uniform with respect to position.

FIG. 22E is a side cross-sectional schematic view of a portion of a solid state lighting device 540 including first and second electrically activated solid state emitters (LEDs) 544, 545, a reflector cup 542 or other support structure on or over which the LEDs 544, 545 are mounted, and at least one lumiphor 548 arranged to interact only (or primarily only) with a single LED 544. In certain embodiments, the at least one lumiphor 548 may be coated or deposited on or over a first solid state emitter 544 but omitted from the second solid state emitter 545. In certain embodiments, the at least one lumiphor 548 may include a mixture of multiple lumiphors, and/or multiple layers of lumiphors having different material compositions.

FIG. 22F is a side cross-sectional schematic view of a portion of a solid state lighting device 550 including first and second electrically activated solid state emitters (LEDs) 555, 555, a reflector cup 552 or other support structure on or over which the LEDs 554, 555 are mounted, a first lumiphor 558 arranged to interact only (or primarily only) with a first LED 554, and a second lumiphor 559 arranged to interact only (or primarily only) with a second LED 555. In certain embodiments, the lumiphors 558, 559 may be separately coated or deposited over the respective first and second LEDs 554, 555.

It is to be appreciated that one or more of the foregoing sources or groups of such sources illustrated in FIGS. 22A-22F may embody emitters or groups of emitters having different gamut areas, such that by utilizing (or combining) such sources in a single devices, and separately controlling the respective sources, gamut area of aggregated emissions may be varied.

FIGS. 23A-23F illustrate exemplary portions of solid state lighting devices in different configurations incorporating electrically activated solid state light emitters arranged over package mounts (or other substrates), with solid state light emitters overlaid with lumiphoric materials and notch filtering materials and optionally overlaid with lenses, wherein such devices may be used alone or in groups according to certain embodiments described herein.

FIG. 23A illustrates a solid state light emitting device 660 including a solid state emitter (e.g., LED) chip 663 (which may include LED epitaxial layers and a support) arranged over a top surface 662 of a package mount (or other substrate) 661, with a top surface 664 of the emitter chip 663 being covered with a lumiphoric material 666 (e.g., in a first layer) and a filtering material 668 (e.g., in a second layer). The package mount 661 may include metalized regions and/or vias (not shown) for conduction of electrical signals to the emitter chip 663. Side surfaces 665 of the emitter chip 663 may be exposed or otherwise coated with one or more of lumiphoric material and notch filtering material. In certain embodiments, the LED chip 663 may be coated with a lumiphoric material 666 and a notch filtering material 668.

FIG. 23B illustrates a solid state light emitting device 660A including the device 660 of FIG. 23A following addition of a lens 669 having a curved (e.g., substantially hemispherical) shape. Such lens 669 may be formed by any suitable method, including but not limited to molding using silicone material. In certain embodiments, the lens 669 may have a width or lateral extent that is substantially equal to a width or lateral extent of the package mount 661, and a peripheral portion 669A of the lens 669 may have a substantially uniform thickness.

FIG. 23C illustrates a solid state light emitting device 670 including a solid state emitter (e.g., LED) chip 673 (which may include LED epitaxial layers and a support) arranged over an upper surface 672 of a package mount (or other substrate) 671, with a top surface 674 and side surfaces 675 of the emitter chip 673, as well as an upper surface 672 of the package mount 671, being covered with a wavelength conversion material 676 (e.g., in a first layer) and a filtering material 678 (e.g., in a second layer). In certain embodiments, the LED chip 673 and upper surface 672 of the package mount 671 may be coated with a lumiphoric material 676 and a notch filtering material 678 (e.g., according to any suitable process, such as spray coating, and such materials 676, 678 may optionally be arranged in conformal layers that follow the shape and outline of multiple surfaces of the emitter chip 675.

FIG. 23D illustrates a solid state light emitting device 670A including the device 670 of FIG. 23A following addition of a lens 679 having a substantially rectangular cross-sectional curved (e.g., substantially hemispherical) shape. Such lens 679 may be formed by any suitable method, including but not limited to molding using silicone material. In certain embodiments, the lens 679 may have a width or lateral extent that is substantially equal to a width or lateral extent of the package mount 671.

FIG. 23E illustrates a solid state light emitting device 680 including first and second solid state emitter chips 683A, 683B arranged over a package mount 681, with top surfaces 684A, 684B of the emitter chips 683A, 683B being covered with a wavelength conversion materials 686A, 686B and a filtering (e.g., notch filtering) material 688, and with side surfaces 685A, 685B of the emitter chips 683A, 683B and an upper surface 682 of the package mount 681 being covered with a filtering material 688. The notch filtering material 688 may be arranged in a conformal layer that follows the shape and outline of multiple surfaces of the emitter chips 683A, 683B. Electrical connections to the LED chips 683A, 683*b* may be made either before or after a notch filtering material coating step.

FIG. 23F illustrates a solid state light emitting device 680A including the device 680 of FIG. 23E with addition of a lens 689 having a beveled upper edge 689A with a non-rectangular (polygonal) cross-sectional shape. Such lens 689 may be formed by any suitable method, including but not limited to molding using silicone material. In certain embodiments, the lens 689 may have a width or lateral extent that is substantially equal to a width or lateral extent of the package mount 681.

Lenses according to the shapes shown in any of FIGS. 23B, 23D, and 23F may be applied to any of the devices 660, 670, and 680 according to FIGS. 23A, 23C, and 23E.

It is to be appreciated that one or more of the foregoing sources or groups of such sources illustrated in FIGS. 23A-23F may embody emitters or groups of emitters having different gamut areas, such that by utilizing (or combining) such sources in a single devices, and separately controlling the respective sources, gamut area of aggregated emissions may be varied.

FIG. 24 is a side cross-sectional view of at least a portion of a solid state light emitting device 690 including multiple solid state emitter (e.g., LED) chips 695 arranged over a submount 691 in flip-chip configuration, with both anode and cathode connections on the bottom of the chips 695. The emitter chips 695 may (optionally) include angled or beveled upper edges with a non-rectangular (e.g., polygonal) cross-section, with such shape serving to enhance light extraction. One or more emitter chips 695 may optionally be coated with one or more functional materials (e.g., lumiphoric material, notch filtering material, etc.) in conformal layers 696, 697 and arranged under a hemispherical optical element (e.g., lens) 690, with the conformal layers 696, 697 following the shape and contour of multiple surfaces of the emitter chips 695 (preferably with substantially constant thickness). As shown in FIG. 24, each conformal layer 696, 697 may extend over, between and laterally beyond the chips 695 (such as over a reflective material disposed between or adjacent to the emitter chips 695). The optical element 699 may be separated from the emitter chips 695 via a gap or an intervening material 698, which may include encapsulant or a fluid medium such as liquid or gel (e.g., mineral oil, perfluorinated polyether (PFPE) liquid, or other fluorinated or halogenated liquid or gel). Such material 698 may also include an index matching medium characterized by a refractive index that provides for reduced or minimal reflection or internal refraction of light emissions. In certain embodiments, elements 698, 699 may embody a single element, such as molded silicone. In certain embodiments, the optical element 699 may include one or more functional materials, such as lumiphoric material, notch filtering material, and/or scattering material, which may be doped, coated, or otherwise provided in or on the optical element 699. With continued reference to FIG. 24, the submount 691 (e.g., alumina, aluminum nitride, high temperature polymers, etc.) is covered with a pattern of metal (e.g., traces) 693 that may be used to interconnect the emitter chips 695 and provide connection to a power supply. The metal pattern 693 includes connection pads 692 with insulating material 694 therebetween. In operation of the device 690, upon passage of light through one or more notch filtering materials (e.g., associated with layers 696, 697 and/or the optical element 699), the light will exhibit a spectral notch, and the notch filtering may be tailored to increase GAI and/or enhance CRI Ra. Additionally, two or more emitter chips 695 or groups thereof (optionally in conjunction with lumiphoric material and/or notch filtering material) may be arranged to generate emissions having different gamut areas, such that by separately controlling different emitter chips or groups thereof, gamut area of aggregated emissions may be varied.

FIG. 25 illustrates a solid state emitter package 700 including multiple solid state emitter (e.g., LED) chips 705 coupled to electrical traces or metal patterns 702 via wirebonds 716 and arranged under a hemispherical optical element (e.g., lens) 710. In certain embodiments, one or more chips may be coated with one or more functional materials (e.g., lumiphoric material and notch filtering material). As shown, twelve emitter chips 705 are provided in contact with the metal traces 702 arranged over submount 701, and cathodes of the LED chips are connected by wirebonds 716 to traces 702. In certain embodiments, the optical element 710 may include one or more functional materials, such as lumiphoric material, notch filtering material, and/or scattering material, which may be doped, coated, or otherwise provided in or on the optical element 710. The emitter chips 705 may be selected from various light color bins to provide a combined light output with appropriate color characteristics for a desired application. The unfiltered efficiency of such a light emitting package 700 with a warm white color may be on the order of 100 lm/W, prior to any filtering from the optical element; however, if the package 700 is binned for a cool white color, then an efficiency on the order of about 150 lm/W can be achieved (i.e., prior to any filtering). Two or more emitter chips 705 or groups thereof (optionally in conjunction with lumiphoric material and/or notch filtering material) may be arranged to generate emissions having different gamut areas, such that by separately controlling different emitter chips or groups thereof, gamut area of aggregated emissions may be varied.

Figure 26:
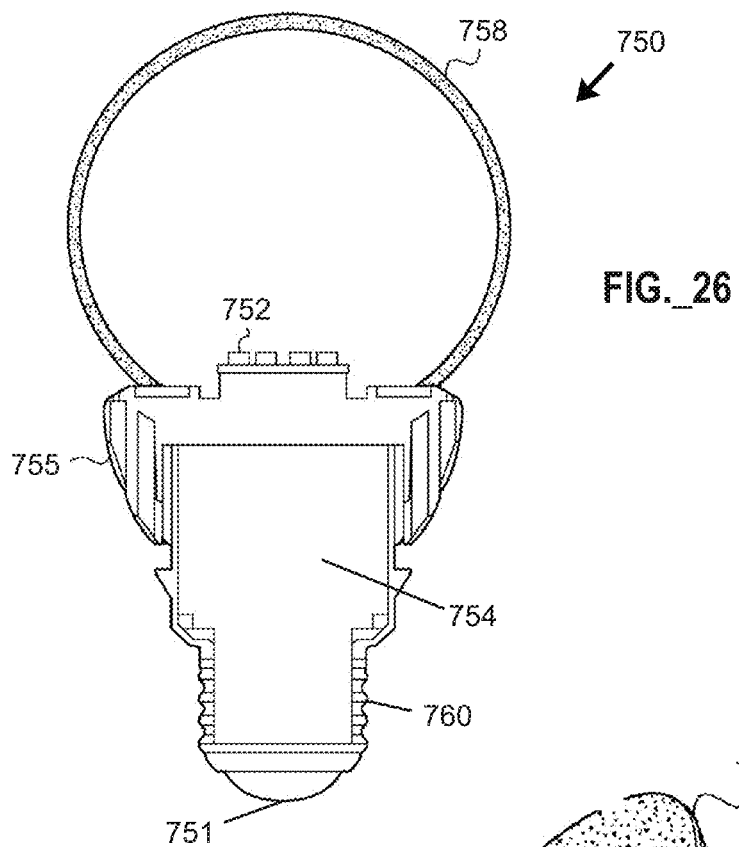
FIG. 26 is a side cross-sectional view of a first light bulb arranged to incorporate multiple solid state emitter chips as disclosed herein.

FIG. 26 illustrates a first light bulb 750 arranged to incorporate multiple solid state emitters as disclosed herein. The light bulb 750 may optionally be arranged to output notch filtered light. The solid state light bulb 750 includes a conventional power supply 754, and includes a heatsink 755 including fins to promote cooling of the emitter chips 752 and power supply 754. A lateral contact 760 and foot contact 751 may be compatible with an Edison-style screw-type light socket for conducting power to the light bulb 750. An optical element 758 (which may be embodied in a light-transmissive globe) is provided to protect the emitter chips 752 and provide light shaping and/or diffusion utility for light emissions of the bulb 750. The optical element 758 may optionally contain an intervening material (as described in connection with element 698 in FIG. 25). One or more lumiphoric materials may be associated with the emitter chips 752 and/or the optical element 758 to provide wavelength conversion utility. Additionally, one or more optional filtering materials (e.g., notch filtering materials) may be associated with the emitter chips and/or the optical element 758 to filter light emissions in order to exhibit at least one spectral notch as described herein. Two or more emitter chips 752 or groups thereof (optionally in conjunction with lumiphoric material and/or notch filtering material) may be arranged to generate emissions having different gamut areas, such that by separately controlling different emitter chips or groups thereof, gamut area of aggregated emissions may be varied.

Figure 27:
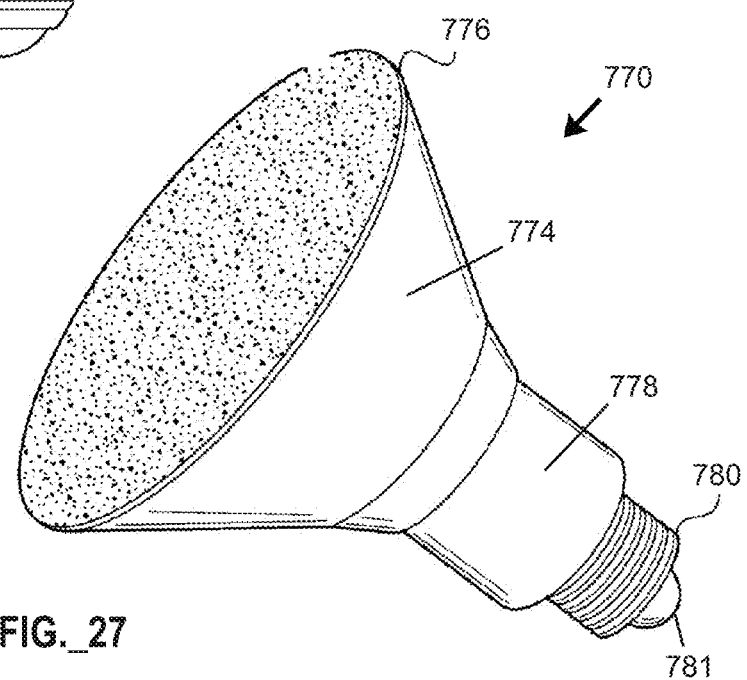
FIG. 27 is a side cross-sectional view of a second, reflector-type light bulb arranged to incorporate at least one emitter chip as disclosed herein.

FIG. 27 illustrates a second, reflector-type (i.e. PAR-style) light bulb 770 arranged to incorporate one or more solid state emitters as disclosed herein. The light bulb 770 may optionally be arranged to output notch filtered light. The light bulb 770 includes a reflector 774 and an optical element (e.g., lens) 776 covering a front or light emitting portion of the bulb 770, with the reflector 774 and lens 776 together forming a light-transmissive optical enclosure. An opposing end of the bulb includes contacts 780, 781 (e.g., an Edison-style threaded lateral contact 780 and a foot contact 781) for receiving power from a socket or other receptacle. The bulb 770 includes LED devices or dies (not visible) as previously discussed, and such components optionally may include one or more notch filtering material layers and/or one or more lumiphoric materials. Optionally, one or more filtering materials (e.g., notch filtering materials) may be associated with the optical element 776 to filter light emissions in order to exhibit at least one spectral notch as described herein. The optical element 776 may further include light scattering and/or lumiphoric materials in certain embodiments. Two or more emitters or groups thereof (optionally in conjunction with lumiphoric material and/or notch filtering material) may be arranged to generate emissions having different gamut areas, such that by separately controlling different emitter chips or groups thereof, gamut area of aggregated emissions may be varied.

Figure 28:
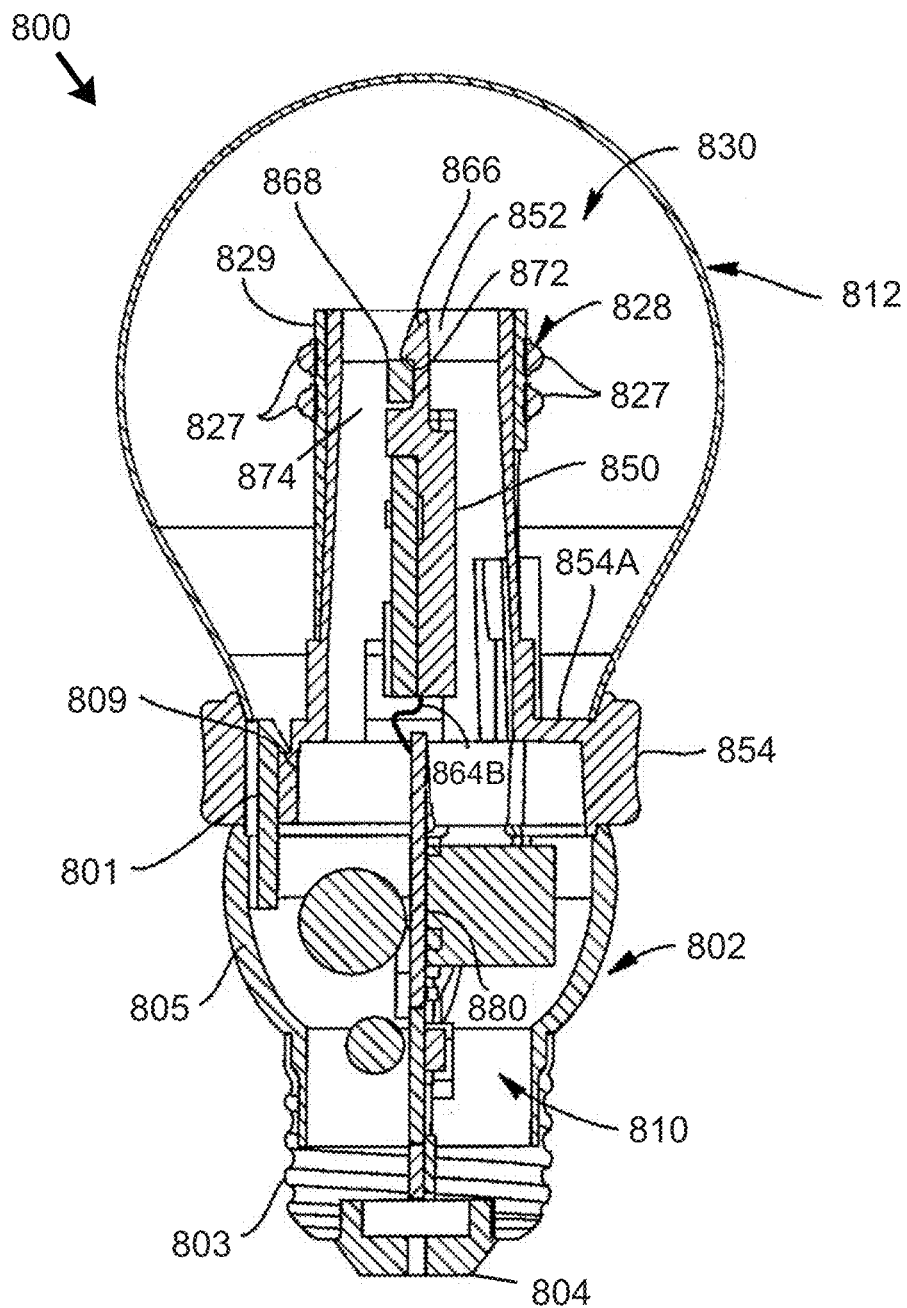
FIG. 28 is a side cross-sectional view of a third light bulb arranged to incorporate multiple solid state emitter chips as disclosed herein in a tower-type configuration.

FIG. 28 illustrates a third light bulb arranged to incorporate multiple solid state emitters (e.g., LEDs) 827 as disclosed herein disposed in an array 828 in a tower-type configuration, such as disclosed in U.S. Patent Application Publication No. 2013/0271991 (incorporated by reference herein). The bulb 800 may embody an A-series bulb with an Edison base 802 including a lateral contact 803 and a foot contact 804. The base 802 may include a base printed circuit board 880 and electronics 810 within a housing 805, suitable for powering the bulb 800 and including a power supply and/or driver.

The bulb 800 includes multiple LEDs 827 (of which one or more may include lumiphoric material and/or a notch filtering material as disclosed herein) mounted on an upwardly-extending substantially tubular or tube-like submount (e.g., printed circuit board) 829 bounding an internal cavity 874. The LED chips 827 are operable to emit light when energized. The cavity 874 is capped by a heat conducting portion 852 that and engaging member 868 that fits with an engagement portion 866 associated with locking member 872 extending upward from an electrical interconnect 850 internal to the cavity 874. A globe-like enclosure (which may embody an optical element) 812 surrounds an interior volume containing a LED assembly 830 including the multiple emitter chips 827. A heatsink 854 is arranged between the enclosure 812 and the base 802, with a lock member 809 arranged to receive and retain deformable fingers 801 during assembly of the bulb 800. A bottom edge of the enclosure 812 abuts a top surface 854A of the heatsink 854. Internal conductors 864B are arranged to conduct electrical signals between the base PCB 880 and components of the LED assembly 830.

In certain embodiments, at least one notch filtering material may optionally be associated with one or more emitter chips 827 and/or additionally associated with the enclosure (or optical element) 812, such as to exhibit at least one spectral notch upon following passage of light emission through such filtering material. The optical element 812 may further include light scattering and/or lumiphoric materials in certain embodiments. Two or more emitter chips 827 or groups thereof (optionally in conjunction with lumiphoric material and/or notch filtering material) may be arranged to generate emissions having different gamut areas, such that by separately controlling different emitter chips or groups thereof, gamut area of aggregated emissions may be varied.

Figure 29A:
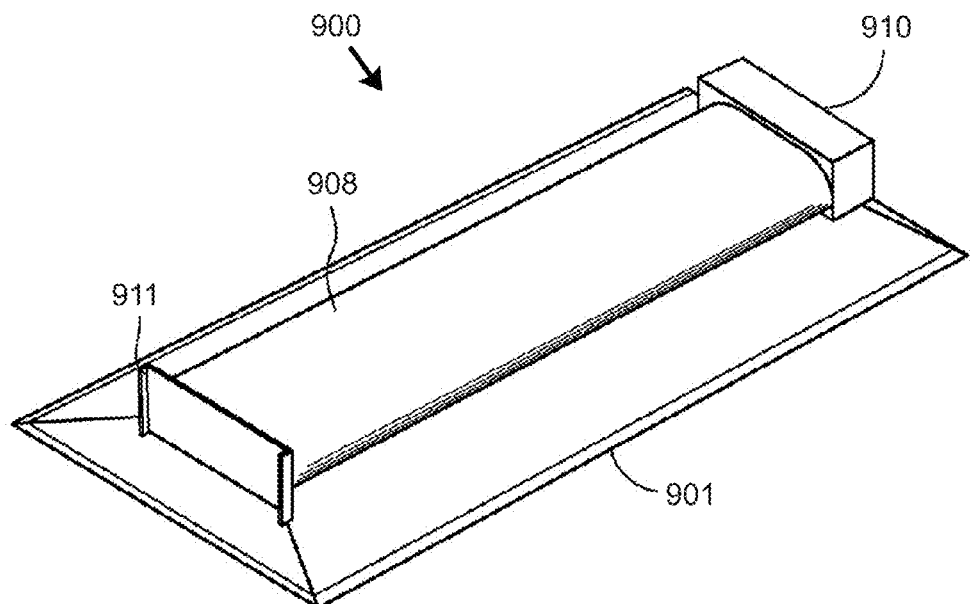
FIG. 29A is an upper perspective view of a troffer-type light fixture arranged to incorporate multiple solid state emitter chips as disclosed herein.
Figure 29B:
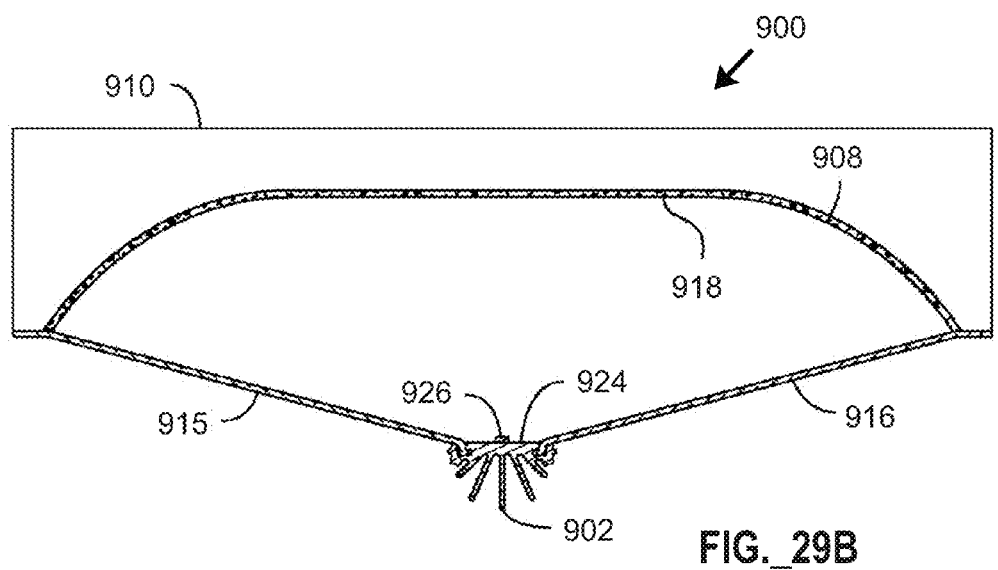
FIG. 29B is a side cross-sectional view of a portion of the light fixture of FIG. 29A.

FIGS. 29A-29B illustrate a troffer-type (in-ceiling linear) light fixture 900 arranged to incorporate multiple solid state emitters (e.g., LEDs) 926 as disclosed herein. In certain embodiments, one or more lumiphoric materials may be associated with one or more LEDs 926. Optionally, the fixture 900 may include one or more notch filtering materials, such as may be associated with emitters 926, may be applied to or included in a linear reflector (e.g., e.g., by doping, impregnation, coating, etc.), or may be applied to or integrated with one or more light transmissive lens plates 915, 916 to cause the light emitted from the light fixture to exhibit a spectral notch. Light fixture 900 includes pan 901, heatsink 902, reflector 908, and end caps 910, 911. End cap 910 is larger than end cap 911 and is shaped to act as a circuit box to house electronics used to drive and control the light source (e.g., rectifiers, regulators, timing circuitry, etc.). Although a reflector may take various shapes, in the illustrated embodiment, the reflector 908 includes a flat region opposite the heatsink 902. In alternative embodiments, the reflector 908 could be parabolic in shape, or include two or more parabolic regions. Light fixture 900 also includes a diffuser lens assembly including lens plates 915, 916, disposed adjacent to sides of the heatsink 902. Reflector 908 can be made of many different materials, including metal, polymeric material, microcellular polyethyleneterephthalate (MCPET), or other suitable materials. If notch filtering material is provided, then emissions of the LEDs 926 may interact with one or more notch filtering materials (e.g., associated with the LEDs 926, associated with the reflector 908, and/or associated with the lens plates 915, 916) such that the light will exhibit a spectral notch. Two or more emitter chips 926 or groups thereof (optionally in conjunction with lumiphoric material and/or notch filtering material) may be arranged to generate emissions having different gamut areas, such that by separately controlling different emitter chips or groups thereof, gamut area of aggregated emissions may be varied.

FIG. 30 illustrates a lighting apparatus (e.g., light fixture) 1010 according to at least one embodiment. The apparatus 1000 includes a substrate or mounting plate 1075 to which multiple solid state emitter (e.g., LED) lamps 1070-1 to 1070-6 (optionally embodied in multi-chip lamps such as multi-chip LED packages) are attached, wherein each lamp 1070-1 to 1070-6 may include multiple LEDs as described herein. Each lamp 1070-1 to 1070-6 may optionally include a cluster of solid state emitters, including at least one lumiphor converted solid state emitter and at least one supplemental solid state emitter as disclosed herein. The mounting plate 1075 may include a circular shape or any suitable shape or configuration (including non-planar and curvilinear configurations). Different solid state emitter lamps or clusters may be configured to emit the same or different colors (e.g., wavelengths) of light. With specific reference to a first solid state lamp 1070-1, each solid state lamp 1070-1 to 1070-6 may include multiple solid state emitters (e.g., LEDs) 1074A-874C preferably arranged on a single submount 1061. Although FIG. 30 illustrates four solid state emitter chips as being associated with each multi-chip solid state lamp 1070-1 to 1070-6, it is to be appreciated that any suitable number of solid state emitter chips may be associated with each multi-chip solid state lamp 1070-1 to 1070-6, and the number of solid state emitter chips associated with different (e.g., multi-chip) solid state lamps may be different. Each solid state lamp in a single fixture 1010 may be substantially identical to one another, or solid state lamps with different output characteristics may be intentionally provided in a single fixture 1010.

The solid state lamps 1070-1 to 1070-6 may be grouped on the mounting plate 1075 in clusters or other arrangements so that the light fixture 1010 outputs a desired pattern of light. In certain embodiments, at least one state emitter lamp associated with a single fixture 1010 includes a lumiphor-converted light emitting component. One or more lamps 1070-1 to 1070-6 may optionally include at least one notch filtering material. With continued reference to FIG. 30, the light fixture 1010 may include one or more control circuit components 1080 arranged to operate the lamps 1070-1 to 1070-6 by independently applying currents and/or adjusting duty cycle of respective LED components or groups thereof. In certain embodiments, individual solid state chip 1064A-1064D in various lamps 1070-1 to 1070-6 may be configured to be individually addressed by the control circuit 1080. In certain embodiments, the lighting fixture 1010 may be self-ballasted. In certain embodiments, a control circuit 1080 may include a current supply circuit configured to independently apply an on-state drive current to each individual solid state chip responsive to a control signal, and may include one or more control elements configured to selectively provide control signals to the current supply circuit. The control circuit 1080 may be configured to control the current driven through the solid state emitter chips 1064A-1064D associated with the lamps 1070-1 to 1070-6 using one or more control schemes known in the art. The control circuit 1080 may be attached to an opposite or back surface of the mounting plate 1075, or may be provided in an enclosure or other structure (not shown) that is segregated from the apparatus 1000. One or more heat dissipating structures (not shown) may be further associated with the fixture 1010. Two or more emitter chips or clusters (optionally in conjunction with lumiphoric material and/or notch filtering material) may be arranged to generate emissions having different gamut areas, such that by separately controlling different emitter chips or clusters, gamut area of aggregated emissions may be varied.

The foregoing lighting devices disclosed herein may include multiple electrically activated emitters arranged to be operated in multiple operating states arranged to produce different gamut area index (GAI) values (e.g., differing by at least 10%, by at least 15%, or another threshold disclosed herein), preferably in conjunction with a small (e.g., preferably imperceptible) change in color point and/or luminous flux.

FIG. 31 is a graph 1050 plotting radiant flux versus wavelength for a spectral output of a solid state light emitting device with superimposed notch filtered spectral output, as relating to certain embodiments that may include one or more notch filtering materials. Curve 1052 is a plot of measurements taken of the light output of an LED lamp constructed including a multi-chip LED component in a mineral-oil filled, plain glass enclosure. Curve 1054 is a plot of measurements taken of the light output of an LED lamp that is the same in most respects, except that the enclosure for the lamp measured for curve 1054 is neodymium oxide doped glass. A notch is clearly visible between 550 nm and 650 nm wherein radiant flux is reduced due to filtering by the neodymium oxide notch filtering material. Measurement 1056 represents the width of the notch corresponding to the comparative reduction in light intensity at half the maximum reduction caused by the notch, otherwise known from the field of signal processing as the full width at half the maximum (FWHM). Relative to the peak radiant flux of approximately 4.3 mW/nm, the notch filtered region includes a radiant flux trough of between 1.5-2 mW/nm. The difference between the two curves 1052, 1054 represents attenuation or reduction of light intensity. The notch shown in FIG. 31 is characteristic of neodymium oxide filtering material by including a relatively sharply sloping ('hard") shape profile and is more of a true "notch," as opposed to a filtered shape with a more gently sloping or "soft" notch that may be more characteristic of filtering materials such as color pigments.

FIG. 32 provides a line chart 1100 illustrating spectral transmittance versus wavelength for an illustrative color pigment material arranged to provide a spectral notch 1102 centered at about 580 nm. Transmittance of the color pigment material is nearly 100% at or below wavelengths of about 430 nm, and at or above wavelengths of about 730 nm. Between 430 nm and 730 nm, transmittance is reduced (to a minimum of about 50% at a wavelength of about 580 nm). As shown in FIG. 32, a color pigment may provide a softer spectral notch (with more gradually sloping wavelength attenuation) characteristics relative to other notch filtering materials such as rare earth metals and their oxides (e.g., as shown in FIG. 31).

FIG. 33 is a schematic diagram of an enclosure 1200 with a light fixture 1218 that may including multiple LED components as described herein arranged to illuminate an interior environment or space 1201. The interior environment space may be bounded by walls 1203 and may include a window 1202 arranged to admit ambient light $L_A$. One or more objects (e.g., a table 1204) may be arranged in the interior space 1201. One or more sensors 1230 (e.g., photosensors) may be arranged in communicate sensory information (signals) to a control element 1235 arranged to control or affect operation of the light fixture 1218, which outputs generated light $L_G$. One or more user input elements 1250 may also be arranged to communicate user input signals to the control element 1235 to affect operation of the fixture 1218. In operation, ambient light $L_A$ may be transmitted through the window 1202 into the interior space 1201. Such ambient light $L_A$ may optionally combine with generated light $L_G$, may optionally reflect from one or more surfaces or objects (e.g., table 1204), and may impinge on the one or more sensors 1230. In certain embodiments, multiple photosensors may be used. In certain embodiments, the sensor(s) 1230 may be used to sense light level and/or color point, and output(s) of the sensor(s) 1230 may be supplied to the control element 1235 to affect operation of the light fixture 1218 (e.g., to responsively adjust output level (intensity), color point, and/or gamut area index of emissions generated by the fixture 1218). The user input element(s) 1250 may be located in any suitable location, either within the interior space 1201, adjacent to the interior space 1201, or remotely located relative to the interior space 1201 (optionally connected to the control element 1235 via one or more network communication elements (not shown)).

FIG. 34 illustrates an interior lamp (e.g., desk lamp or table lamp) 1300 that may include multiple LED components as described herein. The lamp 1300 includes an arm 1354 extending between a base 1351 and a lamp head 1360 that includes the LED components 1368. The base 1351 may include a user input element 1352 and/or one or more sensor elements 1355 (e.g., photosensors) arranged to control operation of the LED components 1368 (e.g., to affect output intensity/dimming, color point, and/or gamut area index of aggregated emissions).

Embodiments as disclosed herein may provide one or more of the following beneficial technical effects: enhanced aesthetics of emissions of lighting devices; enhancing perceived quality of emissions of lighting devices; enhancing vividness of colors represented by lighting devices; and selectively adjusting vividness of colors represented by lighting devices, preferably with limited perceptible change in color point and/or luminous flux.

Those skilled in the art will recognize improvements and modifications to the preferred embodiments of the present disclosure. All such improvements and modifications are considered within the scope of the concepts disclosed herein and the claims that follow. Any of the various features and elements as disclosed herein may be combined with one or more other disclosed features and elements unless indicated to the contrary herein.

What is claimed is:

1. A lighting device comprising:
   a first electrically activated emitter;
   a second electrically activated emitter; and
   a control circuit configured to adjust operation of the first and second electrically activated emitter to move between at least two operating states;
   wherein a first operating state of the at least two operating states generates a combination of light exiting the lighting device that was emitted by the first electrically activated emitter and the second electrically activated emitter that produces, in the absence of any additional light, first operating state aggregated light emissions having a first gamut area index (GAI) value;
   wherein a second operating state of the at least two operating states generates a combination of light exiting the lighting device that was emitted by the first electrically activated emitter and the second electrically activated emitter that produces, in the absence of any additional light, second operating state aggregated light emissions having a second GAI value;
   wherein the second GAI value differs from the first GAI value by at least 10%; and
   wherein the first operating state aggregated light emissions produce, in the absence of any additional light, emissions including a first color point, and the second operating state aggregated light emissions produce, in the absence of any additional light, emissions including a second color point, and
   wherein, when plotted on a CIE 1976 u'-v' chromaticity diagram, the first color point and the second color point differ from one another by a Delta u'v' value of no greater than 0.01.

2. The lighting device of claim 1, wherein each of the first electrically activated emitter and the second electrically activated emitter comprises a solid state light emitter.

3. The lighting device of claim 1, wherein at least one of the first electrically activated emitter and the second electrically activated emitter comprises at least one light emitting diode and at least one lumiphor arranged to receive and be stimulated by at least a portion of emissions of the at least one light emitting diode and responsively emit lumiphor emissions.

4. The lighting device of claim 1, comprising at least one of the following features (i) and (ii): (i) the first color point and the second color point differ in correlated color temperature by an amount of no greater than 2% relative to one another, and (ii) the first operating state aggregated light emissions and the second operating state aggregated light emissions differ in luminous flux by an amount of no greater than 2%.

5. The lighting device of claim 1, wherein the second GAI value differs from the first GAI value by at least 15%.

6. The lighting device of claim 1, further comprising a notch filtering material arranged to receive emissions from at least one of the first and the second electrically activated emitter, wherein the notch filtering material is arranged to receive and filter at least a portion of the emissions of any of the first electrically activated emitter and the second electrically activated emitter to exhibit a spectral notch.

7. The lighting device of claim 1, wherein at least one of the first electrically activated emitter and the second electrically activated emitter comprises at least one primary electrically activated light emitter and at least one supplemental electrically activated light emitter, wherein the at least one supplemental electrically activated light emitter comprises a dominant wavelength that differs from the at least one primary electrically activated light emitter by at least 40 nm.

8. The lighting device of claim 1, comprising at least one of the following features:
   a single leadframe arranged to conduct electrical power to the first electrically activated light emitter and the second electrically activated light emitter;
   a single reflector arranged to reflect at least a portion of light emanating from each of the first electrically activated light emitter and the second electrically activated light emitter;
   a single submount or mounting element supporting the first electrically activated light emitter and the second electrically activated light emitter;
   a single lens arranged to transmit at least a portion of light emanating from each of the first electrically activated light emitter and the second electrically activated light emitter; and
   a single diffuser arranged to diffuse at least a portion of light emanating from each of the first electrically activated light emitter and the second electrically activated light emitter.

9. The lighting device of claim 1, being devoid of any electrically activated light emitter arranged to generate emissions (i) having dominant wavelength in a range of from 430 nm to 480 nm and (ii) exiting the lighting device without passage through a layer or region comprising a lumiphoric material.

10. The lighting device of claim 1, comprising at least one of the following features (i) and (ii): at least one of the first operating state aggregated light emissions and the second operating state aggregated light emissions comprises a luminous efficacy of at least 60 lumens per watt, and (ii) each of the first operating state aggregated light emissions and the second operating state aggregated light emissions comprises a luminous flux of at least 500 lumens.

11. The lighting device of claim 1, wherein at least one of the first color point and the second color point has (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808).

12. The lighting device of claim 1, wherein one of the first color point and the second color point is on or within 7 MacAdam ellipses of a Planckian locus definable on a CIE 1976 u'-v' chromaticity diagram.

13. The lighting device of claim 1, wherein the first color point comprises a color rendering index (CRI Ra) value of at least 50.

14. The lighting device of claim 1, wherein the first color point comprises a GAI value of at least 80.

15. The lighting device of claim 1, wherein the first color point comprises a CRI Ra value of at least 80 and a GAI value in a range of from 80 to 100.

16. The lighting device of claim 1, wherein each of the first color point and the second color point comprises a correlated color temperature (CCT) value in a range of from 2,500K to 5,000K.

17. A solid state lighting device comprising a plurality of electrically activated solid state emitters and a control circuit configured to adjust operation of the plurality of electrically activated solid state emitters to move between at least two operating states, wherein:
   a first operating state produces first operating state aggregated light emissions including a first gamut area index (GAI) value;
   a second first operating state produces second operating state aggregated light emissions including a second gamut area index (GAI) value;
   the second GAI value differs from the first GAI value by at least 10%; and
   a first color point generated by the first operating state aggregated light emissions differs from a second color point generated by the second operating state aggregated light emissions by no more than seven MacAdam ellipses on a 1931 CIE Chromaticity Diagram.

18. The lighting device of claim 17, wherein at least one electrically activated solid state emitter of the plurality of electrically activated solid state emitters comprises at least one light emitting diode and at least one lumiphor arranged to receive and be stimulated by at least a portion of emissions of the at least one light emitting diode and responsively emit lumiphor emissions.

19. The lighting device of claim 17, comprising at least one of the following features (i) and (ii): (i) the first color point and the second color point differ in correlated color temperature by an amount of no greater than 2% relative to one another, and (ii) the first operating state aggregated light emissions and the second operating state aggregated light emissions differ in luminous flux by an amount of no greater than 2%.

20. The lighting device of claim 17, wherein the second GAI value differs from the first GAI value by at least 15%.

21. The lighting device of claim 17, further comprising a notch filtering material arranged to receive emissions from at least one electrically activated solid state emitter of the plurality of electrically activated solid state emitters, wherein the notch filtering material is arranged to receive and filter at least a portion of the emissions of the at least one first electrically activated solid state emitter to exhibit a spectral notch.

22. The lighting device according to claim 17, comprising at least one of the following features:
   a single leadframe arranged to conduct electrical power to each electrically activated solid state light emitter of the plurality of electrically activated solid state light emitters;
   a single reflector arranged to reflect at least a portion of light emanating from each electrically activated solid state light emitter of the plurality of electrically activated solid state light emitters;
   a single submount or mounting element supporting the plurality of electrically activated solid state light emitters;
   a single lens arranged to transmit at least a portion of light emanating from each electrically activated solid state light emitter of the plurality of electrically activated solid state light emitters; and a single diffuser arranged to diffuse at least a portion of light emanating from each electrically activated solid state light emitter of the plurality of electrically activated solid state light emitters.

23. The lighting device of claim 17, being devoid of any electrically activated solid state light emitter arranged to generate emissions (i) having dominant wavelength in a range of from 430 nm to 480 nm and (ii) exiting the lighting device without passage through a layer or region comprising a lumiphoric material.

24. The lighting device of claim 17, comprising at least one of the following features (i) and (ii): at least one of the first operating state aggregated light emissions and the second operating state aggregated light emissions comprises a luminous efficacy of at least 60 lumens per watt, and (ii) each of the first operating state aggregated light emissions and the second operating state aggregated light emissions comprises a luminous flux of at least 500 lumens.

25. The lighting device of claim 17, wherein at least one of the first color point and the second color point has (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808).

26. The lighting device of claim 17, wherein one of the first color point and the second color point is on or within 7 MacAdam ellipses of a Planckian locus definable on a CIE 1976 u'-v' chromaticity diagram.

27. The lighting device of claim 17, wherein the first color point comprises a color rendering index (CRI Ra) value of at least 50.

28. The lighting device of claim 17, wherein the first color point comprises a GAI value of at least 80.

29. The lighting device of claim 17, wherein the first color point comprises a CRI Ra value of at least 80 and a GAI value in a range of from 80 to 100.

30. The lighting device of claim 17, wherein each of the first color point and the second color point comprises a correlated color temperature (CCT) value in a range of from 2,500K to 5,000K.

* * * * *